(12) United States Patent
Vorbach et al.

(10) Patent No.: US 7,010,667 B2
(45) Date of Patent: *Mar. 7, 2006

(54) INTERNAL BUS SYSTEM FOR DFPS AND UNITS WITH TWO- OR MULTI-DIMENSIONAL PROGRAMMABLE CELL ARCHITECTURES, FOR MANAGING LARGE VOLUMES OF DATA WITH A HIGH INTERCONNECTION COMPLEXITY

(75) Inventors: Martin Vorbach, Karlsruhe (DE); Robert Münch, Karlsruhe (DE)

(73) Assignee: PACT XPP Technologies AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/116,986

(22) Filed: Apr. 5, 2002

(65) Prior Publication Data

US 2003/0135686 A1 Jul. 17, 2003

Related U.S. Application Data

(63) Continuation of application No. 09/145,139, filed on Aug. 28, 1998, now Pat. No. 6,405,299, which is a continuation of application No. PCT/DE98/00456, filed on Feb. 11, 1998.

(51) Int. Cl.
*G06F 15/00* (2006.01)
*G06F 9/455* (2006.01)
*H03K 19/177* (2006.01)

(52) U.S. Cl. .............................. 712/10; 703/23; 326/39

(58) Field of Classification Search .................. 712/10; 703/23; 326/39
See application file for complete search history.

(56) References Cited

U.S. PATENT DOCUMENTS 2,067,477 A * 1/1937 J.B. Cooper
3,242,998 A * 3/1966 Gubbins (Continued)

FOREIGN PATENT DOCUMENTS

DE 42 21 278 1/1994
DE 44 16 881 11/1994

(Continued)

OTHER PUBLICATIONS

The Programmable Logic Data Book by Xilinx 1994.*
Villasenor, John et al., "Configurable Computing," *Scientific American*, vol. 276, No. 6, Jun. 1997, pp. 66–71.

(Continued)

*Primary Examiner*—Tim Vo
(74) *Attorney, Agent, or Firm*—Kenyon & Kenyon

(57) ABSTRACT

An internal bus system for DFPs and units with two- or multi-dimensional programmable cell architectures, for managing large volumes of data with a high interconnection complexity. The bus system can transmit data between a plurality of function blocks, where multiple data packets can be on the bus at the same time. The bus system automatically recognizes the correct connection for various types of data or data transmitters and sets it up.

12 Claims, 34 Drawing Sheets

U.S. PATENT DOCUMENTS

| | | | |
|---|---|---|---|
| 3,681,578 A | * | 8/1972 | Stevens |
| 3,757,608 A | * | 9/1973 | Willner |
| 3,855,577 A | * | 12/1974 | Vandierendonck |
| 4,498,134 A | * | 2/1985 | Etchells et al. |
| 4,498,172 A | * | 2/1985 | Bhavsar |
| 4,566,102 A | * | 1/1986 | Hefner |
| 4,591,979 A | * | 5/1986 | Iwashita |
| 4,663,706 A | * | 5/1987 | James et al. |
| 4,682,284 A | * | 7/1987 | Schrofer |
| 4,706,216 A | * | 11/1987 | Carter |
| 4,720,780 A | * | 1/1988 | Dolecek |
| 4,739,474 A | * | 4/1988 | Holsztynski |
| 4,761,755 A | * | 8/1988 | Ardini et al. |
| 4,811,214 A | * | 3/1989 | Nosenchuck et al. |
| 4,852,043 A | * | 7/1989 | Guest |
| 4,852,048 A | * | 7/1989 | Morton |
| 4,860,201 A | * | 8/1989 | Miranker et al. |
| 4,870,302 A | * | 9/1989 | Freeman |
| 4,891,810 A | * | 1/1990 | de Corlieu et al. |
| 4,901,268 A | * | 2/1990 | Judd |
| 4,910,665 A | * | 3/1990 | Mattheyses et al. |
| 4,967,340 A | * | 10/1990 | Dawes |
| 5,014,193 A | * | 5/1991 | Garner et al. |
| 5,015,884 A | * | 5/1991 | Agrawal et al. |
| 5,021,947 A | * | 6/1991 | Campbell et al. |
| 5,023,775 A | * | 6/1991 | Poret |
| 5,043,978 A | * | 8/1991 | Nagler et al. |
| 5,047,924 A | * | 9/1991 | Matsubara et al. |
| 5,065,308 A | * | 11/1991 | Evans |
| 5,072,178 A | * | 12/1991 | Matsumoto |
| 5,081,375 A | * | 1/1992 | Pickett et al. |
| 5,109,503 A | * | 4/1992 | Cruickshank et al. |
| 5,113,498 A | * | 5/1992 | Evan et al. |
| 5,115,510 A | | 5/1992 | Okamoto et al. |
| 5,123,109 A | | 6/1992 | Hillis |
| 5,125,801 A | | 6/1992 | Nabity et al. |
| 5,128,559 A | | 7/1992 | Steele |
| 5,142,469 A | | 8/1992 | Weisenborn |
| 5,144,166 A | | 9/1992 | Camarota et al. |
| 5,193,202 A | | 3/1993 | Jackson et al. |
| 5,203,005 A | | 4/1993 | Horst |
| 5,204,935 A | | 4/1993 | Mihara et al. |
| 5,208,491 A | | 5/1993 | Ebeling et al. |
| 5,226,122 A | | 7/1993 | Thayer et al. |
| RE34,363 E | * | 8/1993 | Freeman, deceased |
| 5,233,539 A | | 8/1993 | Agrawal et al. |
| 5,247,689 A | | 9/1993 | Ewert |
| 5,274,593 A | | 12/1993 | Proebsting |
| 5,287,472 A | | 2/1994 | Horst |
| 5,294,119 A | | 3/1994 | Vincent et al. |
| 5,301,284 A | | 4/1994 | Estes et al. |
| 5,301,344 A | | 4/1994 | Kolchinsky |
| 5,303,172 A | | 4/1994 | Magar et al. |
| 5,336,950 A | | 8/1994 | Popli et al. |
| 5,347,639 A | | 9/1994 | Rechtschaffen et al. |
| 5,349,193 A | | 9/1994 | Mott et al. |
| 5,353,432 A | | 10/1994 | Richek et al. |
| 5,361,373 A | | 11/1994 | Gilson |
| 5,379,444 A | | 1/1995 | Mumme |
| 5,410,723 A | | 4/1995 | Schmidt et al. |
| 5,418,952 A | | 5/1995 | Morley et al. |
| 5,421,019 A | | 5/1995 | Holsztynski et al. |
| 5,422,823 A | | 6/1995 | Agrawal et al. |
| 5,425,036 A | | 6/1995 | Liu et al. |
| 5,426,378 A | | 6/1995 | Ong |
| 5,428,526 A | | 6/1995 | Flood et al. |
| 5,430,687 A | | 7/1995 | Hung et al. |
| 5,440,245 A | | 8/1995 | Galbraith et al. |
| 5,440,538 A | | 8/1995 | Olsen |
| 5,442,790 A | | 8/1995 | Nosenchuck |
| 5,444,394 A | | 8/1995 | Watson et al. |
| 5,448,186 A | | 9/1995 | Kawata |
| 5,455,525 A | | 10/1995 | Ho et al. |
| 5,457,644 A | | 10/1995 | McCollum |
| 5,465,375 A | | 11/1995 | Thepaut et al. |
| 5,473,266 A | | 12/1995 | Ahanin et al. |
| 5,473,267 A | | 12/1995 | Stansfield |
| 5,475,583 A | | 12/1995 | Bock et al. |
| 5,475,803 A | | 12/1995 | Stearns et al. |
| 5,475,856 A | | 12/1995 | Kogge |
| 5,483,620 A | | 1/1996 | Pechanek et al. |
| 5,485,103 A | | 1/1996 | Pedersen et al. |
| 5,485,104 A | | 1/1996 | Agrawal et al. |
| 5,489,857 A | | 2/1996 | Agrawal et al. |
| 5,491,353 A | | 2/1996 | Kean |
| 5,493,239 A | | 2/1996 | Zlotnick |
| 5,497,498 A | | 3/1996 | Taylor |
| 5,506,998 A | | 4/1996 | Kato et al. |
| 5,510,730 A | | 4/1996 | El Gamal et al. |
| 5,511,173 A | | 4/1996 | Yamaura et al. |
| 5,513,366 A | | 4/1996 | Agarwal et al. |
| 5,521,837 A | | 5/1996 | Frankle et al. |
| 5,522,083 A | | 5/1996 | Gove et al. |
| 5,530,873 A | | 6/1996 | Takano |
| 5,530,946 A | | 6/1996 | Bouvier et al. |
| 5,532,693 A | | 7/1996 | Winters et al. |
| 5,532,957 A | | 7/1996 | Malhi |
| 5,535,406 A | | 7/1996 | Kolchinsky |
| 5,537,057 A | | 7/1996 | Leong et al. |
| 5,537,601 A | | 7/1996 | Kimura et al. |
| 5,541,530 A | | 7/1996 | Cliff et al. |
| 5,544,336 A | | 8/1996 | Kato et al. |
| 5,548,773 A | | 8/1996 | Kemeny et al. |
| 5,555,434 A | | 9/1996 | Carlstedt |
| 5,559,450 A | | 9/1996 | Ngai et al. |
| 5,561,738 A | | 10/1996 | Kinerk et al. |
| 5,570,040 A | | 10/1996 | Lytle et al. |
| 5,574,930 A | | 11/1996 | Halverson, Jr. et al. |
| 5,583,450 A | | 12/1996 | Trimberger et al. |
| 5,586,044 A | | 12/1996 | Agrawal et al. |
| 5,587,921 A | | 12/1996 | Agrawal et al. |
| 5,588,152 A | | 12/1996 | Dapp et al. |
| 5,590,345 A | | 12/1996 | Barker et al. |
| 5,590,348 A | | 12/1996 | Phillips et al. |
| 5,596,742 A | | 1/1997 | Agarwal et al. |
| 5,600,265 A | | 2/1997 | El Gamal et al. |
| 5,611,049 A | | 3/1997 | Pitts |
| 5,617,547 A | | 4/1997 | Feeney et al. |
| 5,625,806 A | | 4/1997 | Kromer |
| 5,634,131 A | | 5/1997 | Matter et al. |
| 5,649,176 A | | 7/1997 | Selvidge et al. |
| 5,649,179 A | | 7/1997 | Steenstra et al. |
| 5,652,894 A | | 7/1997 | Hu et al. |
| 5,655,069 A | | 8/1997 | Ogawara et al. |
| 5,655,124 A | | 8/1997 | Lin |
| 5,657,330 A | | 8/1997 | Matsumoto |
| 5,659,797 A | | 8/1997 | Zandveld et al. |
| 5,675,743 A | | 10/1997 | Mavity |
| 5,680,583 A | | 10/1997 | Kuijsten |
| 5,713,037 A | | 1/1998 | Wilkinson et al. |
| 5,717,943 A | | 2/1998 | Barker et al. |
| 5,732,209 A | | 3/1998 | Vigil et al. |
| 5,734,921 A | | 3/1998 | Dapp et al. |
| 5,742,180 A | | 4/1998 | DeHon et al. |
| 5,748,872 A | | 5/1998 | Norman |
| 5,754,827 A | | 5/1998 | Barbier et al. |
| 5,754,871 A | | 5/1998 | Wilkinson et al. |
| 5,760,602 A | | 6/1998 | Tan |
| 5,761,484 A | | 6/1998 | Agarwal et al. |
| 5,773,994 A | | 6/1998 | Jones |
| 5,778,439 A | | 7/1998 | Trimberger et al. |

| | | |
|---|---|---|
| 5,784,636 A | 7/1998 | Rupp |
| 5,794,059 A | 8/1998 | Barker et al. |
| 5,794,062 A | 8/1998 | Baxter |
| 5,801,715 A | 9/1998 | Norman |
| 5,802,290 A | 9/1998 | Casselman |
| 5,828,229 A | 10/1998 | Cliff et al. |
| 5,828,858 A | 10/1998 | Athanas et al. |
| 5,838,165 A | 11/1998 | Chatter |
| 5,844,888 A | 12/1998 | Narjjka |
| 5,848,238 A | 12/1998 | Shimomura et al. |
| 5,854,918 A | 12/1998 | Baxter |
| 5,859,544 A | 1/1999 | Norman |
| 5,865,239 A | 2/1999 | Carr |
| 5,867,691 A | 2/1999 | Shiraishi |
| 5,867,723 A | 2/1999 | Peters et al. |
| 5,884,075 A | 3/1999 | Hester et al. |
| 5,887,162 A | 3/1999 | Williams et al. |
| 5,889,982 A | 3/1999 | Rodgers et al. |
| 5,892,370 A | 4/1999 | Eaton et al. |
| 5,892,961 A * | 4/1999 | Trimberger ................ 712/10 |
| 5,901,279 A | 5/1999 | Davis, III |
| 5,915,123 A | 6/1999 | Mirsky et al. |
| 5,924,119 A | 7/1999 | Sindhu et al. |
| 5,927,423 A | 7/1999 | Wada et al. |
| 5,933,642 A | 8/1999 | Baxter et al. |
| 5,936,424 A | 8/1999 | Young et al. |
| 5,943,242 A | 8/1999 | Vorbach et al. |
| 5,956,518 A | 9/1999 | DeHon et al. |
| 5,966,534 A | 10/1999 | Cooke et al. |
| 5,970,254 A | 10/1999 | Cooke et al. |
| 6,011,407 A | 1/2000 | New |
| 6,014,509 A | 1/2000 | Furtek et al. |
| 6,021,490 A | 2/2000 | Vorbach et al. |
| 6,023,564 A | 2/2000 | Trimberger |
| 6,023,742 A | 2/2000 | Ebeling et al. |
| 6,034,538 A | 3/2000 | Abramovici |
| 6,038,650 A | 3/2000 | Vorbach et al. |
| 6,038,656 A | 3/2000 | Cummings et al. |
| 6,047,115 A | 4/2000 | Mohan et al. |
| 6,049,222 A | 4/2000 | Lawman |
| 6,052,773 A | 4/2000 | DeHon et al. |
| 6,054,873 A | 4/2000 | Laramie |
| 6,058,469 A | 5/2000 | Baxter |
| 6,081,903 A | 6/2000 | Vorbach et al. |
| 6,085,317 A | 7/2000 | Smith |
| 6,086,628 A | 7/2000 | Dave et al. |
| 6,088,795 A | 7/2000 | Vorbach et al. |
| 6,092,174 A | 7/2000 | Roussakov |
| 6,105,105 A | 8/2000 | Trimberger |
| 6,108,760 A | 8/2000 | Mirsky et al. |
| 6,119,181 A | 9/2000 | Vorbach et al. |
| 6,122,719 A | 9/2000 | Mirsky et al. |
| 6,125,408 A | 9/2000 | McGee et al. |
| 6,127,908 A | 10/2000 | Bozler et al. |
| 6,172,520 B1 | 1/2001 | Lawman et al. |
| 6,173,434 B1 | 1/2001 | Wirthlin et al. |
| 6,202,182 B1 | 3/2001 | Abramovici et al. |
| 6,219,833 B1 | 4/2001 | Solomon et al. |
| 6,230,307 B1 | 5/2001 | Davis et al. |
| 6,243,808 B1 * | 6/2001 | Wang |
| 6,260,179 B1 * | 7/2001 | Ohsawa et al. |
| 6,263,430 B1 * | 7/2001 | Trimberger et al. |
| 6,279,077 B1 * | 8/2001 | Nasserbakht et al. |
| 6,282,627 B1 * | 8/2001 | Wong et al. |
| 6,288,566 B1 * | 9/2001 | Hanrahan et al. |
| 6,289,440 B1 * | 9/2001 | Casselman |
| 6,298,472 B1 * | 10/2001 | Phillips et al. |
| 6,311,200 B1 * | 10/2001 | Hanrahan et al. |
| 6,321,366 B1 * | 11/2001 | Tseng et al. |
| 6,321,373 B1 * | 11/2001 | Ekanadham et al. |
| 6,338,106 B1 * | 1/2002 | Vorbach et al. |
| 6,341,318 B1 * | 1/2002 | Dakhil |
| 6,347,346 B1 * | 2/2002 | Taylor |
| 6,349,346 B1 * | 2/2002 | Hanrahan et al. |
| 6,370,596 B1 * | 4/2002 | Dakhil |
| 6,378,068 B1 * | 4/2002 | Foster et al. |
| 6,389,379 B1 * | 5/2002 | Lin et al. |
| 6,389,579 B1 * | 5/2002 | Phillips et al. |
| 6,392,912 B1 * | 5/2002 | Hanrahan et al. |
| 6,405,299 B1 * | 6/2002 | Vorbach et al. |
| 6,421,817 B1 * | 7/2002 | Mohan et al. |
| 6,425,068 B1 * | 7/2002 | Vorbach et al. |
| 6,457,116 B1 * | 9/2002 | Mirsky et al. |
| 6,477,643 B1 * | 11/2002 | Vorbach et al. |
| 6,480,937 B1 * | 11/2002 | Vorbach et al. |
| 6,480,954 B1 * | 11/2002 | Trimberger et al. |
| 6,513,077 B1 * | 1/2003 | Vorbach et al. |
| 6,519,674 B1 * | 2/2003 | Lam et al. |
| 6,526,520 B1 * | 2/2003 | Vorbach et al. |
| 6,538,468 B1 * | 3/2003 | Moore |
| 6,539,477 B1 * | 3/2003 | Seawright |
| 6,542,998 B1 * | 4/2003 | Vorbach et al. |
| 6,571,381 B1 * | 5/2003 | Vorbach et al. |
| 6,587,939 B1 * | 7/2003 | Takano |
| 6,657,457 B1 * | 12/2003 | Hanrahan et al. |
| 6,687,788 B1 * | 2/2004 | Vorbach et al. |
| 6,697,979 B1 * | 2/2004 | Vorbach et al. |
| 2002/0038414 A1 * | 3/2002 | Taylor et al. |
| 2002/0143505 A1 * | 10/2002 | Drusinsky |
| 2002/0144229 A1 * | 10/2002 | Hanrahan |
| 2002/0165886 A1 * | 11/2002 | Lam |
| 2003/0014743 A1 | 1/2003 | Cooke et al. |
| 2003/0046607 A1 | 3/2003 | Vorbach |
| 2003/0052711 A1 | 3/2003 | Taylor et al. |
| 2003/0055861 A1 | 3/2003 | Lai et al. |
| 2003/0056085 A1 | 3/2003 | Vorbach |
| 2003/0056091 A1 | 3/2003 | Greenberg |
| 2003/0056202 A1 | 3/2003 | Vorbach |
| 2003/0093662 A1 | 5/2003 | Varbach et al. |
| 2003/0097513 A1 | 5/2003 | Vorbach et al. |
| 2003/0123579 A1 | 7/2003 | Safavi et al. |
| 2003/0135686 A1 | 7/2003 | Vorbach et al. |
| 2004/0015899 A1 | 1/2004 | May et al. |
| 2004/0025005 A1 | 2/2004 | Vorbach et al. |

FOREIGN PATENT DOCUMENTS

| | | |
|---|---|---|
| DE | 38 55 673 | 11/1996 |
| DE | 196 51 075 | 6/1998 |
| DE | 196 54 593 | 7/1998 |
| DE | 196 54 595 | 7/1998 |
| DE | 196 54 846 | 7/1998 |
| DE | 197 04 044 | 8/1998 |
| DE | 197 04 728 | 8/1998 |
| DE | 197 04 742 | 9/1998 |
| DE | 198 07 872 | 8/1999 |
| DE | 198 61 088 | 2/2000 |
| DE | 199 26 538 | 12/2000 |
| DE | 100 28 397 | 12/2001 |
| DE | 100 36 627 | 2/2002 |
| DE | 101 29 237 | 4/2002 |
| DE | 102 04 044 | 8/2003 |
| EP | 0 221 360 | 5/1987 |
| EP | 0 428 327 | 5/1991 |
| EP | 0 463 721 | 1/1992 |
| EP | 0 477 809 | 4/1992 |
| EP | 0 485 690 | 5/1992 |
| EP | 0 497 029 | 8/1992 |
| EP | 0 539 595 | 5/1993 |
| EP | 0 628 917 | 12/1994 |
| EP | 0 678 985 | 10/1995 |
| EP | 0 686 915 | 12/1995 |
| EP | 0 707 269 | 4/1996 |

| | | |
|---|---|---|
| EP | 0 735 685 | 10/1996 |
| EP | 0 835 685 | 10/1996 |
| EP | 0 748 051 | 12/1996 |
| EP | 0 726 532 | 7/1998 |
| EP | 0 926 594 | 6/1999 |
| EP | 1 102 674 | 7/1999 |
| EP | 1 146 432 | 10/2001 |
| WO | WO90/04835 | 5/1990 |
| WO | WO90/11648 | 10/1990 |
| WO | WO93/11503 | 6/1993 |
| WO | WO94/08399 | 4/1994 |
| WO | WO95/00161 | 1/1995 |
| WO | WO95/26001 | 9/1995 |
| WO | WO98/26356 | 6/1998 |
| WO | WO98/28697 | 7/1998 |
| WO | WO98/29952 | 7/1998 |
| WO | WO98/31102 | 7/1998 |
| WO | WO98/35299 | 8/1998 |
| WO | WO99/00731 | 1/1999 |
| WO | WO99/00739 | 1/1999 |
| WO | WO99/32975 | 7/1999 |
| WO | WO99/40522 | 8/1999 |
| WO | WO99/44120 | 9/1999 |
| WO | WO99/44147 | 9/1999 |
| WO | WO00/17771 | 3/2000 |
| WO | WO00/38087 | 6/2000 |
| WO | WO00/77652 | 12/2000 |
| WO | WO02/13000 | 2/2002 |
| WO | WO02/21010 | 3/2002 |
| WO | WO02/29600 | 4/2002 |
| WO | WO02/71248 | 9/2002 |
| WO | WO02/71249 | 9/2002 |
| WO | WO02/103532 | 12/2002 |
| WO | WO03/17095 | 2/2003 |
| WO | WO03/23616 | 3/2003 |
| WO | WO03/25781 | 3/2003 |
| WO | WO03/32975 | 4/2003 |
| WO | WO03/36507 | 5/2003 |

OTHER PUBLICATIONS

Villasenor, John et al., "Configurable Computing Solutions for Automatic Target Recognition," *IEEE*, 1996 pp. 70–79.

Tau, Edward et al., "A First Generation DPGA Implementation," *FPD'95*, pp. 138–143.

Athanas, Peter et al., "Quantitative analysis of floating point arithmetic on FPGA based custom computing machines," IEEE Symposium on FPGAs For Custom Computing Machines, *IEEE Computer Society Press*, Apr. 19–21, 1995, pp. I–vii, 1–222.

Athanas, Peter et al., "An Adaptive Hardware Machine Architecture and Compiler for Dynamic Processor Reconfiguration", IEEE Laboratory for Engineering Man/Machine Systems Division of Engineering, Box D, Brown University Providence, Rhode Island, 1991, pp. 397–400.

Bittner, Ray A. Jr., "Wormhole Run–Time Reconfiguration: Conceptualization and VLSI Design of a High Performance Computing System," *Dissertation* Jan. 23, 1997, pp. I–XX, 1–415.

Myers, G. "Advances in Computer Architecture," Wiley-Interscience Publication, 2nd ed., John Wiley & Sons, Inc. pp. 463–94, 1978.

M. Saleeba, "A Self–Contained Dynamically Reconfigurable Processor Architecture," Sixteenth Australian Computer Science Conference, ASCS–16, QLD, Australia, Feb. 1993.

M. Morris Mano, "Digital Design," by Prentice Hall, Inc., Englewood Cliffs, New Jersey 07632, 1984, pp. 119–125, 154–161.

Maxfield, C. "Logic that Mutates While–U–Wait" EDN (Bur. Ed) (USA), EDN (European Edition), Nov. 7, 1996, Cahners Publishing, USA.

Norman, Richard S., "Hyperchip Business Summary, The Opportunity," Jan. 31, 2000, pp. 1–3.

Ferrante J. et al., "The Program Dependence Graph and its Use in Optimization ACM Transactions on Programming Languages and Systems," Jul. 1987, USA, [online]Bd. 9, Nr., 3, pp. 319–349, XP002156651 ISSN: 0164–0935 ACM Digital Library.

Hwang L. et al., "Min–cut Replication in Partitioned Networks" IEEE Transactions on Computer–Aided Design of Integrated Circuits and Systems, [online]Bd. 14, Nr. 1, Jan. 1995, pp. 96–106, XP00053228 USA ISSN: 0278–0070 IEEE Xplore.

Baumgarte, V., et al., PACT XPP "A Self–reconfigurable Data Processing Architecture," PACT Info. GMBH, Munchen Germany 2001.

Jantsch, Axel et al., "A Case Study on Hardware/software Partitioning," Royal Institute of Technology, Kista, Sweden, Apr. 10, 1994 IEEE, pp. 111–118.

Becker, J. et al., "Parallelization in Co–compilation for Configurable Accelerators —a Host/accelerator Partitioning Compilation Method," proceedings of Asia and South Pacific Design Automation Conference, Yokohama, Japan, Feb. 10–13, 1998.

Isshiki, Tsuyoshi et al., "Bit–Serial Synthesis for Multi–F-PGA Systems with C++Design Capture," 1996 IEEE, pp. 38–47.

Weinhardt, Markus, "Ubersetzingsmethoden fur strukturprogrammierbare rechner," Dissertation for Doktors der Ingenieurwisenschaften der Universitat Karlsruhe; Jul. 1, 1997.

Hammes, Jeff et al., "Cameron: High Level Language Compilation for Reconfigurable Systems," Department of Computer Science, Colorado State University, Conference on Parallel Architectures and Compilation Techniques, Oct. 12–16, 1999.

K. Wada et al., "Performance Evaluation of Tree–based Coherent Distributed Shared Memory" Proceedings of the Pacific RIM COnference on Communications, Comput and Signal Proceedings, Victoria, May 19–21 1993.

Nilsson et al., "The Scalable Tree Protocol —A Cache Coherence Approaches for Large–Scale Multiprocessors" IEEE, pp. 498–506 Dec. 1992.

Wu et al., "A New Cache Directory Scheme", IEEE, pp. 466–472, Jun. 1996.

Hauck "The Roles of FPGA's in Reprogrammable Systems," IEEE, Apr. 1998, pp. 615–638.

Wittig et al., "OneChip: An FPGA Processor with Reconfigurable Logic" IEEE, 1996 pp. 126–135.

Cadambi et al., "Managing Pipeline–reconfigurable FPGAs," ACM, 1998, pp. 55–64.

Hong Yu Xu et al., "Parallel QR Factorization on a Block Data Flow Architecture" Conference Proceeding Article, Mar. 1, 1992, pages 332–336 XPO10255276, page 333, Abstract 2.2, 2.3, 2.4 —page 334.

Mirsky, E. DeHon, "Matrix: A Reconfigurable Computing Architecture with Configurable Instruction Distribution and Deployable Resources," Proceedings of the IEEE Symposium on FPGAs for Custom Computing Machines, 1996, pp. 157–1666.

Weinhardt, M. "Compilation Methods for Structure–programmable Computers", dissertation, ISBN 3–89722–011–3, 1997.

Cardoso, J.M.P., "Compilation of Java™Algorithma onto Reconfigurable Computing Systems with Exploitation of Operation–Level Parallelism," Ph.D. Thesis, Universidade Tecnica de Lisboa (UTL), Lisbon, Portugal Oct. 2000 (English Abstract included).

Kung, "Deadlock Avoidance for Systolic Communication", 1988 Conference Proceedings of 15th Annual International Symposium on Computer Architecture, May 30, 1988, pp. 252–260.

TMS320C54X DSP: CPU and Peripherals, Texas Instruments, 1996, pp. 6–26 to 6–46.

TMS320C54x DSP: Mnemonic Instruction Set, Texas Instruments, 1996, pp. 4–64.

XLINX, "Logic Cell Array Families: XC4000A and XC4000H", product description, pages 2–7 to 2–15, Additional XC3000, XC31000 and XC31000A Data, pp. 8–16 and 9–14.

Miller, Micheal J. et al., "High–Speed FIFOs Contend with Widley Differing Data Rates: Dual–port RAM Buffer and Dual–pointer System Provide Rapid, High–density Data Storage and Reduce Overhead", Computer Design, Sep. 1, 1985, pp. 83–86.

Forstner, Peter "Wer Zuerst Kommt, Mahlt Zuers!: Teil 3: Einsatzgebiete und Anwendungsbeispiele von FIFO–Speichern", Elektronik, Aug. 2000, pp. 104–109.

John R. Hauser et al., "Garp: A MIPS Processor with a Reconfigurable Coprocessors", University of California, Berkeley, IEEE, 1997, pages 12–21.

Jorg Donandt, "Improving Response Time of Programmable Logic Controllers by Use of a Boolean Coprocessor", AEG Research Institute Berlin, IEEE, 1989.

Alexandre F. Tenca et al., "A Varible Long–Precision Arithmetric Unit Design for Reconfigurable Coprocessor Architectures", University of California, Los Angeles, 1998, pp. 216–225.

Andreas Koch et al., "Practical Experiences with the SPARXIL Co–Processor", 1998, IEEE, pp. 394–398.

Gokhale M. B. et al., "Automatic Allocation of Arrays to Memories in FPGA processors with Multiple Memory Banks", Field–Programmable Custom Computing Machines, 1999, IEEE, pp. 63–67.

Christian Siemers, "Rechenfabrik Ansaetze Fuer Extrem Parallele Prozessoren", Verlag Heinze Heise GmbH., Hannover, DE No. 15, Jul. 16, 2001, pp. 170–179.

Pedro Diniz et al., "Automatic Synthesis of Data Storage and Control Structures for FPGA–based Computing Engines", 2000, IEEE, pp. 91–100.

Markus Weinhardt et al., "Pipeline Vectorization for Reconfigurable Systems", 1999, IEEE, pp. 52–60.

Lizy John et al., "A Dynamically Reconfigurable Interconnect for Array Processors", vol. 6, No. 1, Mar. 1998, IEEE, pp. 150–157.

Fineberg, Samuel et al., "Experimental Analysis of a Mixed-Mode Parallel Architecture Using Sequence Sorting", vol. 11. No. 3, Mar. 1991, pp. 239–251.

Jacob, Jeffrey et al., "Memory Interfacing and Instruction Specification for Reconfigurable Processors", ACM 1999, pp. 145–154.

Ye, Z.A. et al., "A Compiler for a Processor With A Reconfigurable Functional Unit," FPGA 2000 ACM/SIGNA International Symposium on Field Programmable Gate Arrays, Monterey, CA Feb. 9–11, 2000, pp. 95–100.

Ling, X., "WASMII: An MPLD with Data–Driven Control on a Virtual Hardware," Journal of Supercomputing, Kluwer Acdemic Publishers, Dordrecht, Netherlands, 1995, pp. 253–276.

Villasensor, J. et al., "Express Letters Video Communications Using Rapidly Reconfigurable Hardware," IEEE Transactions on Circuits and Systems for Video Technology, IEEE, Inc. NY, Dec. 1995, pp. 565–567.

Hedge, S.J., 3D WASP Devices for On–line Signal and Data Processing, 1994, International Conference on Wafer Scale Integration, pp. 11–21.

Iseli, C., et al., "A C++Compiler for FPGA Custom Execution Units Synthesis," IEEE. 1995, pp. 173–179.

Alippi, C., et al., Determining the Optimum Extended Instruction Set Architecture for Application Specific Reconfigurable VLIW CPUs, IEEE., 2001, pp. 50–56.

Dutt, Nikil et al., "If Software is King for Systems–on–Silicon, What's New in Compiler," IEEE., 1997, pp. 322–325.

Piotrowski, Anton, "IEC–BUS, Die Funktionsweise des IEC–Bus und seine Anwendung in Geräten und Systemen", 1987, Franzis–Verlag GmbH, Müchen, pp. 20–25.

Zhang, N. Et al., Architectural Evaluation of Flexible Digital Signal Processing for Wireless Receivers, Signals, Systems and Computers, 2000; Conference Record of the Thirty-Fourth Asilomar Conference, Bd.1, Oct. 29, 2000, pp. 78–83.

Fornaciari, W. et al., System–level power evalution metrics, 1997 Proceedings of the 2nd Annual IEEE International Conference on Innovative Systems in Silicon, New York, NY, Oct. 1997, pp. 323–330.

Schmit, H. et al., Hidden Markov Modeling and Fuzzy Controllers in FPGAs, FPGAs for Custom Computing Machined, 1995; Proceedings, IEEE Symposium on Napa Valley, CA, Apr. 1995, pp. 214–221.

Simunie, T. Et al., Source Code Optimization and Profiling of Energy Consumption in Embedded Systems, Proceedings of the 13th International Symposium Synthesis, Sep. 2000, pp. 193–198.

* cited by examiner

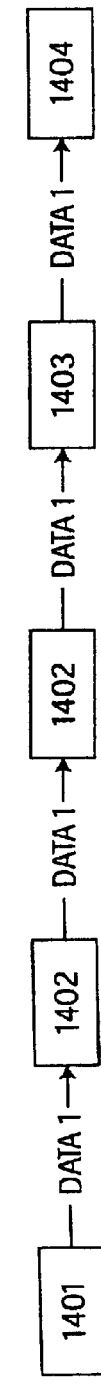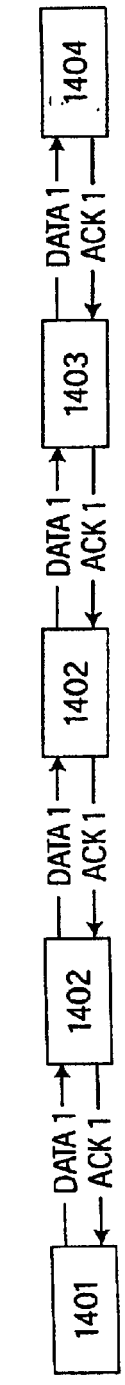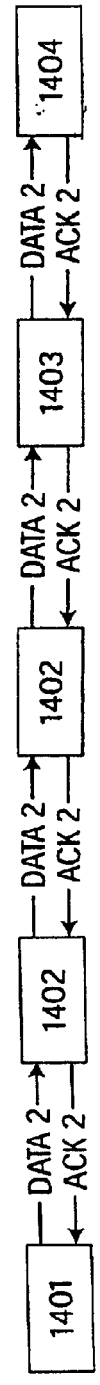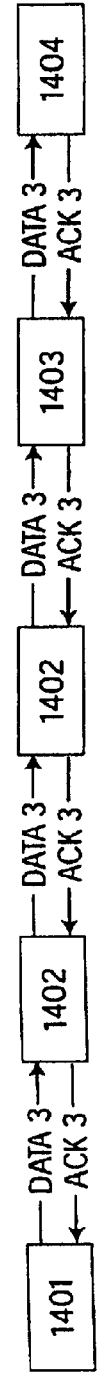

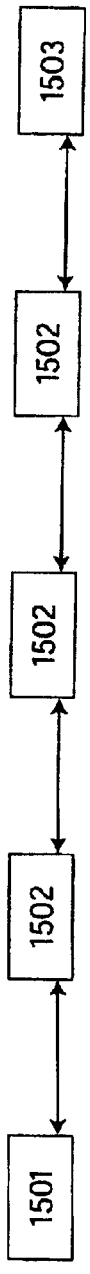
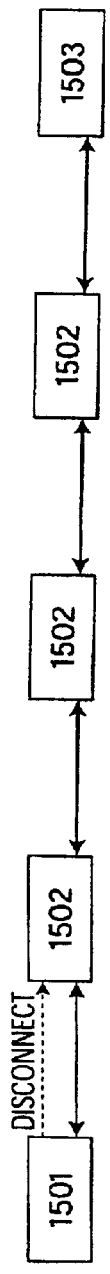
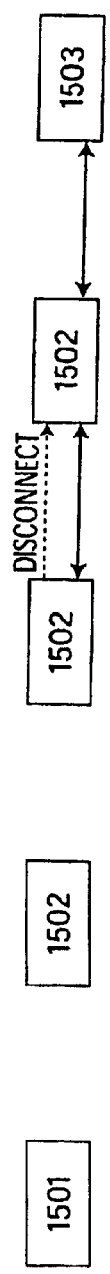
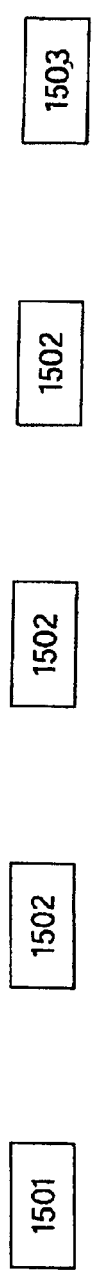

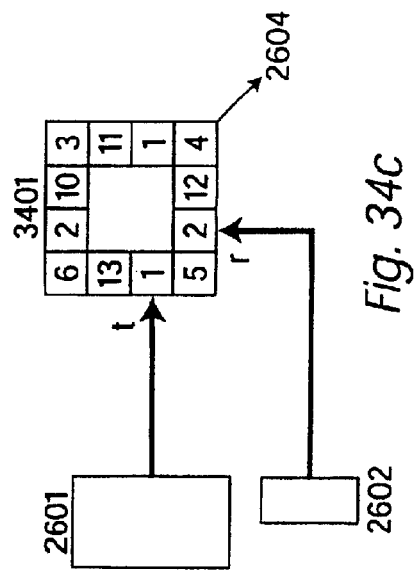
Fig. 34c
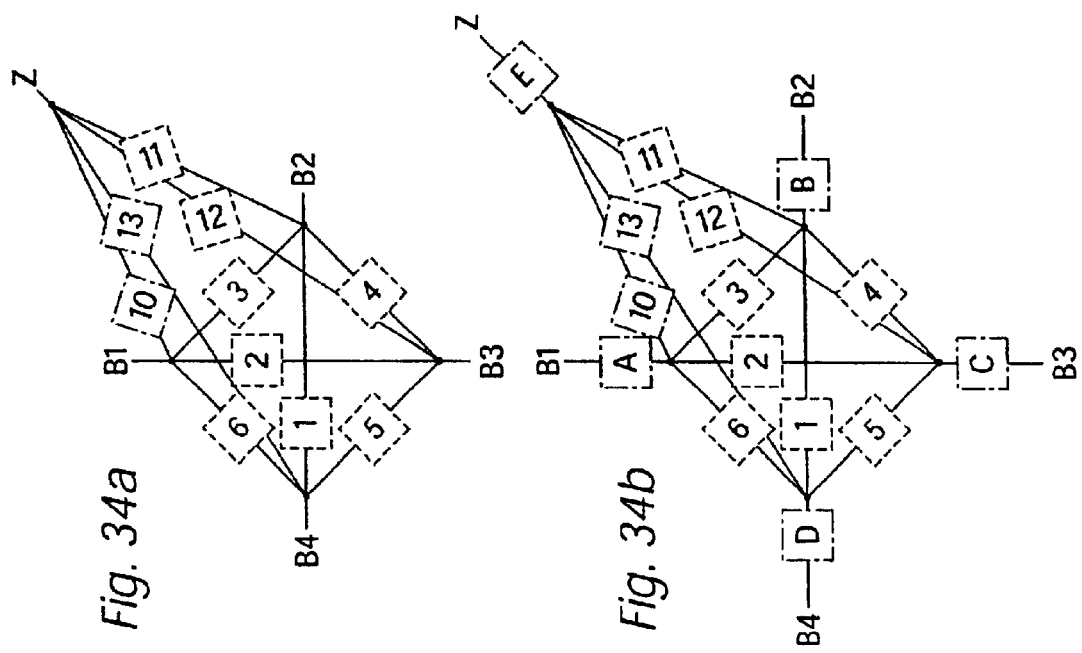
Fig. 34a
Fig. 34b

INTERNAL BUS SYSTEM FOR DFPS AND UNITS WITH TWO- OR MULTI-DIMENSIONAL PROGRAMMABLE CELL ARCHITECTURES, FOR MANAGING LARGE VOLUMES OF DATA WITH A HIGH INTERCONNECTION COMPLEXITY

CROSS-REFERENCE TO RELATED APPLICATIONS

This application is a continuation of U.S. patent application Ser. No. 09/145,139, filed now U.S. Pat. No. 6,405,299, Aug. 28, 1998, which is a continuation of International Application No. PCT/DE98/00456 filed on Feb. 11, 1998.

BACKGROUND INFORMATION

FPGAs and DPGAs, and similar systems with two- or multi-dimensional programmable cell architectures, have internal bus systems which either have a global connection to all or most of the logic cells or have a local next-neighbor connection. Both types have in common the fact that they involve connections between two or more logic cells. In addition, always exactly one signal can use the bus, unless a multiplexer architecture is configured together with a control into a plurality of logic cells.

According to German Patent No. DE 44 16 881, the bus systems described above already exist in DFP-based systems. In addition, there is the possibility of separating a bus system, thus resulting in several sub-buses that can be used separately.

In German Application No. DE 196 54 595.1-53, an I/O bus system is described which combines a plurality of bus systems within the unit, where a unit may be an FPGA, a DPGA, a DFP, etc., and leads out of the unit. Memory modules or peripheral devices or other units of the generic type mentioned above can be triggered in this way. There is only one address register or address counter to generate the external addresses.

Conventional bus systems are not suitable for transmitting large volumes of data in the form of signals grouped by bytes or otherwise. Especially when the units are used for computation of algorithms, it is necessary for a plurality of data (packets) to be transmitted simultaneously between the individual configured function areas of a unit. In the usual technology, a direct point-to-point connection must be set up for each data path, which is the connection (the bus) between two (or more) function blocks that receive the same data, and which then regulates the data traffic between these function blocks exclusively. There can be only one data packet on the bus at a time. The interconnection complexity is very high. The transmission rate of today's internal buses is limited by the maximum bus size and the signal propagation time on the bus. With the I/O bus described in German Application No. DE 196 54 595.1-53, only one type of bus connection can be set up per I/O cell, namely exclusively that programmed in the address register. There is no possibility of responding to different types of data or data transmitters and connecting them to different external units.

SUMMARY OF THE INVENTION

An object of the present invention is to create a bus system that can transmit data between a plurality of function blocks, where multiple data packets can be on the bus at the same time. The bus system automatically recognizes the correct connection for various types of data or data transmitters and sets it up.

BRIEF DESCRIPTION OF THE DRAWINGS

FIGS. 14a–g show the status of a data transfer of a connection being set up at intervals of one bus cycle.

FIGS. 15a–15d and 15f–15h show the status of a data transfer of a connection release at intervals of one bus cycle.

FIGS. 34a–34c shows extension for connecting a configurable cell or group of configurable cells through a node.

DETAILED DESCRIPTION

Figure 1:
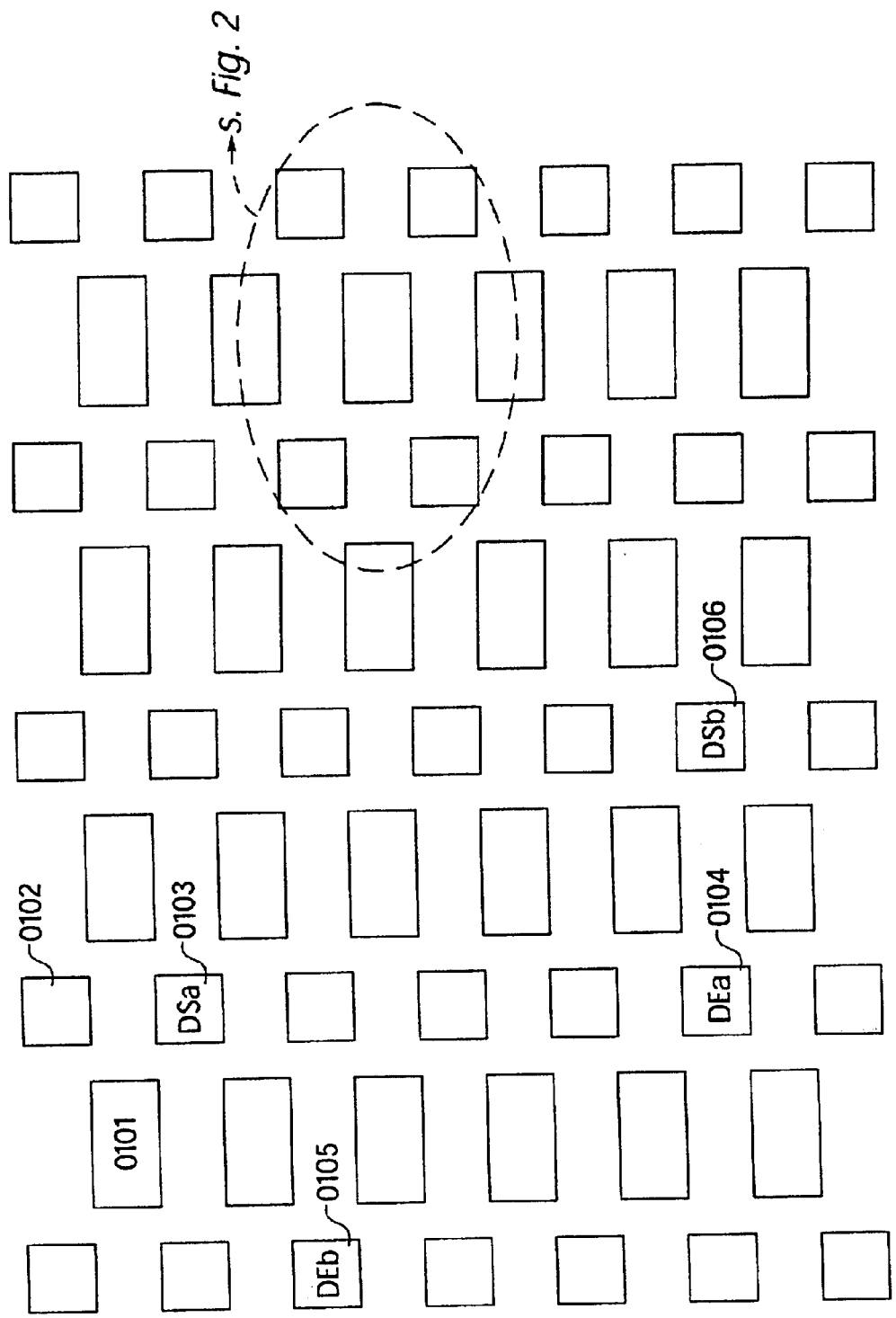
FIG. 1 shows a two-dimensional unit with a cell array and nodes.

A bus system according to the present invention can be integrated on a unit horizontally, vertically, diagonally or in any other position. The bus system is subdivided into a plurality of segments, with the segments being separated by a bus control circuit. This bus control circuit is called a node. At the same time, the node is responsible for routing, i.e., controlling the direction of flow of the data. Logic cells or PAE cells according to German Application No. DE 196 51 075.9-53 are connected to the nodes; they send and receive their data over the nodes, and a target address can be delivered along with each data packet. Likewise the bus system is capable of generating target addresses via look-up tables, referred to as routing tables below; the method described in German Application No. DE 196 54 846.2-53 serves this purpose in particular. The bus systems are especially suitable for direct connection to the INPUT/OUTPUT CELLS described in German Application No. DE 196 54 595.1-53. Connections are set up and data is synchronized automatically. If a connection fails because the required bus segment is busy at the moment, the connection is attempted again at a later time. Different connections can be set up automatically on the basis of different types of data or data transmitters.

There are a plurality of buses arranged horizontally, vertically, diagonally or in any position on the unit. The individual buses do not lead continuously from one edge of the unit to the other, but instead they are subdivided into a plurality of bus segments. The bus segments are separated by the nodes described below. Each bus segment can be used and connected independently of the others, with the interconnection being the responsibility of the nodes. A separate protocol that is administered by the nodes can be implemented on the bus system. It is also conceivable for the protocol to be administered by the cells using the bus and for the nodes to be only passive switches.

The Node

A node provides the interconnection among individual bus segments. Connection of the cells to the bus segments is also handled by the nodes.

The bus segments of all directions are combined in a node; this means that:

in a two-dimensional system, the buses are run to the node from four directions: north (N), south (S), east (E) and west (W);

in a three-dimensional system, the buses are run to the node from six directions: north (N), south (S), east (E), west (W), top (T) and bottom (B);

in an n-dimensional system, the buses are run to the node from n directions (for each dimension there is a directional vector whose direction is determined by its plus or minus sign → for each dimension there are two directions which are differentiated by the sign in front of the directional vector).

A-Type Node

Within the node there is a bus system to which the external buses are connected and which thus consists of several busbars. A first external bus is connected to a busbar across a gate. The busbar is connected to the second external bus via another gate. To permit broadcasting, i.e., sending data to multiple receivers, several "second" buses can also be connected to the internal bus system. The gates may be embodied as purely passive switches, bus drivers, or registers/latches.

In addition, the node has access to one (or more) configurable elements (cells) connected to it. It optionally connects them to one or more adjacent bus segments.

B-Type Node

In contrast with the A-type node, there is no internal bus system. The node has n configurable switches, which can connect each neighboring segment to each of the other neighboring segments. For example, for a 2-dimensional structure, n=6.

| N | Connection |
|---|---|
| 1 | E-W/W-E |
| 2 | N-S/S-N |
| 3 | N-E/E-N |
| 4 | E-S/S-E |
| 5 | S-W/W-S |
| 6 | W-N/N-W |

(N = north; E = east; S = south; W = west)

A switch may be unidirectional or bidirectional; it may contain a register or latch for storing data.

The "Regular" Routing Method

A connection is initiated by a data transmitter (DS)—this is a configurable element (logic cell, bus cell (including external cells according to German Application No. DE 196 54 595.1-53))—which needs a connection to a data receiver (DE)—which also includes a configurable element. The DS informs the node of its bus request. The first node directly downstream from the data transmitter is called the initiator node. It takes the address of the next node needed for the data transfer from an internal table, as described below. If the node is capable of addressing the first bus segment needed—this is always possible when the bus segment AND an internal busbar of the node are free—it sets up the connection; otherwise it rejects the request by the DS, and the DS attempts to gain access again at a later time, or it waits and maintains the access request until the node accepts it.

Each successive node in turn takes the address of the next node from its internal table and continues to set up the connection. If the node is not capable of setting up the connection (either the required bus segment is busy or the busbar of the node is not free), it can either jump to a waiting state or interrupt the connection and report back an error to the initiator node.

Only when a connection has been completely set up are the data packets transmitted and the transmitter receives the acknowledgment signals for the data exchange (see rACK in German Application No. DE 196 51 075.9-53). The data transfer is thus automatically synchronized with the data transmitters. If the connection is not set up and must be attempted again at a later time, the data transmitter does not receive an acknowledgment signal, so no data is lost.

Once the connection has been completely set up, it remains quasi-permanently (i.e., it appears to the DS and DE like a direct connection) until the DS breaks the connection again by sending a message to the initiator node. It is conceivable to implement a timeout process which interrupts a standing connection after a certain period of time, in particular when no data transfer has taken place for a long period of time, to clear the bus segments for other connections.

The Extended Routing Method

In the previously described routing method, the addresses are on the bus only during the routing phase. During data transmission, the addresses are no longer transmitted. In the extended routing method, the addresses always run on separate lines together with the data. Two addressing schemes exist:

1. Spatial Coordinates

The spatial coordinates of the target are given as addresses. The spatial coordinates depend on the selected system dimension. For example, a 3-dimensional system uses the X/Y/Z coordinates, while a 2-dimensional system uses the X/Y coordinates. In principle, the method can be used in a system of any number of dimensions. A directional vector containing the information of whether the data/routing moves in the positive or negative direction is assigned to each coordinate.

The data moves from the source node in one of the directions set. The directional coordinate is modified when passing through a node so that when moving in the positive direction, 1 is subtracted;

when moving in the negative direction, 1 is added.

The target axis is reached when the coordinate is 0; the target node is reached when all coordinates are 0.

It depends on the implementation whether a complement of two is generated and a coordinate is represented as a negative number (on which addition is performed) or whether subtraction is performed on a positive number. Addition can be performed on a positive number until an overflow is generated, which indicates the target position.

There are two rational strategies to determine the direction of data transmission:

a. Static method: The data always runs in the same direction; i.e., an attempt is made always to preserve the direction until a change in direction becomes unavoidable. A change in direction is unavoidable when the current directional coordinate is zero, i.e., its target position has been reached.

If the target position of a coordinate has been reached, the data moves in the direction of the non-zero coordinates. If all the coordinates are zero, the target node of the data has been reached.

b. Dynamic method: The data moves in any of the possible directions, always in the direction given by the directional vector. "Moving in any direction" means that the data is always forwarded to the node receiving the least traffic. Thus, an attempt is made to select the path of fewest collisions and blockages. This may make the process faster and more appropriate in the case of large systems.

2. Address Lookup

If lookup addresses are transmitted, the next node is determined in each node. This takes place by reading the lookup address in the routing tables described below, and thus determining the data for the next target. This process is the same as in the "regular" routing method.

The advantage of the spatial coordinates is that no table lookup is needed, which reduces the overhead. The advantage of the address lookup is its flexibility and the exact predictability of the connection.

Sometimes it can be advantageous to mix the two methods. To do so, both addresses (spatial coordinates and lookup addresses) must be transmitted simultaneously. If the spatial coordinates are not zero, the data is transmitted using the spatial coordinates. As soon as the spatial coordinates reach zero, a lookup is performed in the current routing table at the site of the lookup address. This makes it possible to set up, in a flexible manner, the segments over which the data is transmitted by the lookup method or the spatial coordinate method.

Bus States of the Extended Routing Method

1. Quasi-permanent

A connection can be set up quasi-permanently in a manner similar to the "regular" routing method. Each node through which a first data passes is permanently enabled according to the addresses associated with this data. This enable is maintained for all the subsequent data until the connection is broken. Although such a setup is not essential in the extended routing method, it offers two advantages:

i. the transit time of the data is considerably reduced;

ii. time is not wasted in arbitration.

2. Registered

This is the normal bus status. Incoming data is buffered in a register. When writing into the register, an acknowledge signal is sent to the transmitting node. Data is only written into the register when the latter is empty, i.e., either no data has been written into the register or the previously written data has already been retransmitted. If the register is not empty, a wait period without an acknowledge signal follows until the register is empty. The registers are arbitrated and the register with the highest priority at a given time is transmitted. Arbitration and transmission occur cyclically with each clock pulse. This method is particularly suitable for transmission channels on which data from many different sources must be transmitted non-time-critically. This method is referred to as source-optimized.

3. Segmented

A segmented transmission channel has quasi-permanent and register-oriented nodes. The transmission channel is rate-optimized quasi-permanently at some points and is source-optimized at other points.

The Routing Tables

The basic unit of a node is a routing table similar to the switching tables described in German Application No. DE 196 54 846.2-53.

The possible layout of such a table is described on the basis of one embodiment:

| Gate | | | | EALU | | | | Bus | Entry position in the target table | Run time | Setup time |
|---|---|---|---|---|---|---|---|---|---|---|---|
| 1 | 2 | 3 | 4 | O1 | O2 | R1 | R2 | 1 0 | a - 0 | b - 0 | c - 0 |

Each line represents a valid connection. Several connections may be active at the same time, the maximum being as many connections as there are free internal busbars and free external bus segments. A monitoring logic unit which is described below is responsible for testing whether a newly selected connection can be set up.

Each line is addressed and selected by its binary address. In addition, there are special lines that do not have a binary address, but instead are selected by trigger signals or status signals. These signals include (see German Application No. DE 196 51 075.9-53):

rRDYl, rRDYh oACK1, oACK2

Bus connections to the data receivers (rRDY) are automatically set up here whenever the data transmitter cell has valid results. With the oACK signals, the receiver/transmitter sequence is reversed. The data receiver sets up the connection with its data transmitter as soon as the data receiver has processed its operands and is capable of processing new operands.

The active gates for the respective connection are entered in the Gate columns; it is possible for only one gate to be marked and one connection to a configurable element (one or more cells), e.g., to a R-REG or O-REG to be selected (see German Application No. DE 196 51 075.9-53) in the EALU columns.

In the Bus column, the internal busbar used for this connection is selected; this value is binary so that a total of four internal busbars can be used in the table described here. Selection of the internal busbars can also be omitted if a priority decoder recognizes the first free busbar and automatically allocates it.

The column Entry position in the target table shows the address of the line of the table that controls the node to which the connection is to be set up. The routing information in the next node needed for the current connection is at this address.

The Run time column is optional. The expected signal propagation time from DS to DE can be given there. This information can be used for computation of the data throughput or for generating a timeout.

The Setup time column is optional. The maximum time for setting up the connection to the next node (or the entire connection from DS to DE) can be entered there. If this time is exceeded, the connection can be terminated by a timeout and the bus segments and nodes become free for other connections. At a later time, DS will again attempt to set up the connection.

Entries in the routing table can be configured and reconfigured by a program loading unit according to conventional methods (See German Application No. DE 196 51 075.9-53 and German Application No. DE 196 54 846.2-53).

If the "extended" routing method is used, the spatial coordinates must be entered in the routing tables. A priority identifier is also expected.

The priority identifier provides the information on the relevance of a channel for the performance of a module. The higher the priority identifier, the higher the relevance of the channel. The identifier can be configured in three different manners:

1. Timeout

The identifier shows after how many unutilized clock cycles should the channel be cut off, i.e., after how many cycles is a DISCONNECT generated.

2. Packet Size

The identifier shows after how many data packets is a DISCONNECT generated.

3. Clock Cycles

The identifier shows after how many clock cycles is a DISCONNECT generated.

One of the three types can be permanently implemented or a type can be selected via additional information.

The priority type (priotype in the table below) is evaluated in the routing table given below as an example:

| Bit Combination | Priority Type |
|---|---|
| 00 | Timeout |
| 01 | Packet size |
| 10 | Clock cycles |
| 11 | Permanent |

Permanent can also be represented by permanently providing one value of the priority identifier as "permanent." The maximum value of the priority identifier or zero is particularly suitable for this.

signal having the highest priority at the moment will next have the lowest priority and then will have a higher priority with each access). The priority logic unit can serve to allocate an especially high (or especially low) priority to some signals, e.g., rACK, oRDY. The round-robin arbiter ensures that a requested connection which cannot be set up at the moment will have the lowest priority and will thus wait until all other connection requests have been either set up or reviewed.

The State Machine (Control)

A state machine controls the internal sequences in the node. The state machine is divided into two parts:
1. Control of the node,
2. Control of bus transfer and synchronization. A state machine like that described in DE 196 51 075.9-53 may be used.

The implementation of state machine(s) are known to those skilled in the related art and thus, it will not be described in greater detail here.

The Monitoring Unit

A monitoring unit is connected downstream from the routing table. It takes the data entered in an addressed line and checks on whether it is possible to set up a connection. The following points in particular are checked:

Is a free internal busbar available?
Is the requested gate free?
Is the requested external bus segment free?
  a) If the check is positive, the ACCEPT signal is generated and sent to the state machines as well as the unit requesting that the connection be set up to signal successful connection setup.
  b) If the check is negative, the REJECT signal is generated and sent to the state machines as well as the unit requesting that the connection be set up to signal a failed connection. The arbiter described above can respond to this signal and set the priority of this request at the lowest level.

Breaking a Connection

An existing connection can be broken by various criteria. The most important criteria include:

Timeout: A connection is broken because no data transfer has taken place for a long period of time. A timeout can be implemented easily by a loadable decrementer. With each data bit transmitted, the counter is loaded again with a fixed starting value representing the period of time until timeout. If there is no data transfer, it is decremented by one with each bus clock pulse. When it arrives at zero, the maximum period of time has elapsed and the bus is disconnected.

Data counter: A loadable counter is loaded with the number of data bits to be transmitted. With each data bit

| Gate | | | | EALU | | | | Bus | Entry Position in Target Table | Y/X Space Coordinate & Directional Vector | Priority Identifier | Priority type | |
|---|---|---|---|---|---|---|---|---|---|---|---|---|---|
| 1 | 2 | 3 | 4 | O1 | O2 | R1 | R2 | 1 | 0 | k - 0 | m - 0 | n - 0 | 1 | 0 |

The Arbiter

Upstream from the routing table is an arbiter, which selects a few signals via the routing table from the set of requests for setting up a connection. It is appropriate to set up the arbiter from a conventional priority logic unit and a conventional round-robin arbiter (it always switches the highest priority on a time segment to the next signal, i.e., the transferred, the counter is decremented by one. If the counter arrives at zero, all the data has been transmitted and the bus is disconnected.

Synchronization signals (see German Application No. DE 197 04 728.9, RECONFIG): The bus disconnect is controlled by the status and/or synchronization signals of the cell(s) functioning as data transmitters. For example, if the cells indicate that their data processing is concluded or that they can be reconfigured, the bus is disconnected because it is no longer needed. These signals also include rRDY and oACK.

The clearing of the connection proceeds by a signal being sent from the initiator node to break the connection. Each additional node sends the received signal on to its partner node(s) and breaks the connection immediately.

In the extended routing method, quasi-permanent buses are disconnected either by the RECONFIG sync signal (see German Application No. DE 197 04 728.9) or according to the priority identifier. If the end of a connection is determined by a node on the basis of the priority identifier, the node generates the DISCONNECT signal to disconnect the bus and forwards it to all the other nodes. The nodes respond to a DISCONNECT as they do to a RECONFIG.

In register-oriented nodes, disconnecting is not necessary, since a connection is set up dynamically with the incoming data according to the assigned addresses. After the data is forwarded, the connection is automatically broken and becomes free for other transmissions.

Broadcasting

German Application No. DE 196 51 075.9-53 describes a bus system that permits transmission of a data packet to multiple receivers and also allows an acknowledgment of the data transfer. The same system can also be used in accordance with the present invention. It is possible to readily switch several gates to one busbar. Only one line in the routing table is used. The address within the target routing table Entry position in the target table must necessarily be the same in each of the selected routing tables.

To circumvent this problem, it is possible to make available multiple entries as Entry positions in the target table. For example, a separate Entry position in the target table could be available for each gate. Thus, an address within the target routing table is assigned to each gate.

The acknowledgment takes place exactly as described in German Application No. DE 196 51 075.9-53 over signal lines driven by open-collector drivers and terminated with a transistor.

In order to provide better implementability in existing chip technologies, acknowledgment signals in a node can be first masked and then logically gated. The logically gated signal is then forwarded to the next node. If, for example, a logical AND-gating of the acknowledge signals takes place in all the nodes on the path, the result is the same as in the case of an open-collector circuit.

Program Loading Unit (PLU)

A program loading unit as described in German Patent No. DE 44 16 881 A1 is connected to the routing table. By means of this PLU, the routing table—equivalent to the switching tables in German Application No. DE 196 54 846.2-53—can be configured and reconfigured. The routing tables can be expanded by one column which is used to send feedback to the PLU when the connection indicated in the respective line is set up or cleared. Thus, it can be indicated in this column whether feedback is to go to the PLU when the connection is set up or cleared and if so, what type of feedback. Feedback is sent according to DE 196 51 075.9-53, as shown in FIG. 15, where instead of latch 1504, a gate is used which is switched through when the connection is set up or cleared, depending on the setting, and triggers the feedback to the transistors (1502) which are wired as open-collector drivers.

| | PLU | | |
|---|---|---|---|
| Remaining table | Message when setting up connection | Message when clearing connection | Binary value of the feedback |
| ... | b | b | 2 1 0 |

Figure 2:
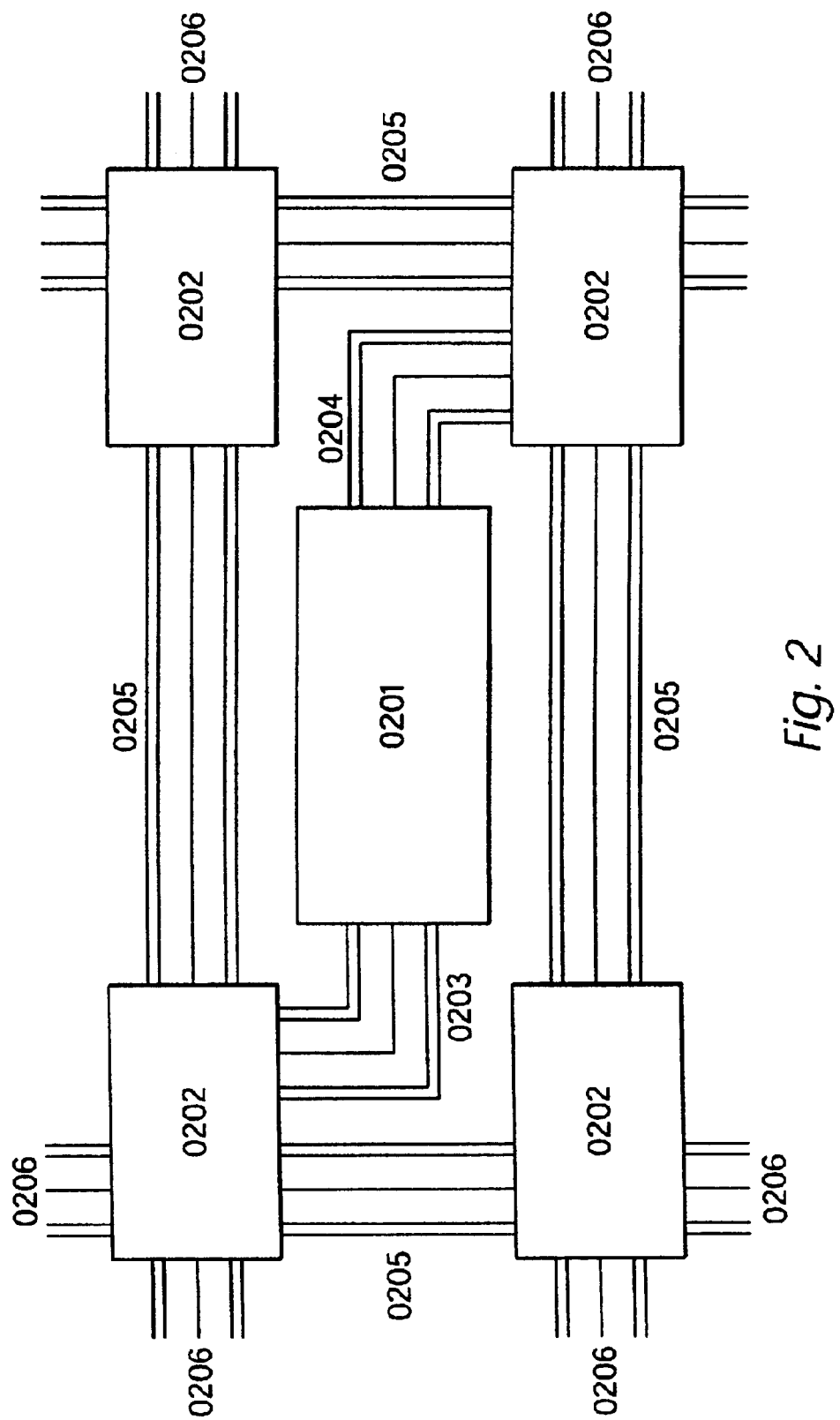
FIG. 2 shows further detail of FIG. 1.

FIG. 1 shows a unit which may be an FPGA, DPGA, or a DFP. (See German Patent No. DE 44 16 881 A1). The unit is composed of configurable cells (0101) and is symmetrical in two dimensions; 0101 may also represent a plurality of configurable cells (including different cells) that are combined in a group and interconnected. The nodes of the bus system (0102) are between the cells. Several nodes are shown, which will set up several connections in the following example. Data transmitter A (0103) will set up a connection to data receiver A (0104), and data transmitter B (0106) will set up a connection to data receiver B (0105). FIG. 2 shows an enlarged detail (0107).

FIG. 2 shows a detail of the generic unit described here. The configurable cell(s) from FIG. 1 (0101) are shown as 0201. A bundle (0203) of several lines (any number is possible and is not shown exactly) connects 0201 to a node 0202. The nodes (0202) are interconnected over the bus segments (0205). The nodes are also connected over bus segments 0206, configured as bus segments 0205, to the nodes outside the detail. The optional line bundle (0204) illustrates that the configurable cell(s) may also be connected to multiple nodes (0202) over several different line bundles.

Figure 3:
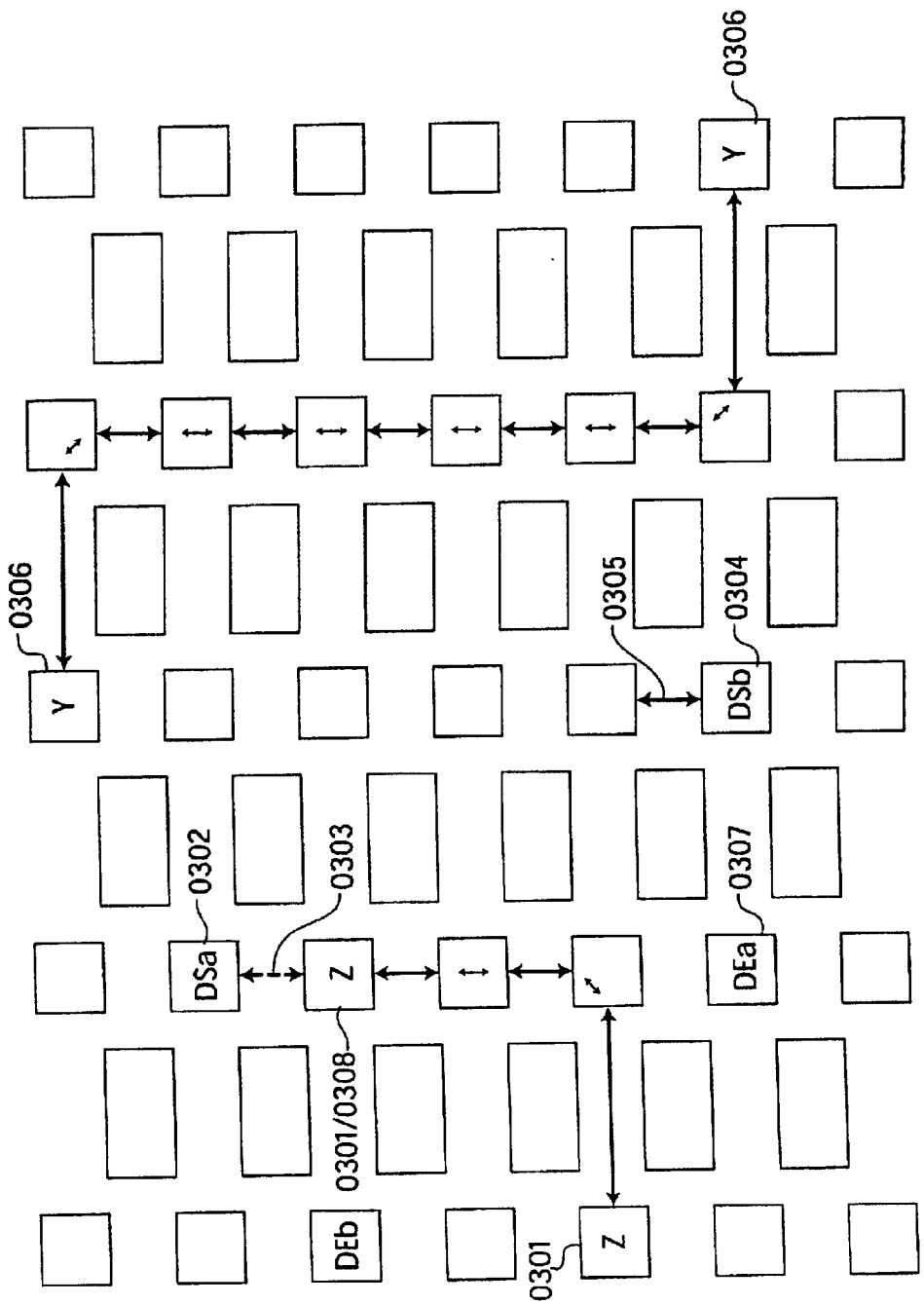
FIG. 3 shows several existing bus connections and the setup of new connections.

FIG. 3 shows the unit at run time. There are several connections:

between nodes Z (0301)
between nodes Y (0306)

Data transmitter A (DSa) (0302) attempts to set up a connection (0303) to data receiver A (DEa) (0307). However, the connection is rejected (REJECT) because it is blocked at node Z (0308). At the same time, data transmitter B (DSb) (0304) sets up a bus segment (0305) to its receiver. This attempt succeeds because the node addressed and the required bus segment are not blocked.

Figure 4:
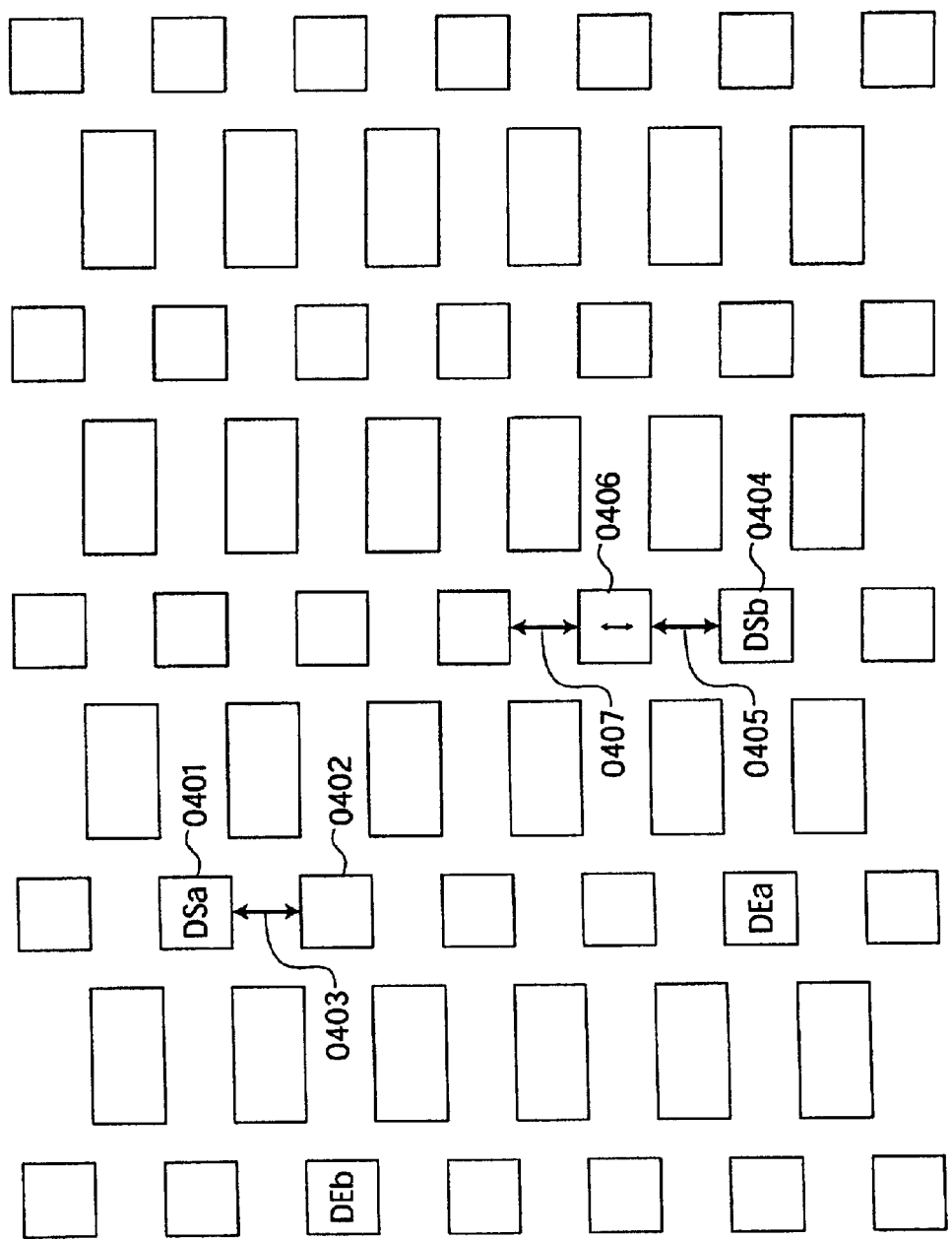
FIG. 4 shows the setup of new bus connections.

FIG. 4 shows the next bus cycle. Connections Y and Z have been cleared in the meantime. Data transmitter A (0401) can now set up the bus segment (0403) because the node (0402) is no longer blocked. At the same time, data transmitter B (0404) expands the existing bus segment (0405) beyond the node (0406)→the new bus segment (0407) is set up.

Figure 5:
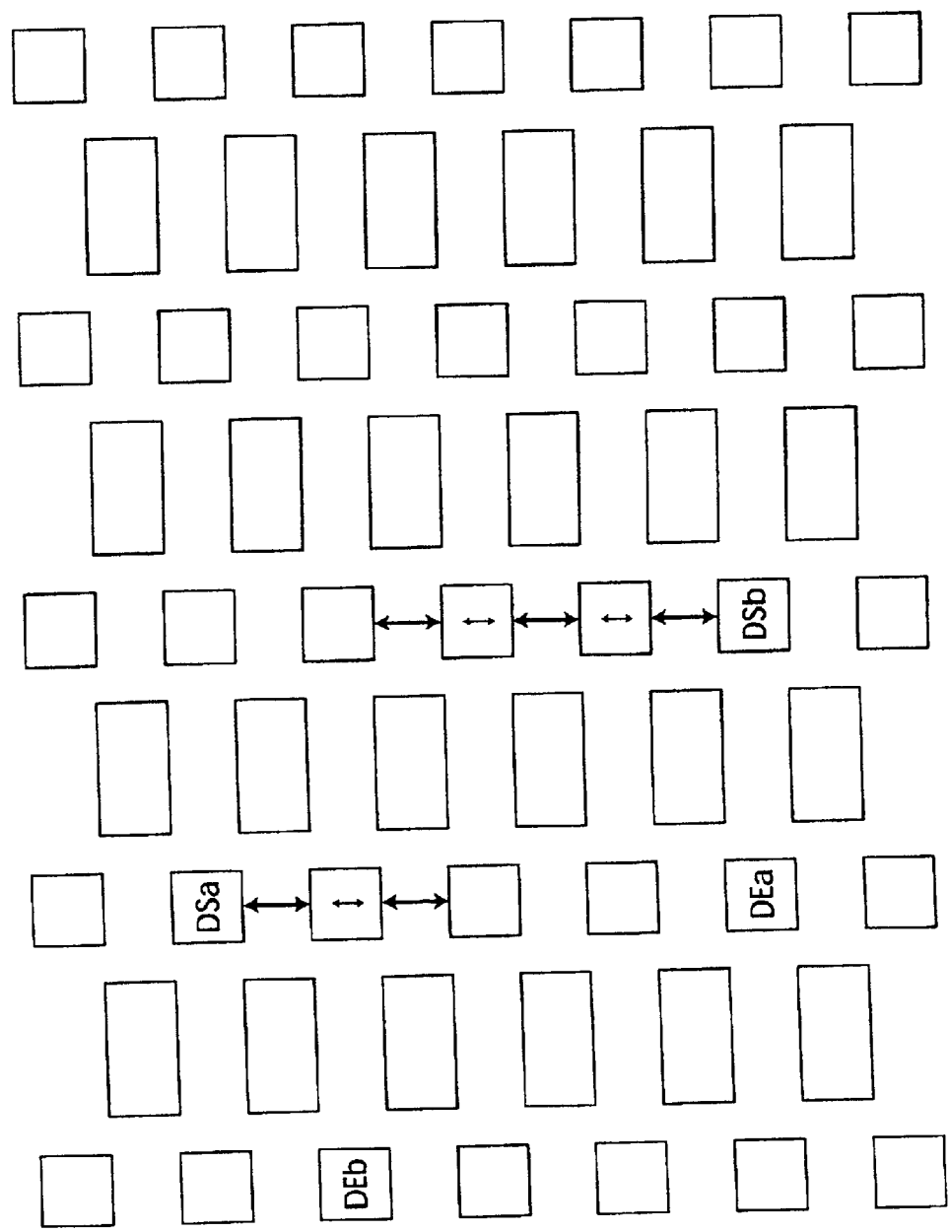
FIG. 5 shows the next step in setting up the connection.

FIG. 5: Setting up the bus which was begun in FIG. 3 and continued in FIG. 4 is continued in a manner equivalent to that in FIG. 4.

Figure 6:
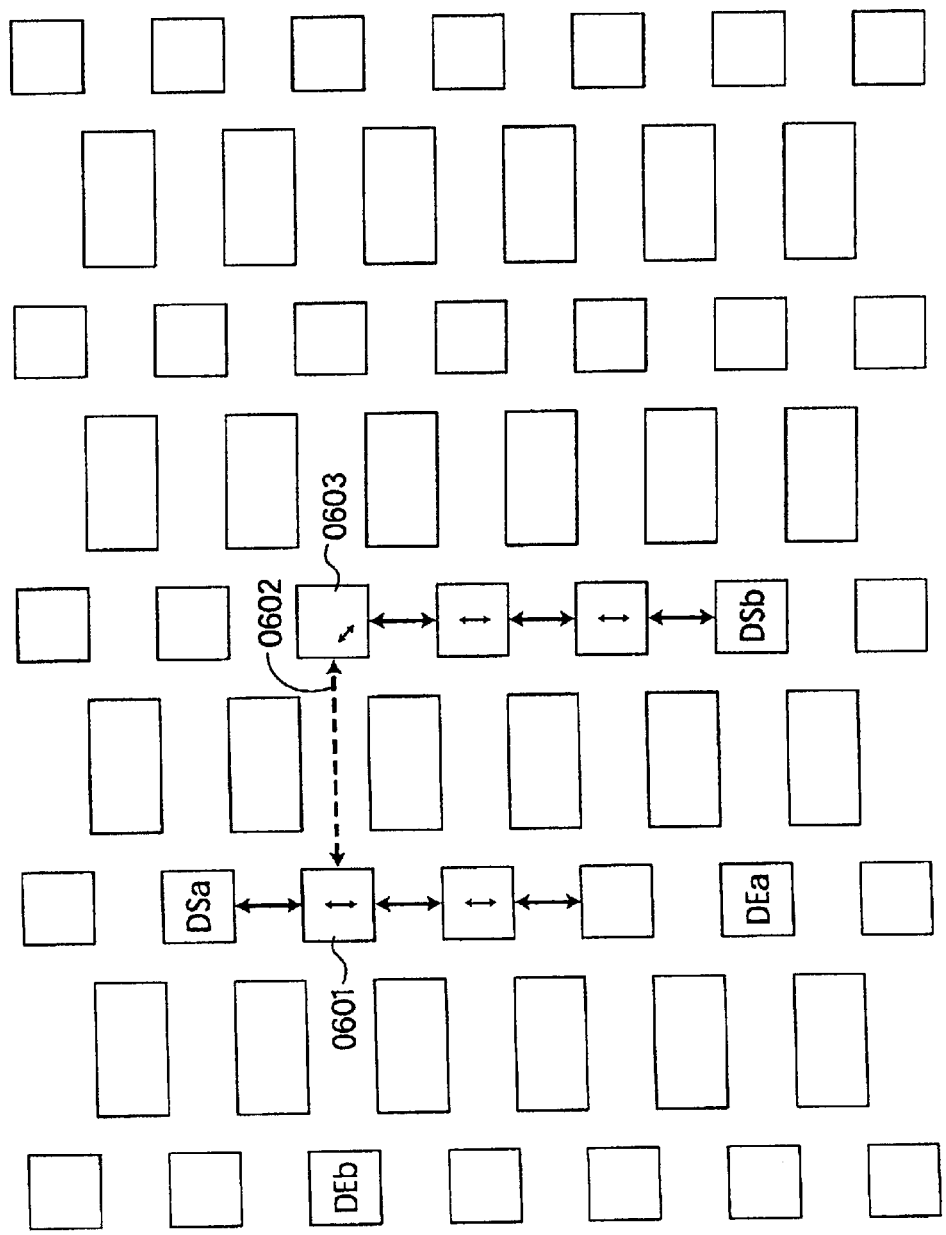
FIG. 6 shows the collision of two buses.

FIG. 6: The attempt to set up a connection of bus segment 0602 for data transmitter B fails. Node 0601 is busy and delivers to node 0603 a REJECT signal that signals the failure of the attempted connection and causes the connection to be terminated.

Figure 7:
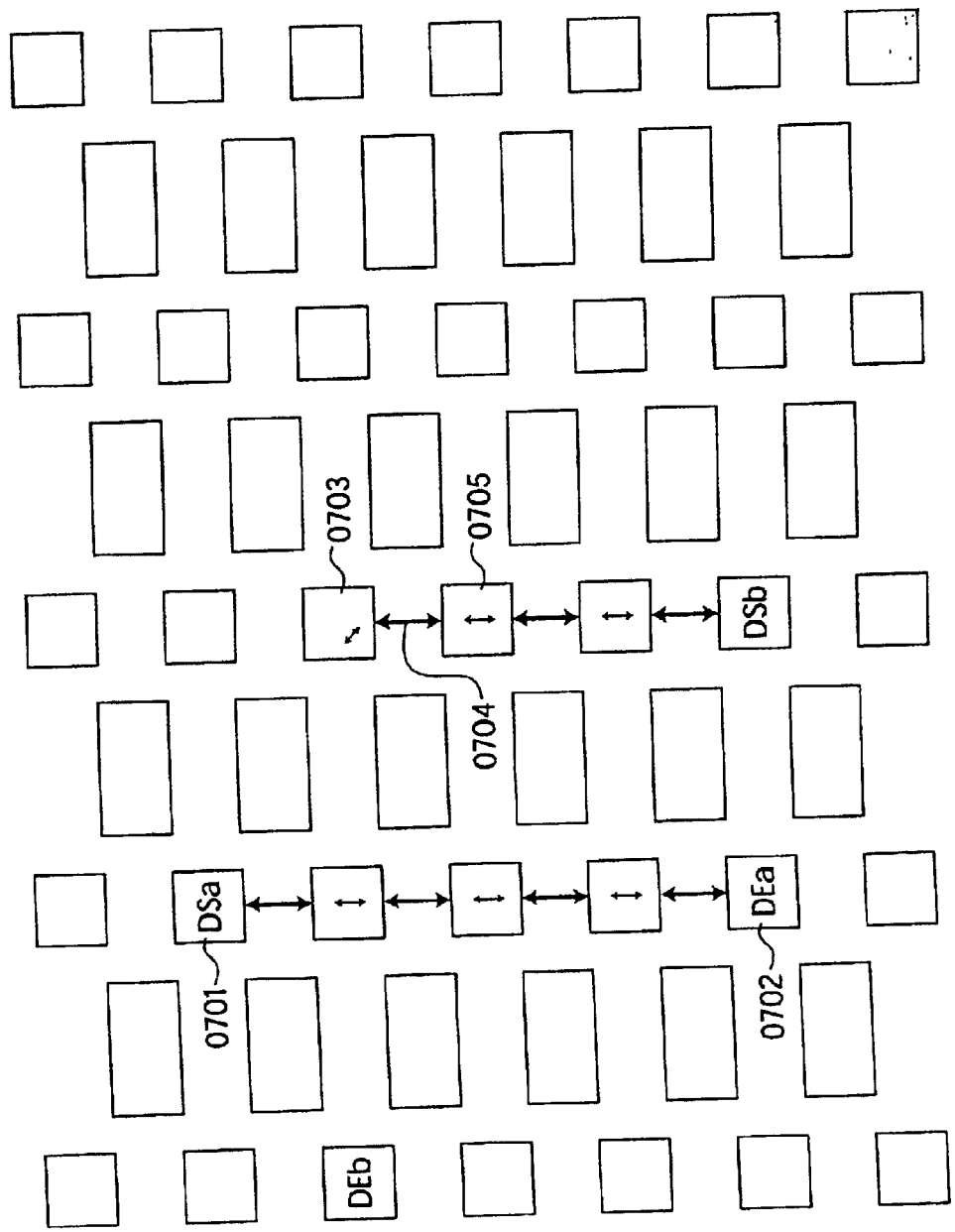
FIG. 7 shows the stepwise clearing of a connection after a collision.

FIG. 7 shows the complete connection set up between data transmitter A (0701) and data receiver A (0702). The connection of data transmitter B is further cleared. Node 0703 delivers the REJECT signal to node 0705 over the bus segment (0704). Then segment 0704 is cleared.

Figure 8:
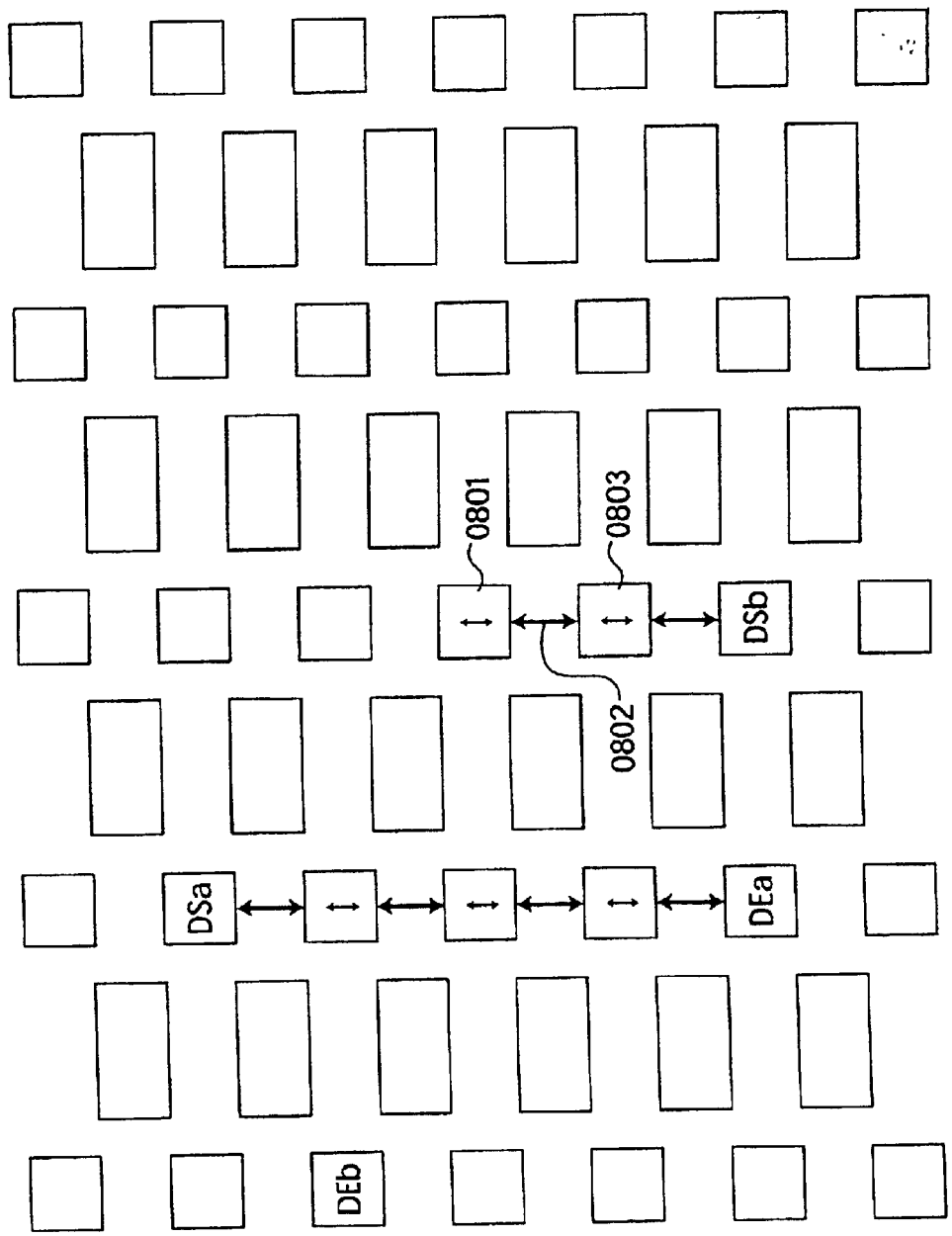
FIG. 8 shows the stepwise clearing of a connection after a collision.

FIG. 8: The data transfer between data transmitter A and data receiver A begins. The connection of data transmitter B is further cleared. Node 0801 delivers the REJECT signal to node 0803 over the bus segment (0802). Then segment 0802 is cleared.

Figure 9:
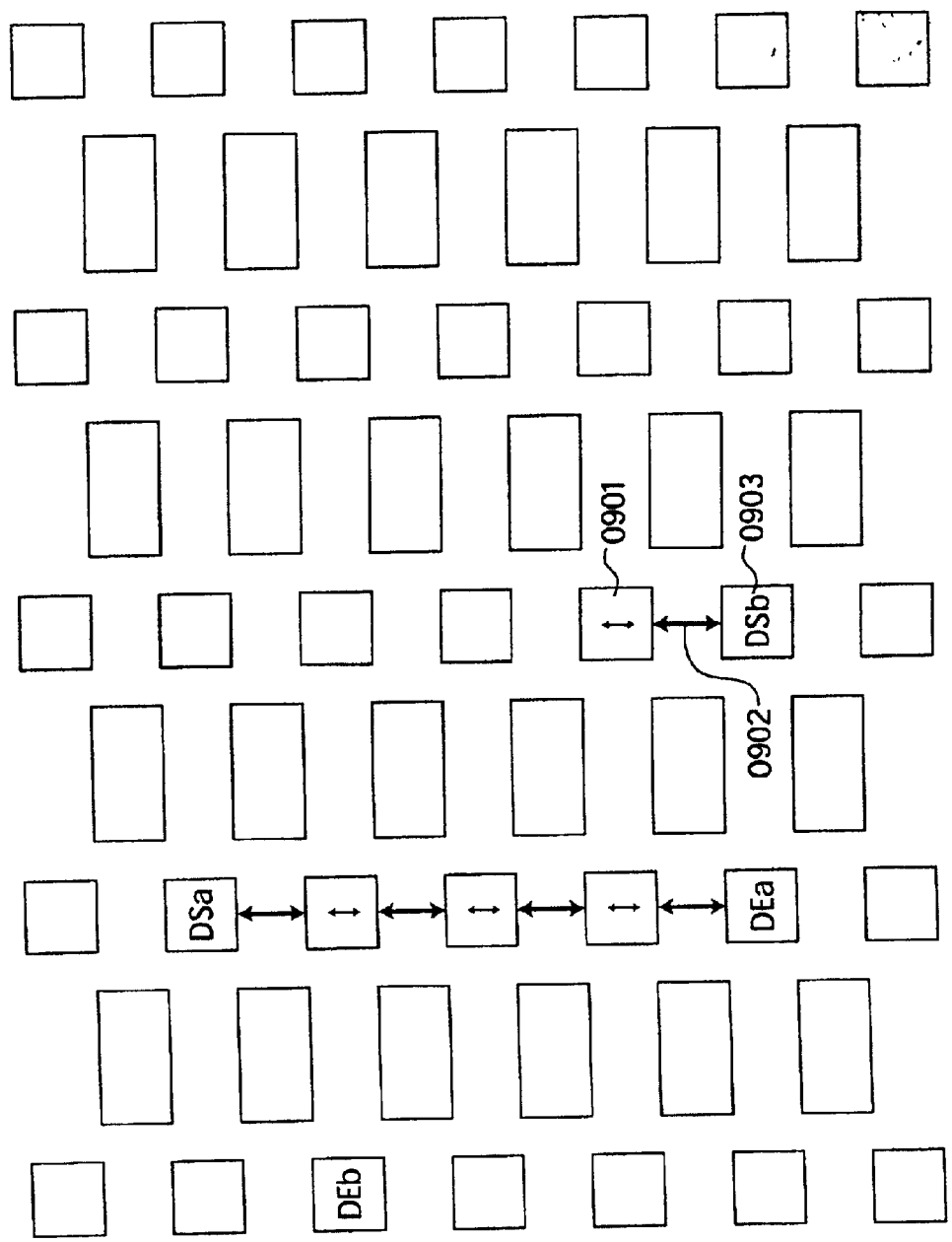
FIG. 9 shows the stepwise clearing of a connection after a collision.

FIG. 9: The data transfer between data transmitter A and data receiver A continues. The last segment of data transmitter B is cleared. Node 0901 delivers the REJECT signal to node 0903 over the bus segment (0902). Then segment 0902 is cleared.

Figure 10:
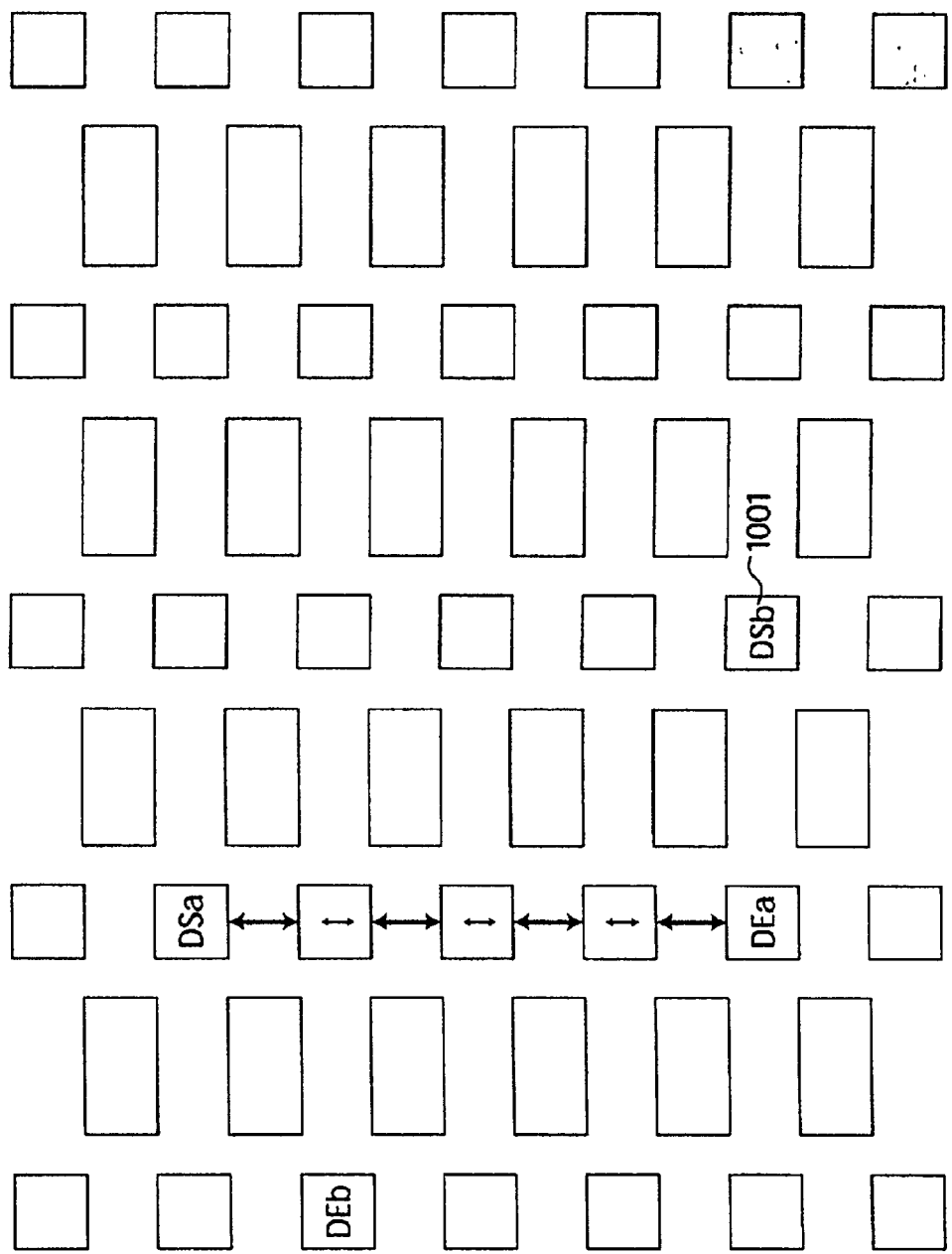
FIG. 10 shows the stepwise clearing of a connection after a collision.

FIG. 10: The data transfer between data transmitter A and data receiver A continues. Data transmitter B (1001) waits a period of time until it again attempts to set up a connection to its data receiver.

Figure 11:
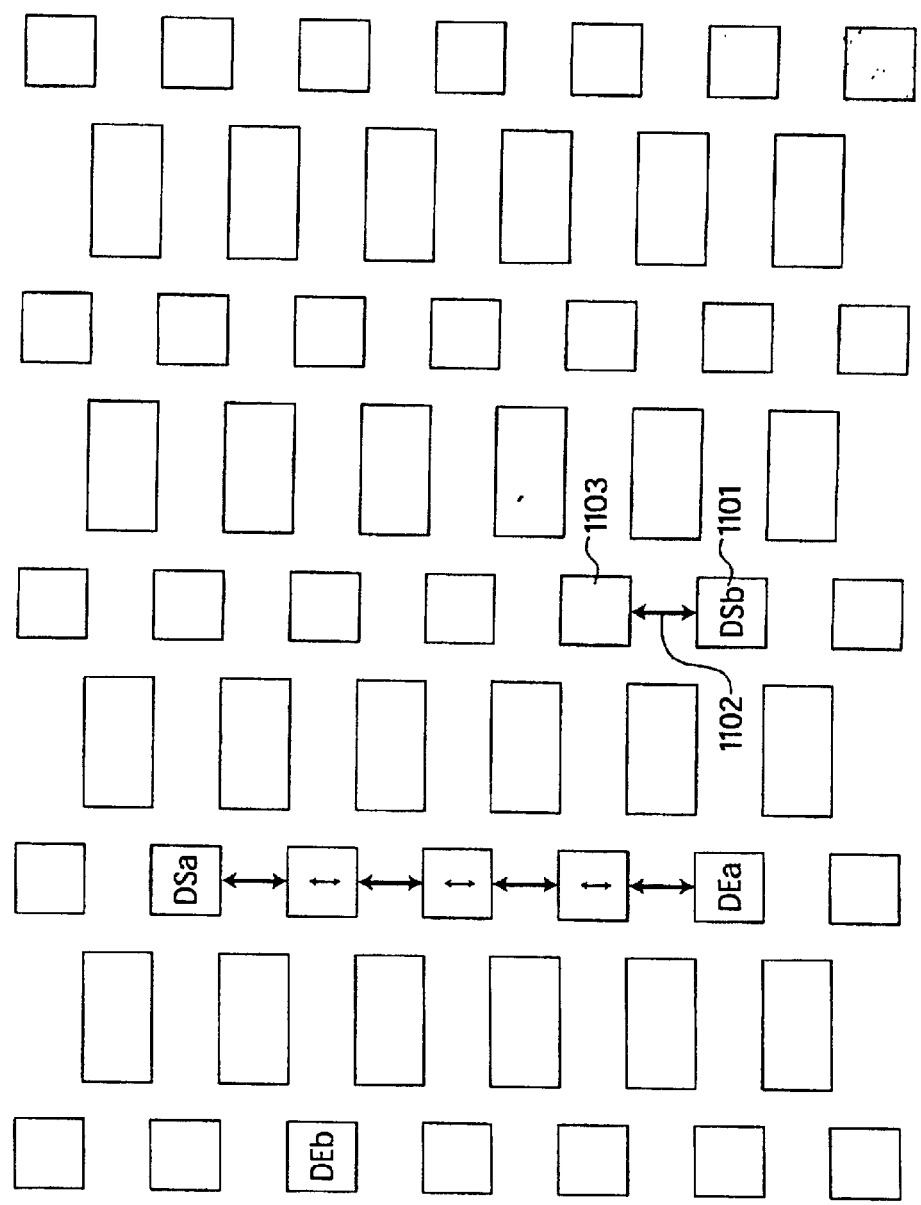
FIG. 11 shows the resetting of the cleared connection after a certain period of time.

FIG. 11 shows the status several bus cycles later. The data transfer between data transmitter A and data receiver A is still taking place. Data transmitter B (1101) starts a new attempt to set up the connection to its data receiver. It sets up a bus segment (1102) to node (1103). If the connection of data transmitter A to its data receiver A is cleared in the next bus cycles, the connection of data transmitter B (1101) will be set up successfully; otherwise it will fail again as described in FIG. 6.

Figure 12:
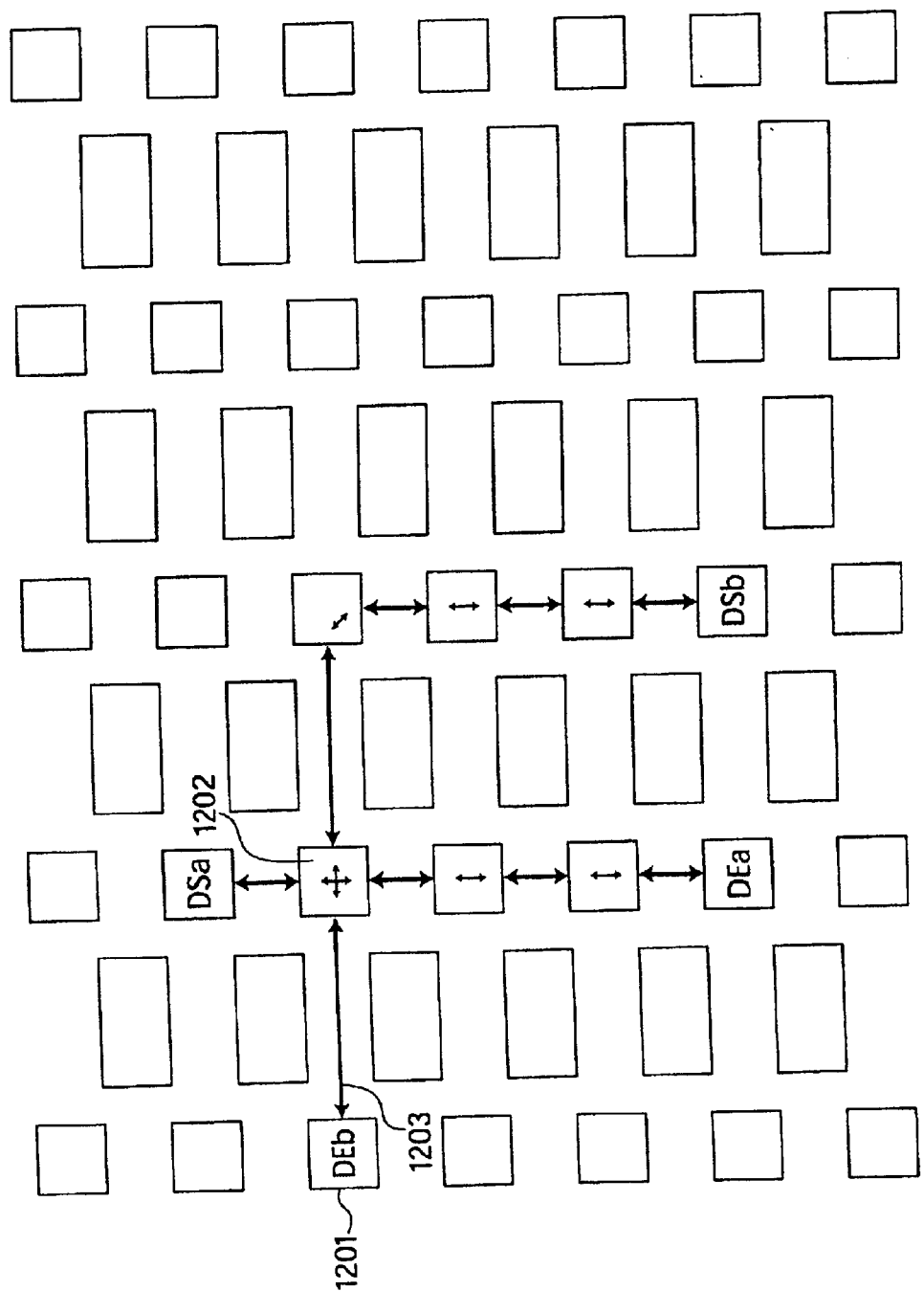
FIG. 12 shows the continuation of FIG. 6 when the node has more than one busbar and thus there is no collision.

FIG. 12 shows the continuation of FIG. 6 when node 1202 is capable of setting up more than one connection, i.e., the node has several internal busbars. Thus the connection of data transmitter A can be handled over the first busbar, and the connection of data transmitter B can be handled over the second busbar. Node 1202 sets up bus segment 1203 to data receiver B (1201).

Figure 13:
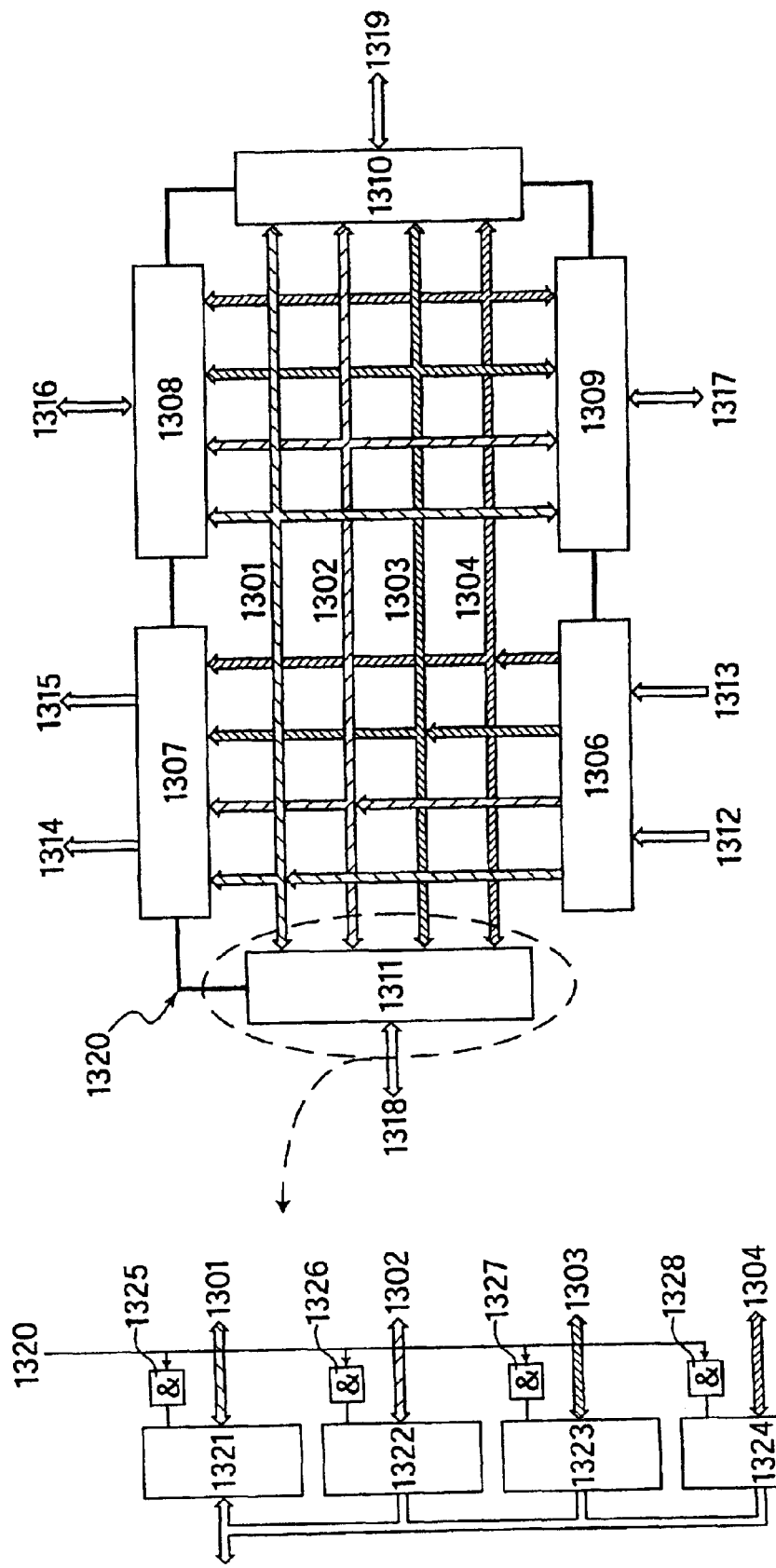
FIG. 13 shows the connection of the bus segments to the busbars of a node.

FIG. 13 shows an interconnection structure within the node. There are four busbars 1301, 1302, 1303, 1304 within the node. The busbars are switched to the bus segments west (1318), north (1316), east (1319), south (1317) over one group of gates each (1308, 1309, 1310, 1311). The busbars are connected to O-REG1/2 (see German Application No. DE 196 51 075.9-53) over gates 1307 (1314, 1315). The R-REG (see German Application No. DE 196 51 075.9-53) is connected to the busbars over gates 1306. The lower-order and higher-order R-REG (1312, 1313) can be wired separately. The gates are driven via bus 1320. The required gate system (west, north, east, south) and the internal busbar are indicated. The required gate (1321, 1322, 1323, 1324) is selected by AND-gating (1325, 1326, 1327, 1328) the directional information with the information on the busbar selected.

FIG. 14a shows the setting up of a connection, with the data transmitter (1401) transmitting the first data packet to the node of the data transmitter (1402).

FIG. 14b: The node selects from the routing table the entry belonging to rRDY—rRDY is a status signal which indicates that data is ready at the data transmitter (see German Application No. DE 196 51 075.9-53). On the basis of this entry, the next bus segment is set up and the address of the routing table of the next node is transmitted.

FIG. 14c: The last node (1403), the data receiver node, receives the address for the entry within its routing table. The entry points to a cell, not to another node. Therefore, the node immediately activates its gates to the selected cell.

FIG. 14d: The data goes through the activated gate of 1403 directly to receiver cell 1404.

FIG. 14e: The cell sends back the oACK signal (see German Application No. DE 196 51 075.9-53) as an acknowledgment for the data received. In the next bus cycle (see FIG. 14f) the data transmitter will then send the next data packet.

FIG. 14f–g: Normal data exchange is taking place between the cells.

FIG. 15a: There is a data connection from the data transmitter (1501) to the data receiver (1503) over several nodes.

FIG. 15b: The data transmitter (1501) has terminated its data transmission and is sending a DISCONNECT signal to the first node.

FIG. 15c: The first bus segment is cleared and the node relays the DISCONNECT signal further.

FIG. 15d: The clearing of the connection proceeds.

FIG. 15e: The last node receives the DISCONNECT. Then the last node clears the connection to the preceding node and to the data receiver at the same time.

FIG. 15f: The last bus segment and the connection to the data receiver are cleared.

FIG. 15g shows a disconnect process where the DISCONNECT line is looped through all nodes. The DISCONNECT is propagated in one clock cycle; all segments are disconnected at the same time.

FIG. 15h corresponds to FIG. 15e.

Figure 16:
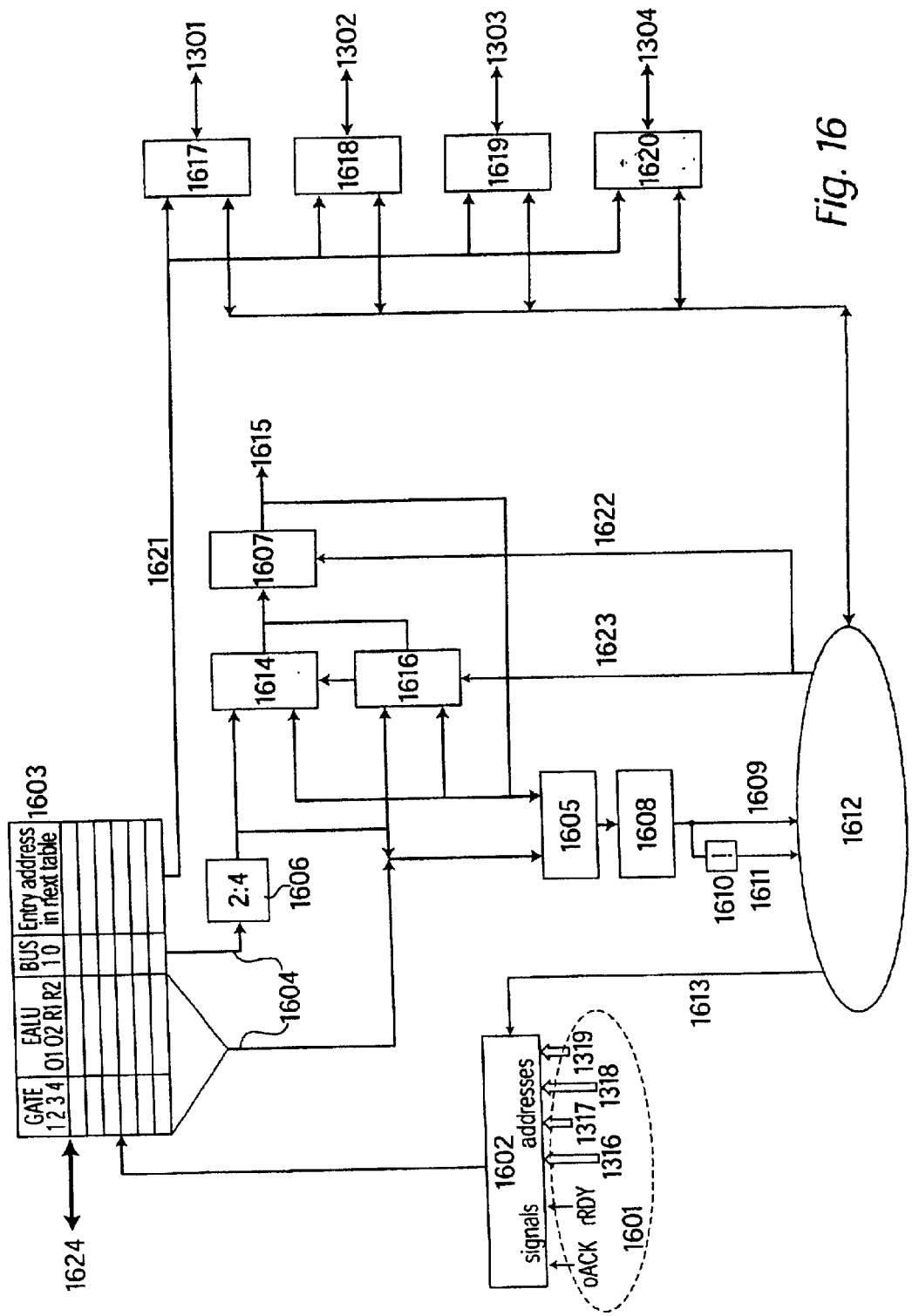
FIG. 16 shows the control unit of a node.

FIG. 16 shows the control of a node. Requests (1601) for setting up a connection are transmitted over the priority decoder (1602) to the routing table (1603). The priority decoder selects the request with the highest priority, with the request that has just failed being assigned the lowest priority. The priority logic unit receives its requests over status signals (e.g., of the configurable cells (see German Application No. DE 196 51 075.9-53) rRDY, oACK) or over the bus segments 1316, 1317, 1318, 1319. If data is applied to the bus segments without the gate of the bus segment being activated, the data is interpreted by the priority logic unit as the address of the routing table and is regarded as a request. If status signals are applied to the priority logic unit (rRDY, oACK), they are transmitted in addresses for the routing table. The addresses of the routing table select an entry. The data of the entry (1604) is relayed to an AND-gate unit (1605). The binary number of the bus selection (BUS 1-0) is transmitted to select signals via a 2:4 decoder (1606). The AND-gate unit AND-links each signal with the same signal stored in a latch (1607). This means that the GATE1 signal of the routing table is AND-gated to the GATE1 signal of the latch, the GATE2 signal of the routing table is AND-gated to the GATE2 signal of the latch, etc. The signals of the latch represent the status of the instantaneous interconnection structure, i.e., the gates used and the busbars being used are entered into the latch. If an AND-gating of the connection request to the current status yields a true level, this means that the new connection request requires resources that are in use at the moment. All the AND-gates are OR-gated with one another (1608). If a true level is obtained at the output of the OR-gate, the connection request is rejected (REJECT) (1609), because the required resources are busy. The ACCEPT signal (1611) is generated from the REJECT signal over an inverter (1610). The signals are relayed to a state machine (1612) which can be implemented by a known technology. This then controls the acceptance or rejection of the connection. If the connection request is rejected, the state machine sends the REJECT to the priority decoder via 1613 and the request is assigned the lowest priority. If the request is accepted, the new status signals are OR-gated with the current status signals after the latch (1614) (the OR-unit has the same design as the AND-unit (1605) described above) and written back into the latch (1607). The state machine controls via 1623 whether the OR-unit (1614) or the mask (1616) is active. The latch is triggered by the state machine via 1622. The new setting goes to the gates via bus 1615.

A bus connection is cleared by a similar procedure. However, the REJECT signal must occur in a check of resources, because the bus connection that is to be cleared must exist. On the basis of the REJECT, state machine 1612 activates mask 1616 instead of OR-unit 1614. The connection data on the connection to be cleared is masked out of the current interconnect status and written back into latch 1607. Before rewriting the new connection data, the state machine sends the DISCONNECT signal to clear the connection to the next node.

The control can directly access busbars 1301, 1302, 1303, 1304 over gates 1617, 1618, 1619, 1620. Thus, the state machine can transmit control signals (DISCONNECT) to the busbar and can also receive control signals (REJECT, ACCEPT) from the busbar and can respond to them. Likewise, these gates serve to transmit the Entry position in the target table (via 1621) to the busbar.

The program loading unit (PLU) can access the routing table via 1624.

Figure 17:
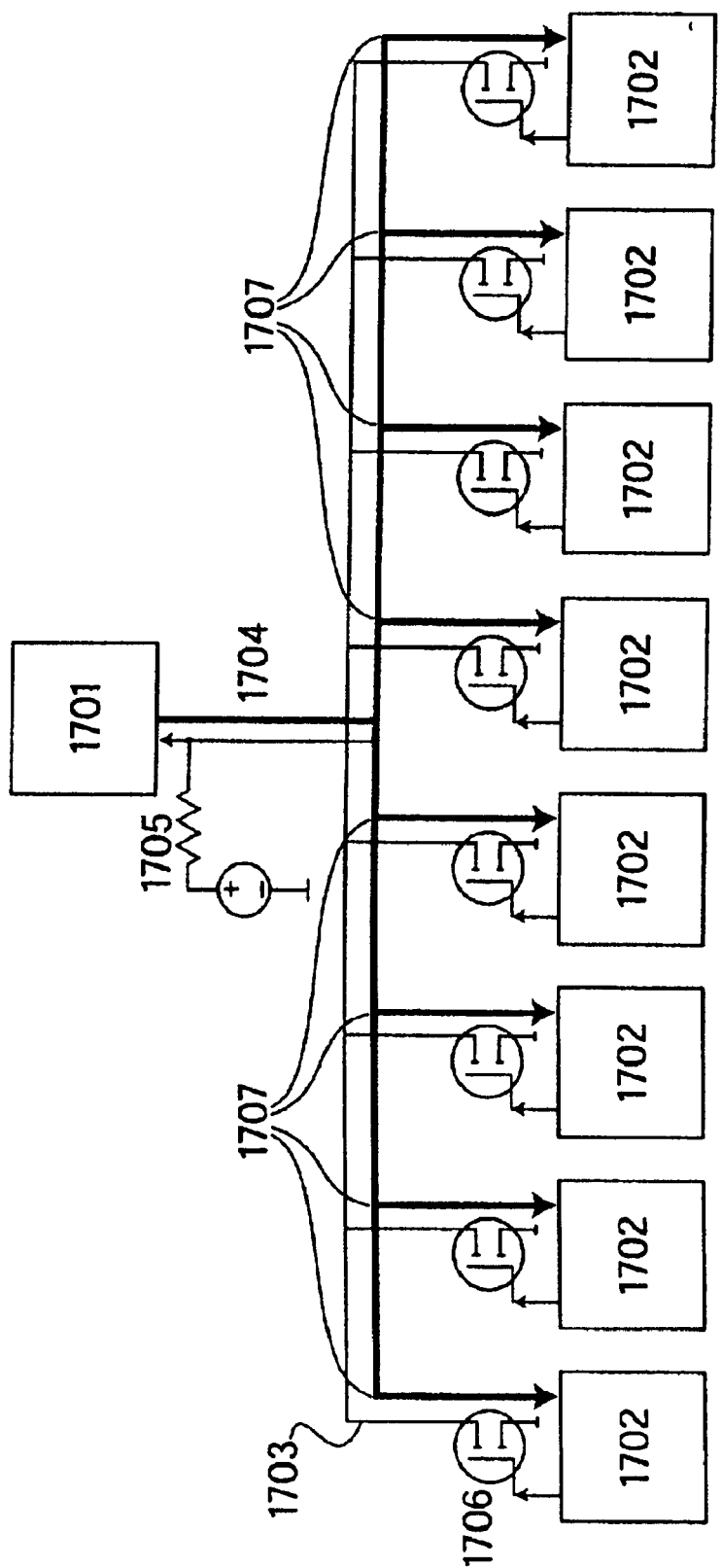
FIG. 17 shows an exemplary broadcasting to several data receivers.

FIG. 17 shows broadcasting of a data transmitter (1701) to multiple data receivers (1702) over a plurality of nodes (1707), which are not discussed further here. The bus is shown as divided for the sake of illustration, namely, divided into the acknowledge line (ACK) (1703) and the remaining bus (1704). ACK is negated and supplied to the inverting open-collector bus driver. ACK is pulled to H level over a pull-up resistor 1705. The circuit is designed so that the following cases occur:

- If the corresponding bus is not activated, L is applied to the base of the transistor (1706). Thus it does not use the bus.
- If the corresponding bus is activated and the signal is not acknowledged, H is applied to the base of the transistor (1706). This means that the bus is pulled to L. If a result of broadcasting is distributed to multiple data receivers, all nodes that have not yet acknowledged the result data and need waiting cycles pull the bus to L.
- If the corresponding bus is activated and the signal is acknowledged, L is applied to the base of the transistor (1706). This means that the bus is not used. If a result is distributed by broadcasting to multiple data receivers, then none of the nodes that have acknowledged the result data and do not need waiting cycles use the bus.

Since the bus in its initial state assumes the H level, i.e., the acknowledgment, non-acknowledgment according to case 2 overrides acknowledgment by pulling the bus to L. The bus does not go to the H level, i.e., the acknowledgment status, until all nodes involved in the connection have sent an acknowledgment. Thus, a wired-AND circuit is implemented.

An example of implementation is illustrated for a node having the following bus architecture:

| Data | Data Signals |
| --- | --- |
| ACK | Data and connection handshake |
| RDY | Data handshake (data present) |
| SETUP | Connection handshake (the segment is set up) |
| DISCONNECT | Disconnect request (through timeout) |
| RECONFIG | Disconnect request (through reconfiguration of the configurable cells involved) |

Figure 18:
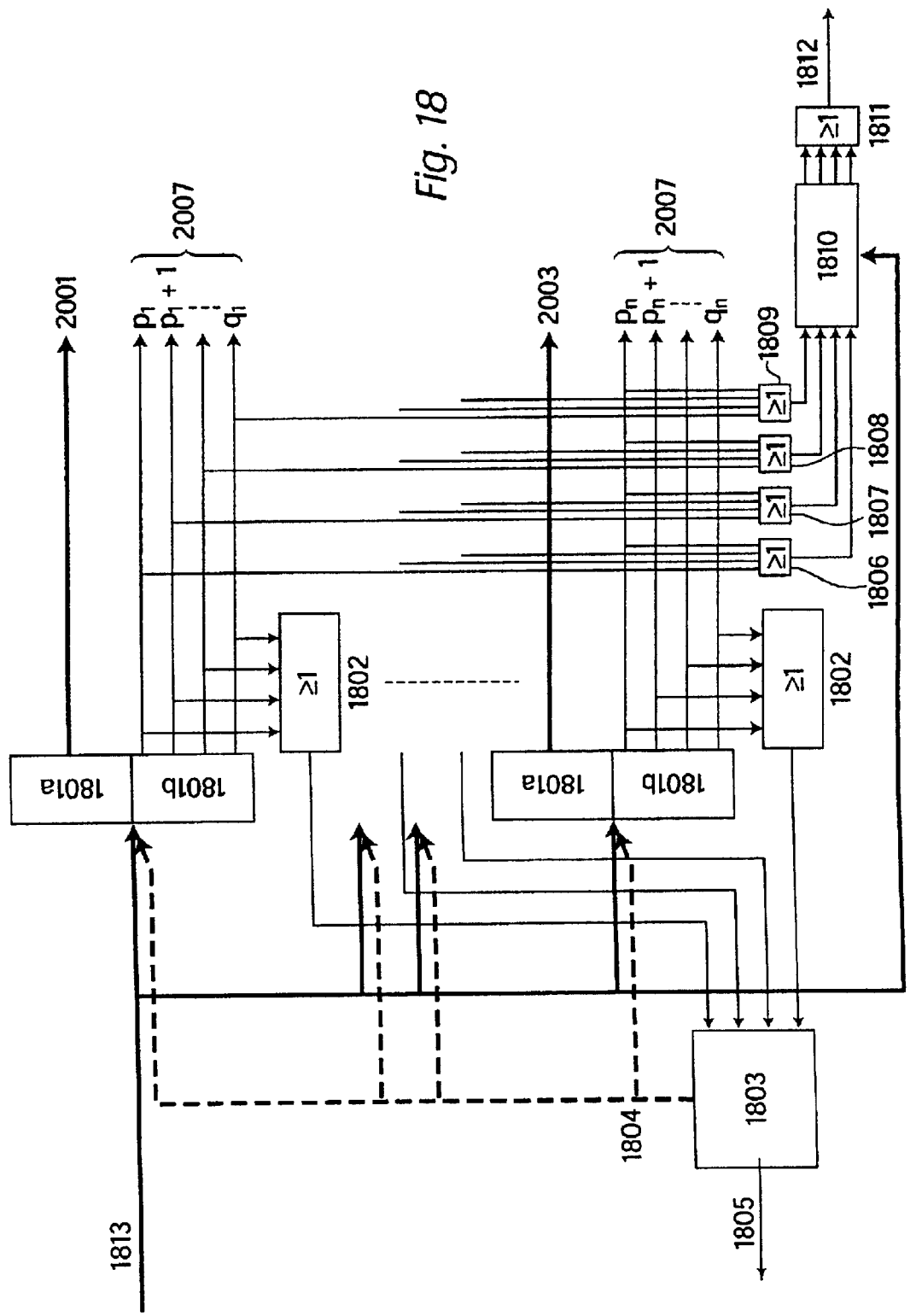
FIG. 18 shows another embodiment of the control unit shown in FIG. 16, for a node with collision detectors.

FIG. 18 shows the control of the busbars of FIG. 13. Contrary to the embodiment described previously, where the busbar is predefined in the routing tables, the logic is independently capable of determining and assigning a free busbar.

Each trigger unit 1801 is assigned to a busbar. A trigger unit made up of a gate (1801*a*), for sending the address information of the routing table to the node connected to the busbar, and a register (1801*b*) that is responsible for driving the busbar. 1801 receives, via bus 1813, the data, via a circuit described in FIG. 19, from the routing table. The gates with access to the respective busbars are enabled via 1801*b*. Each gate has an enable signal assigned to the entry in 1801*b*. When no entry is set, the respective busbar is free and can be assigned to an access request. The check is performed by an OR function (1802) via all the enable signals sent to the gates. The results of 1802 from all busbars are sent to an arbiter (1803), which selects one of the free busbars and addresses its 1801 via an address bus (1804). If no busbar is free, 1803 signals this via 1805 of the controlling state machine. An entry in 1801*b* identifies a gate assigned to the busbar. The position in each 1801*b* is the same. This means that the enable signal for gate p starts at position p of 1801*b*, the enable signal for gate p+1 starts at position p+1, and the enable signal for gate q starts at position q. If an OR function (1806) is executed via the enable signal of a gate p, the result provides the information of whether or not gate p is free. There is such a checking function for each gate (1807=gate p+1, 1808, 1809=gate q). All gates for which the current connection setup is irrelevant are masked out via a mask 1810, i.e., irrelevant gates are forwarded by the mask as disabled. An OR function determines whether one of the gates is enabled. Since all the irrelevant gates are marked as "disabled," only the status of the gate that is necessary for the current setup is forwarded to the state machine (1812). If the desired gate is enabled, it cannot be used in the current setup, since otherwise a collision would occur. Connection setup is aborted and is either rejected or attempted later.

Figure 19:
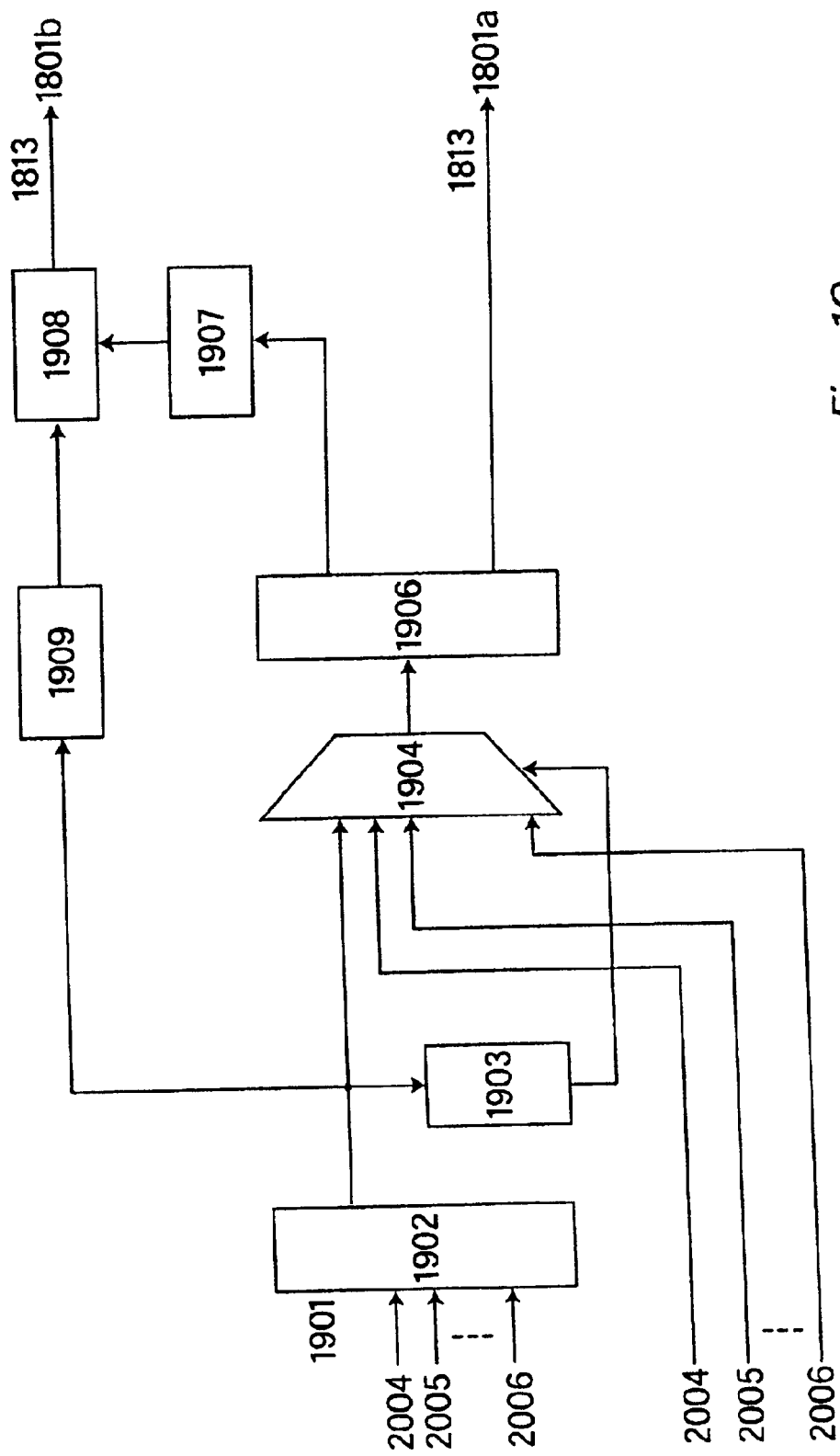
FIG. 19 shows another embodiment of the routing table shown in FIG. 16, with the control of FIG. 18.

FIG. 19 shows the routing table and the arbiter for selecting the active bus. Each bus (2004, 2005, 2006) connected to a node sends an access request via a signal (1901) to an arbiter (1902), which selects one of the access requests. The multiplexer (1904) is activated by a decoder (1903) so that either the number of the selected access (through a configurable cell for direct access) (1905) or the lookup address of the selected access is forwarded to routing table 1906. 1906 outputs the data assigned to the value of 1905. The lookup address of the next node is transmitted via 1813 to 1801*a*. The address of the next node, decoded in the decimal form (1907), to 1801*b* via a mixer (1908), usually made up of OR-gates, to 1801*b* over bus 1813. If the bus to the next node is set up, the gate to the previous node can be enabled by switching the addresses of the previous node, decoded by decimal decoder 1909, in mixer 1908 to bus 1813 and transmitted to 1801*b*.

Figure 20:
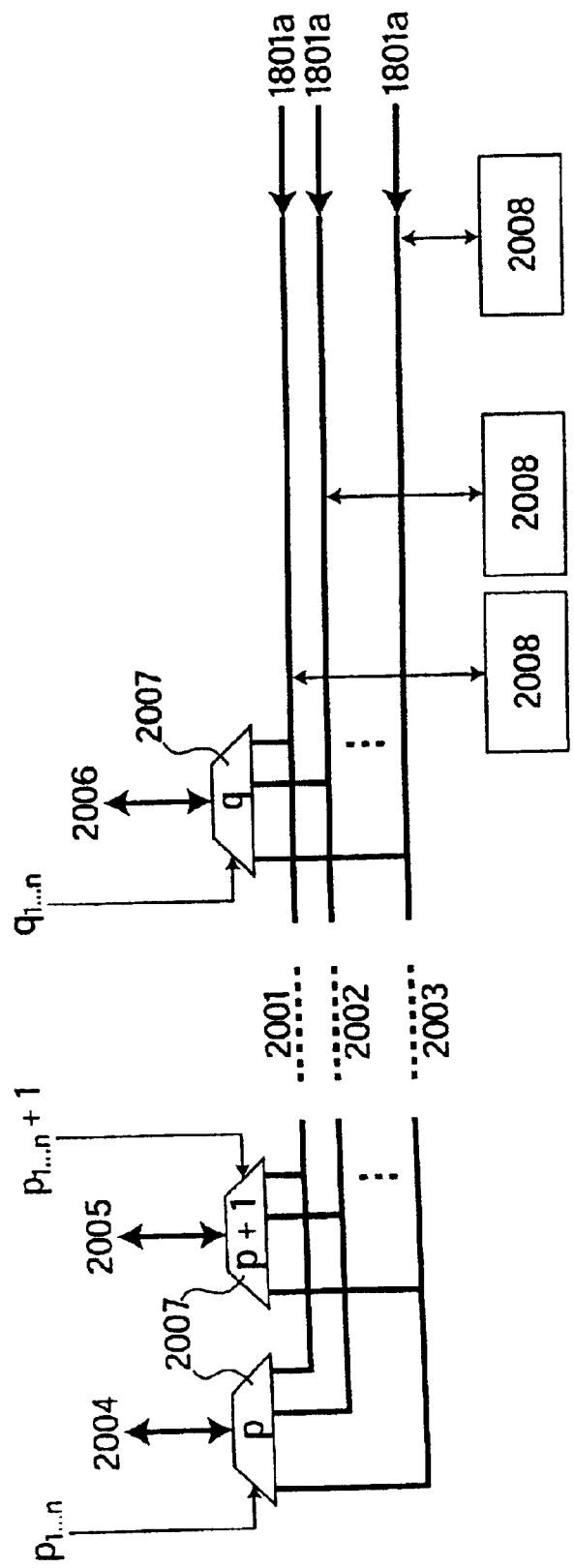
FIG. 20 shows a busbar that can be used in FIGS. 18 and 19.

FIG. 20 shows the busbars (2001, 2002, 2003) for connecting the adjacent buses (2004, 2005, 2006). The buses are connected to the busbars over the multiplexers/demultiplexers (2007), triggered by 1801*b*; a multiplexer p receives the output signals p of all 1801*b*; a multiplexer p+1 receives the output signals p+1 of all 1801*b*, etc. The individual signals represent adjacent busbars, since each busbar control controls exactly one (p) of a plurality of signals ($p_x, p_{x+1}, \ldots, q_x$). If a signal assigned to a busbar control is set, the corresponding busbar is connected through a 2007.

The timeout generators (2008) control the disconnection of the respective segment and the connected bus. The timeout generators are configured directly by the routing table (1906). The connection is not shown in the figures for the sake of clarity.

The 1801*a*'s assigned to a busbar are connected to this busbar.

Figure 21:
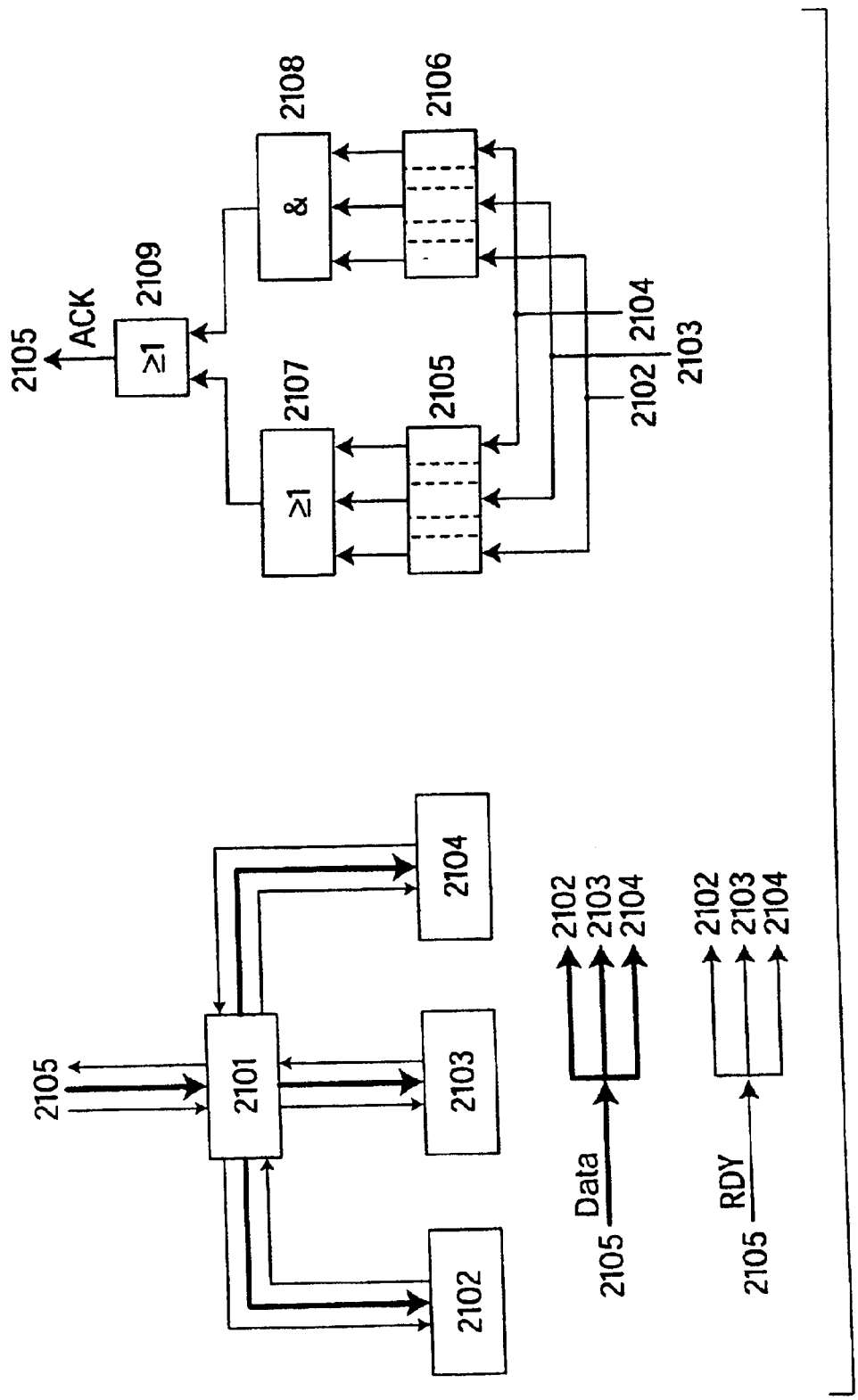
FIG. 21 shows a further exemplary broadcasting to several nodes.

In FIG. 21, a bus segment (2105) is broadcast to several nodes (2102, 2103, 2104) via one node (2101). The RDY handshake is transmitted, like the data, directly to each receiver. The response ACK handshakes are sent to the OR-gate (2107) and the AND-gate (2108) via masks (2105, 2106). The relevant ACK and whether an ACK is forwarded through a Boolean AND-function or an OR-function is selected via the masks. Both functions are combined over an OR-gate (2109). If an ACK is irrelevant, mask 2105 forwards a logical 0 (L level), while mask 2106 forwards a logical 1 (H level). Masks 2105 and 2106 are set separately by the routing table. The connection is not illustrated in the figures for the sake of clarity.

Figure 22:
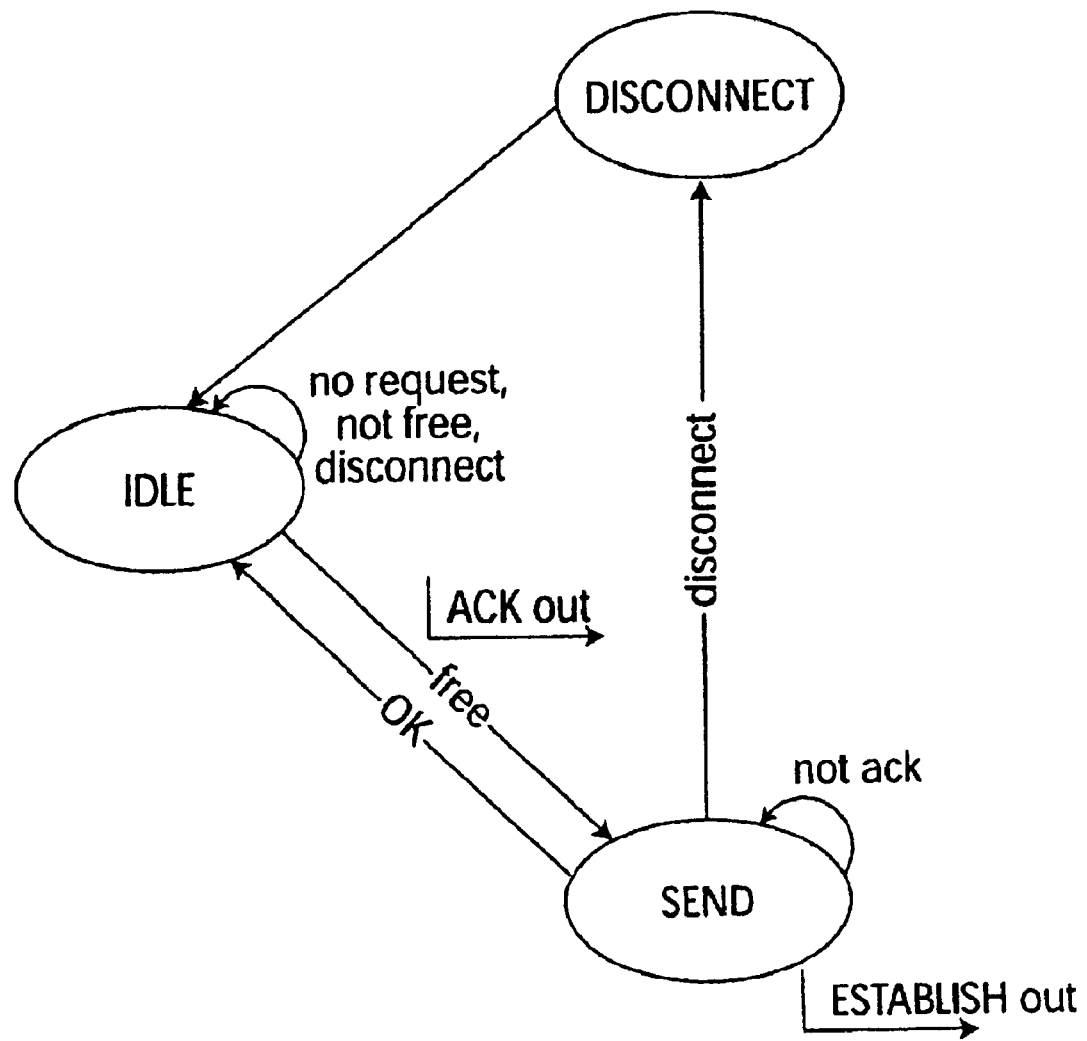
FIG. 22 shows the sequence control for the devices shown in FIGS. 18–21.

FIG. 22 shows the state machine of the circuit described. The base state is "IDLE," which is not exited by the state machine until a "request" (access) has appeared AND a busbar AND the selected gate are free. Then the state machine acknowledges the bus setup to the previous state machine by sending an ACK handshake. The state machine goes into the SEND mode, during which the data of the routing table is sent (via 1801a) to the next routing table. The state machine exits this mode only when it receives an ACK handshake from the next routing table OR when a "disconnect" signal is received by the bus, e.g., due to a timeout. In the event of a "disconnect," the state machine goes into the DISCONNECT mode to disconnect the bus (this mode is not essential; in another exemplary embodiment, the state machine may jump back to IDLE, but this example illustrates the operation better). When an ACK handshake is received, the state machine jumps back to IDLE; the gate of the previous routing table is enabled in 1801b via 1909/1908. In order to improve the performance of the routing table, waiting for an ACK handshake during the SEND mode may be omitted. For this purpose, the access data to be sent to the next routing table should be buffered in 1801a during the SEND mode, i.e., 1801a is a register; at the same time, the information on the previous routing table should be written into an additional 1801b during SEND. Receipt of the ACK handshake of the following routing table causes 1801a to be switched off in the logic set up independently and switches from the first to the second 1801b, by storing the wiring of the gate of the previous routing table.

The following figures describe an example of implementation according to the "extended" routing method; the bus has the following configuration:

| Data | Data signals |
| --- | --- |
| ACK | Data and setup handshake |
| RDY | Data handshake (data is present) |
| DISCONNECT | Bus disconnect request (via timeout) |
| RECONFIG | Bus disconnect request (via reconfiguration of the configurable cells involved) |
| X/Y | X/Y Spatial coordinates |
| LUT | Lookup address for the routing table |
| ADR-MODE | Shows whether the X/Y spatial coordinates or the lookup address should be used. If X = 0 AND Y = 0, the lookup address is automatically used. |

Figure 23:
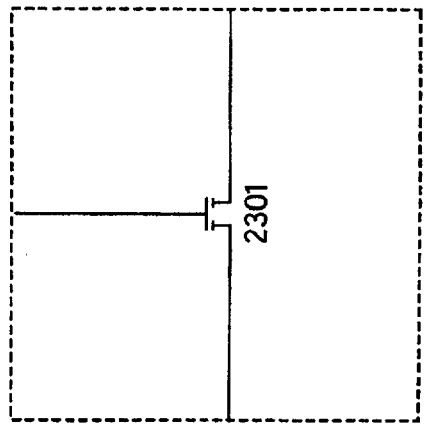
FIG. 23 shows a bus node according to the extended routing method.
Figure 23A:
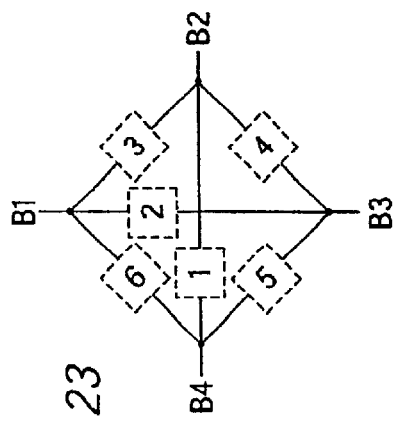
Figure 23D:
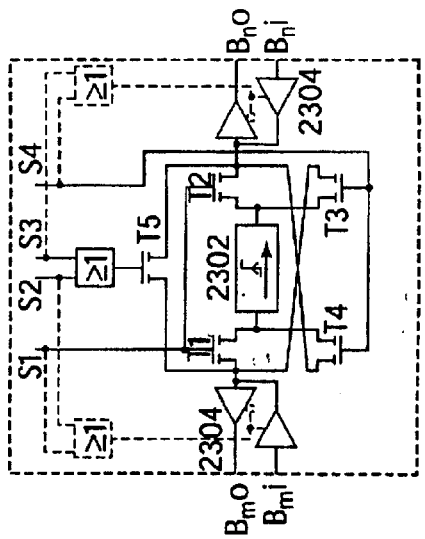

FIG. 23 shows a node with switching elements 1, 2, 3, 4, 5, 6, as well as buses B1, B2, B3, B4. The figure shows a single-line system for greater clarity. In fact, it is a bus system if only all the figures are taken as many times as there are buses. The switching element is, in the simplest case, a transistor (2301) (FIG. 23b). In order to buffer data, the switching element is expanded with one register (2302) as shown in FIG. 23b. The bidirectional buses Bn and Bm are connected to the register via transistors T1, T2, T3, T4 so that either the Bm→Bn transition or the Bn→Bm transition is stored. As an alternative, data can be transferred bidirectionally without buffering via T5. The mode of the switching element is set via control signals S1, S2, S3, S4 as follows:

| S1 | Bm ->Bn (unidirectional, stored) |
| --- | --- |
| S2 | Bm<- >Bn (bidirectional, not stored) |
| S3 | Bn<- >Bm (bidirectional, not stored) |
| S4 | Bn- >Bm (unidirectional, stored) |

Figure 23C:
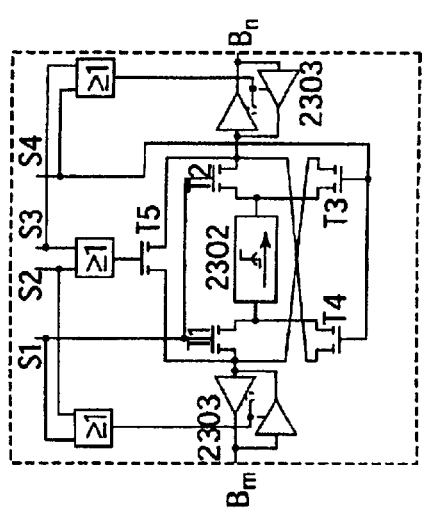
Figure 23B:
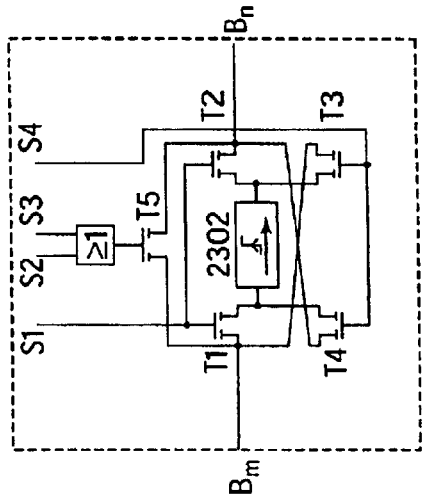

FIG. 23c: In order to obtain better signal quality, Schmitt input triggers and output drivers (2303) are used. The drivers (2303) are designed so that either the output driver or the input driver is enabled via a control signal depending on the level. Bidirectionality is lost; only unidirectional procedures can be implemented.

The mode of the switching element is set as follows:

| S1 | Bm - >Bn (unidirectional, stored) |
| --- | --- |
| S2 | Bm - >Bn (unidirectional, not stored) |
| S3 | Bn - >Bm (unidirectional, not stored) |
| S4 | Bn - >Bm (unidirectional, stored) |

FIG. 23d: The inputs and outputs are sent via different conductors (Bmi, Bmo, Bni, Bno) for better implementation in chips. The drivers (2304) are unidirectional. Driver control may be omitted.

| S1 | Bmi - >Bno (unidirectional, stored) |
| --- | --- |
| S2 | Bmi - >Bno (unidirectional, not stored) |
| S3 | Bni - >Bmo (unidirectional, not stored) |
| S4 | Bni - >Bmo (unidirectional, stored) |

Figure 24A:
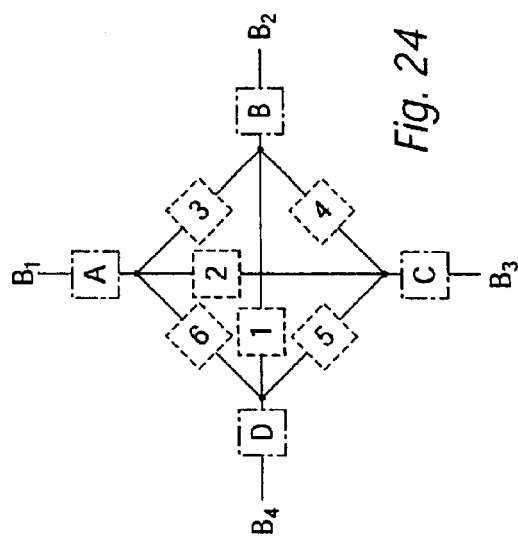
FIG. 24 shows an optimized variant the bus node of FIG. 23.
Figure 24:
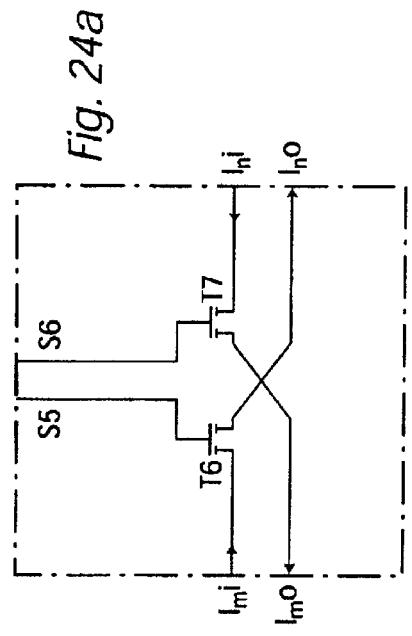

FIG. 24 shows a node similar to the node of FIG. 23. The advantage of the node consists of its better implementability and register management. The drawing shows a single-line system for greater clarity. In fact, it is a bus system if only all the figures are taken as many times as there are buses. The registers and drivers (A, B, C, D) are upstream from switching elements (1, 2, 3, 4, 5, 6). The switching elements are reduced to the cross-connection shown in FIG. 24a. The inputs (Imi, Ini) are selectively connected to outputs (Imo, Ino) with the help of control lines S5, S6 by transistors T6, T7.

Figure 24D:
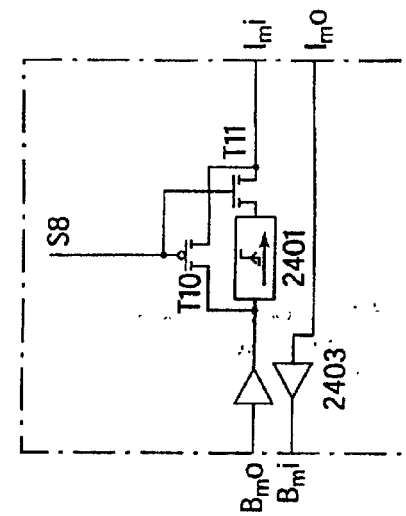
Figure 24C:
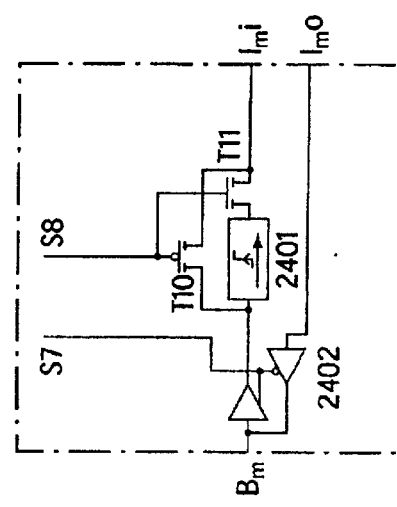
Figure 24B:
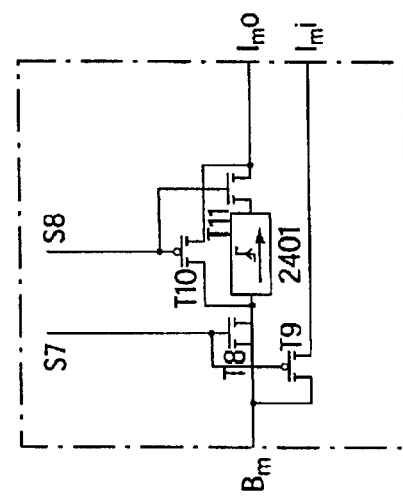

FIGS. 24b–d show different configurations of the registers and drivers (A, B, C, D).

FIG. 24b shows a bidirectional bus connected either as the input to register 2401 via T8 or to the output via T9; the bus within the node, Imo, represents the signal source. T8 and T9 are controlled via control line S7. A register bypass can be connected using the transistor pair T10/T11, controlled via S8, to enable the quasi-permanent mode. The output of the register goes to bus Imi within the node. Imi and Imo are interconnected via the switching elements of FIG. 24a.

In FIG. 24c, instead of transistor pair T8/T9, a driver element (2402) is connected to the bus to improve signal quality.

In FIG. 24d, the external bus is configured as a unidirectional bus for better implementatability in chips. Drivers 2403 are unidirectional, and there is no control signal S7.

Figure 25:
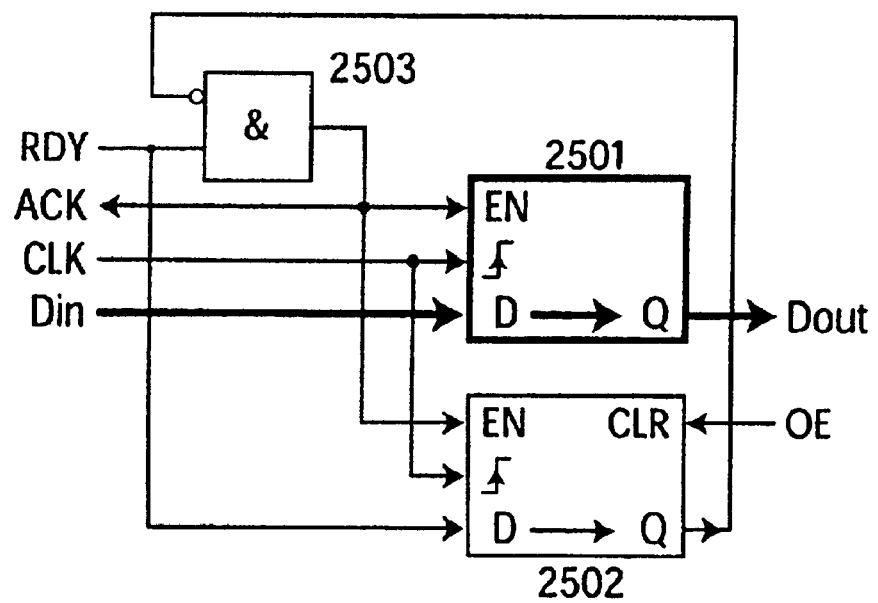
FIG. 25 shows a data register with a synchronization unit.

FIG. 25 proposes a possible synchronization circuit for FIG. 24. Registers 2401 for data storage are represented by 2501. Register 2502 is used for storing an RDY handshake signal, i.e., information that there is valid data on the bus or in 2501. If there is no valid data in 2501, output Q of 2502 is logical zero. If active data is received (RDY is active and logical 1), an enable signal (EN) is generated for registers 2501 and 2502 via AND-gate 2503, the data and RDY are stored with the rising edge of the clock pulse. The input of 2503 is inverting for output Q (of 2502)! If data is received again, the output Q (of 2502) is logical 1. The AND-gate delivers a logical 0 and the registers are not enabled via EN. If the data is forwarded over the bus, the activating signal of the output driver (OE) is used as Clear for 2502; Q of 2502 is logical 0 and new data can be stored with the next clock pulse. Lines Din and Dout are drawn as solid lines, since this is a bus system. 2501 is also drawn as a solid line, since the register corresponds to the width of the bus.

The registers can be configured as latches and coupled to the level of the clock signal (CLK) or the handshake (RDY). The circuit, however, becomes asynchronous, which results in considerable implementation problems and is associated with a non-negligible extra cost.

Figure 26:
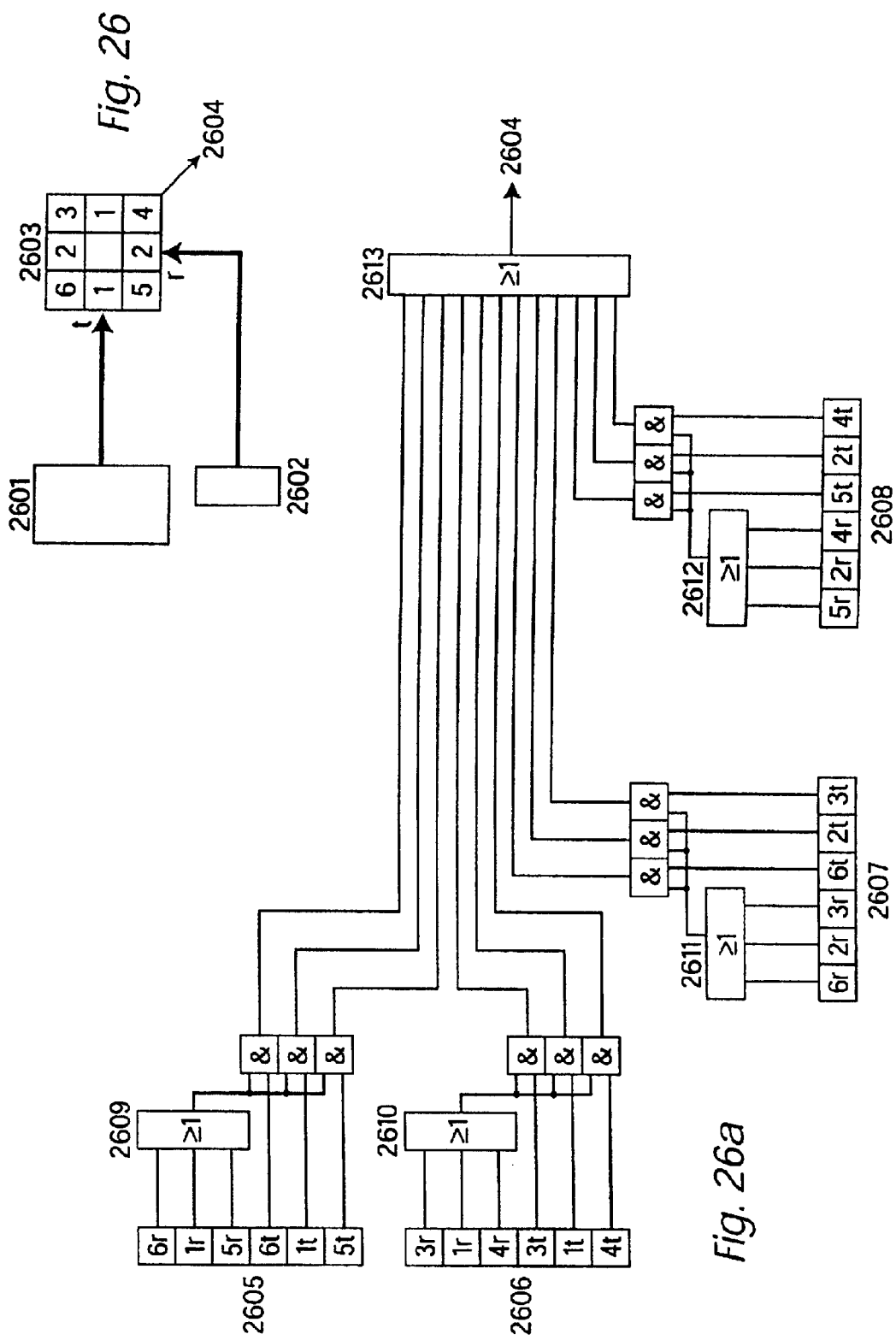
FIG. 26 shows a collision detector according to the extended routing method.

FIG. 26 shows the test strategy to determine whether a connection can be set up, i.e., whether the network is free. The status information of switching elements 1, 2, 3, 4, 5, 6 which provides information on whether a switching element is busy or free is located in a matrix 2603. The 90° switching elements 3, 4, 5, 6 form the corners, and the 180° switching elements 1 and 2 form the central elements and are doubled. In order to use a switching element without collisions, the entire edge where the switching element is located must be free. For example, 1+2, 6+4, 3+5 can be used; however, 6+2, 6+1, 2+5, 2+4, 2+3, etc. cannot be used.

Thus, it must be ensured and tested that each edge is only occupied once. A register 2602, where the current configuration of the node is stored via input r, provides the corresponding data; so does routing table 2601, which forwards the data of the desired new bus to the matrix via input t.

The test circuit is shown in FIG. 26*a*. Each row (2605, 2606, 2607, 2608) is checked for the existence of a connection via an OR-gate (2609, 2610, 2611, 2612). If there is a connected element in the row, the corresponding OR-gate delivers a logical 1. The result of the row is AND-gated with a connection to be newly set up in that row. If the row is occupied AND another connection is requested in the row, the respective AND-gate delivers a logical 1. The outputs of all the AND-gates are OR-ed (2613). The result of the test thus delivers a logical 0 to 2604 if the requested connection is valid and a logical 1 if there is a collision.

Figure 27:
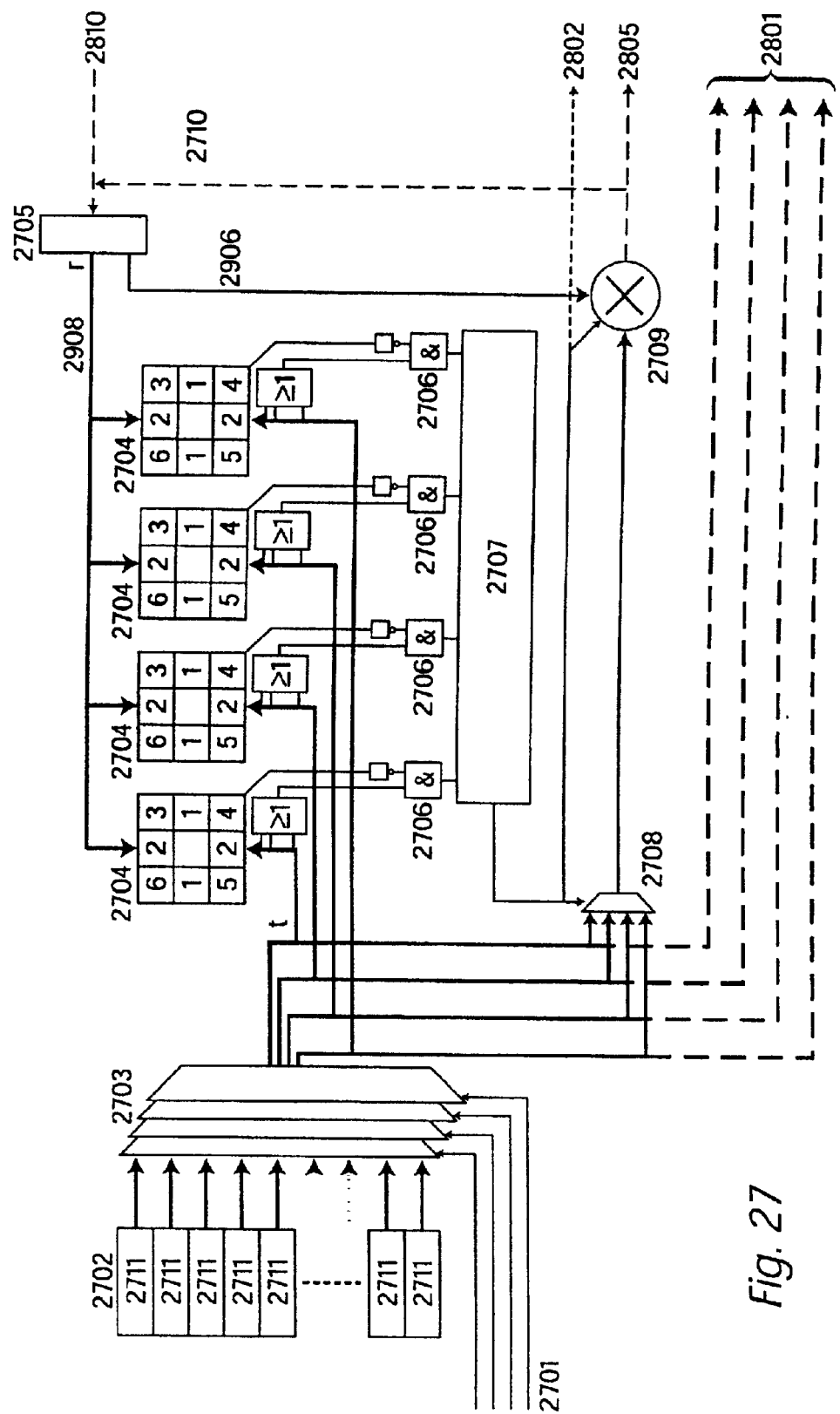
FIG. 27 shows a control unit for FIGS. 23–26.

The circuit of FIG. 26 is only capable of processing one request per time unit. Time optimization is illustrated in FIG. 27. Access requests from the buses to the circuit arrive via 2701. The routing table (2702) is made of a plurality of individual registers (2711) instead of a common storage device. This allows the data of all the access requests to be read from the routing table via multiplexer 2703. The data of each access request is forwarded to a matrix (2704), according to FIG. 26, which receives the comparative data from the register with the current configuration of the node (2705). Circuit 2706 has an OR-gate, which determines the existence of a valid request to matrix 2704. The result of 2704 is AND-ed with the output of the OR-gate via an inverter. If there is an existing and valid access, a logical 1, otherwise a logical 0 is delivered as a result. Each matrix has a circuit 2706, whose results go to an arbiter 2707, which selects one of the valid accesses. Multiplexer 2708 is switched so that the data of the valid access goes to mixer 2709, which links the valid new access with the existing connection and forwards it to register 2705 for storage.

This circuit is capable of selecting one access out of four accesses. By changing the number of mulitplexers (2703), matrices (2704), arbiter and multiplexer widths (2707,

2708), as well as the respective logics, one valid access out of any settable number of requests can be processed.

Often it is necessary to select more than one access out of a number of accesses. Lines 2801, 2805, 2802, and 2810, leading to an additional circuit (shown in FIG. 28) and allowing the simultaneous selection of two accesses, serve this purpose. If 2810 is wired, line 2710 can be omitted. According to the principle presented below, any number of accesses can be simultaneously selected through cascading.

The information about which access has been selected as "valid" goes to decoder 2803 via 2801. The information is decoded so that only the access data of the access not selected is forwarded to the matrices via the three multiplexers 2804. By omitting the previously selected access, the number of matrices is reduced by one.

The decoder operates as shown in the following table:

| Decoder (2802) | MUX1 | MUX2 | MUX3 |
|---|---|---|---|
| a | b | c | d |
| b | a | c | d |
| c | a | b | d |
| d | a | b | c |

The table shows the "valid" bus selected via 2802 in the column "Decoder." Columns MUX1–MUX3 show which bus is selected by the respective multiplexer, depending on the value of 2802.

The matrices (2811), the logic (2806), and the arbiter (2807) operate as described in accordance with FIG. 27. The data of the access selected by the arbiter is forwarded to mixer 2809 via multiplexer 2808. Mixer 2809, like mixer 2709, joins the data of the access selected by the logic of FIG. 28 to the output data of 2709, and forwards the generated access data to register 2705 via 2810. The input data of multiplexer 2808 must be picked up from the outputs of multiplexers 2804 due to their configuration.

Figure 28:
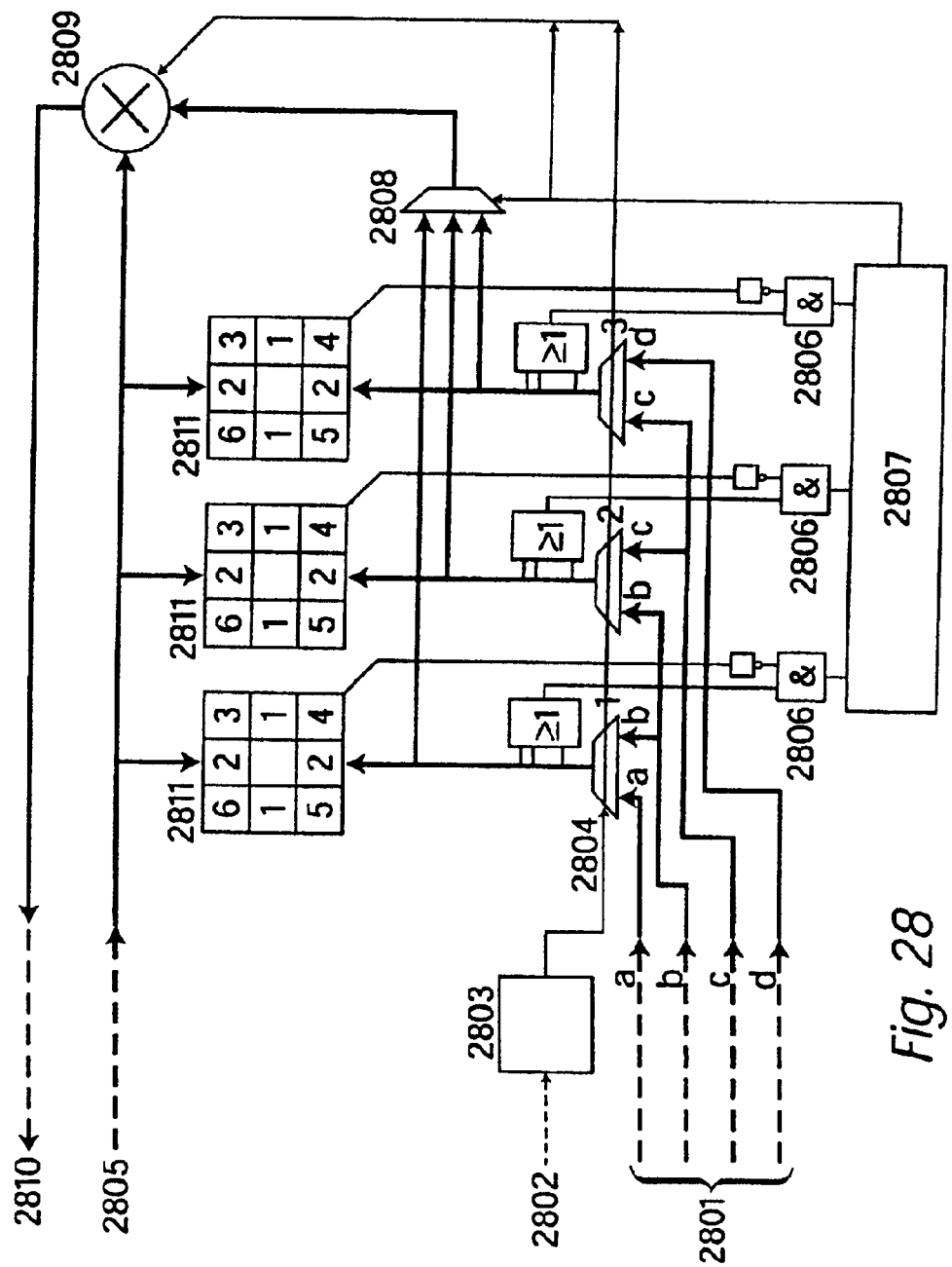
FIG. 28 shows a flow-rate-enhancing, cascadable addition to FIG. 27.

The circuit according to FIG. 28 can be cascaded deeper down by the principle described above with the number of matrices decreasing by one per cascade.

Figure 29:
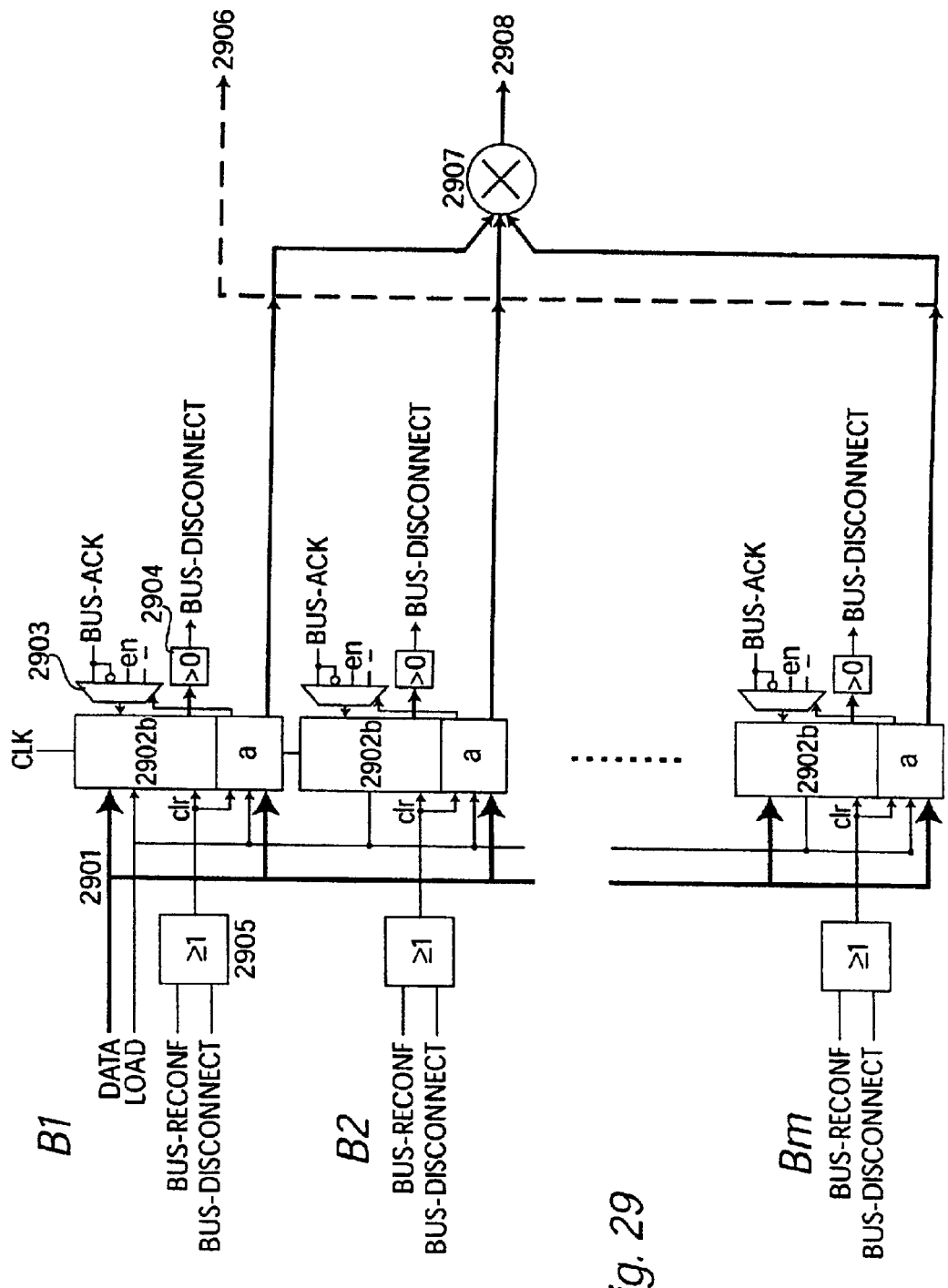
FIG. 29 shows the control register for the device of FIG. 27.

FIG. 29 shows a register according to 2602 and 2705. The outputs of mixers 2709 and 2809 are sent as input data to the register via 2901. Each register bank 2902*a/b* manages one of the buses (B1, B2, . . . Bm) of the node. The control of the node is stored in part a of a bank. The timeout of the bus connection is defined in part b. Part b has a loadable counter, whose enable and reload are settably selected by part a via multiplexer 2903.

| Timeout Principle | Effect |
|---|---|
| BUS-ACK | The data transfers are counted. (Bus in use/packet size) |
| !BUS-ACK (inverted) | The clock pulses are counted with no data transfer. (Bus NOT is use/timeout) |
| en | Each pulse is counted/clock cycles |
| — | No timeout/permanent |

The reload and enable signals of the counter are generated as follows:

| Timeout Principle | reload (rld) | enable (en) |
|---|---|---|
| BUS-ACK | never | with data transfer |
| !BUS-ACK (inverted) | with data transfer | with no data transfer |
| en | never | always |
| — | never | never |

The register needed for a reload of the counter, which contains the count set originally, is contained in 2902b. 2904 tests for count 0 to determine the timeout. 2904 is shown in the figure only for the sake of clarity; in the implementation the transmission signal (ripple carry) of the counter is used. The transmission clears the contents of 2902a, which then forwards the "bus free" status information and thus disconnects the bus. From the transmission, BUS-DISCONNECT is switched onto the bus as a signal and used for disconnecting the remaining bus segment. BUS-RECONF is sent with the data according to German Application No. DE 197 04 728.9 and, when it appears, also causes the bus to be disconnected. Both signals are sent to 2902 via OR-gate 2905 and cause the register and the counter to be cleared. The timeout is de-activated by de-activating the enable signal in the previously mentioned tables, and the counter is loaded with a value greater than zero.

The data in the register are bus-oriented, not switching-element-oriented. This data goes via 2906 to mixers 2709 and 2809. Each control signal occurs m-fold (number of buses) and is denoted as $S_{i,m}$, where m is the bus and i is the number of the switching element. Prior to sending the data to a matrix according to FIG. 26 or to a node according to FIGS. 23 and 24, these must be mapped so that there is only one sequence $T_i$. The mapping formula is $T_i=(S_{i,1} \cup S_{i,2} \cup S_{i,3}, \ldots \cup S_{i,m})$; in other words, all $S_{i,1}$ through $S_{i,m}$ are OR-ed. 2907 is responsible for this function and sends T to the matrices and switching elements via 2908.

Figure 30:
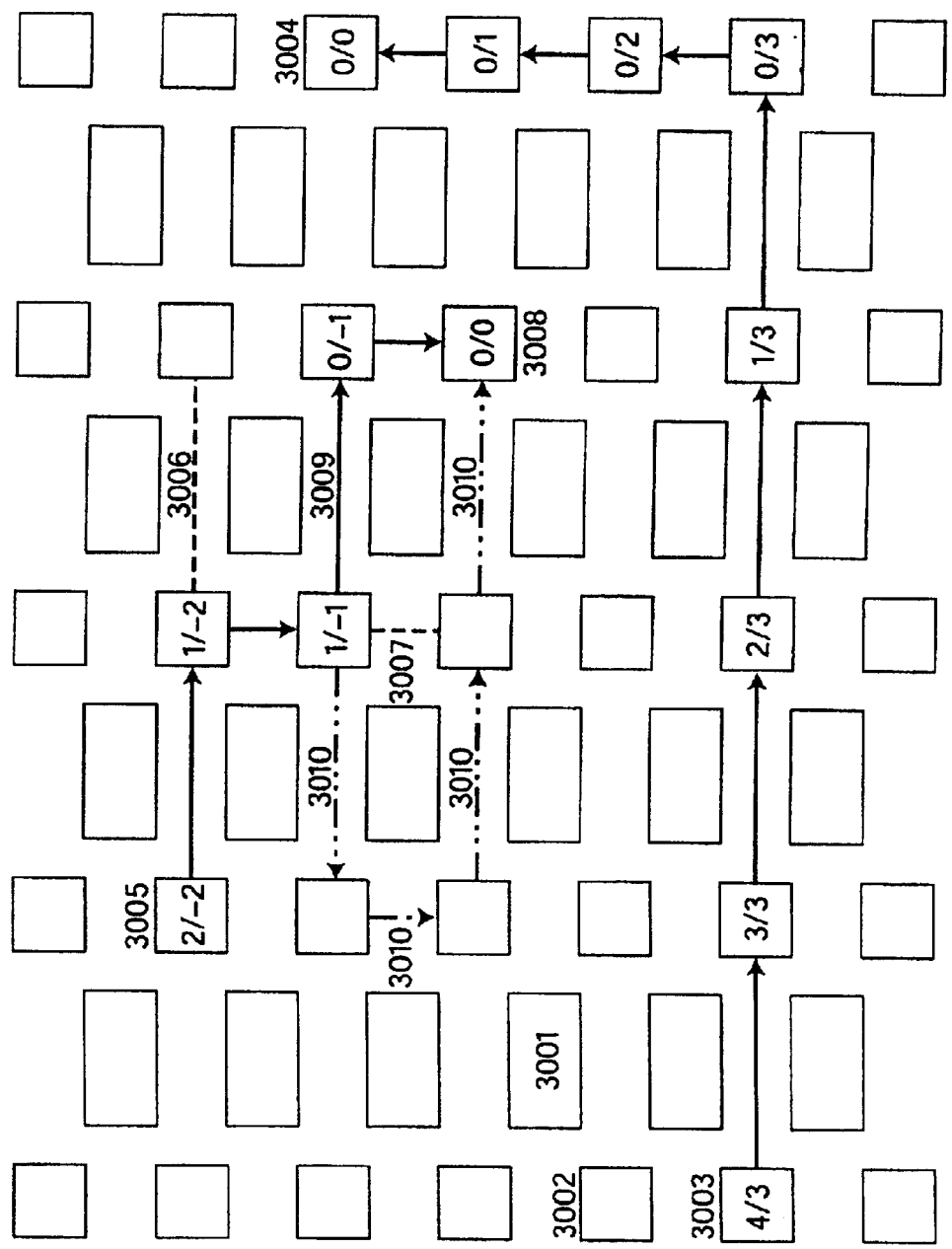
FIG. 30 shows a bus connection setup via relative spatial coordinates according to the extended routing method.

FIG. 30 shows an example of two bus connections. One node 3002 is assigned to configurable elements or groups of configurable elements (3001). Node 3003 transmits data to node 3004. The connection is set up statically. Node 3005 transfers the data dynamically to target node 3008. Segments 3006 and 3007 are busy, so that the direction of transmission changes. The X/Y spatial coordinates are provided in the nodes being traversed. The coordinates are kept unchanged, increased or decreased by one depending on the direction of travel. Using the numerical value of the coordinates, the direction of travel and the target can then be determined. The deviation in the direction of movement is calculated from the position (A, B, C, D) of the incoming bus at the node and the sign of the (X/Y)-movement. Compass points are used to identify the direction with y forming the north-south axis and x forming the east-west axis:

| Direction of Travel | Movement in Compass Point Direction |
|---|---|
| y = 0 | x > 0 ⇒ E |
|  | x < 0 ⇒ W |
| y > 0 | N |
| y < 0 | S |
| x = 0 | y > 0 ⇒ N |
|  | y < 0 ⇒ S |
| x > 0 | E |
| x < 0 | W |

Using the direction of travel and the compass point direction of the incoming bus, it can be calculated which of the switching elements (1, 2, 3, 4, 5, 6) is being addressed. Both of the above calculations are known to those of ordinary skill in the related art, so that the required arithmetic unit (XY2ADR) can be configured using lookup tables. Thus the calculation is not described here in more detail, but reference is made to the above table.

The addressing in this example is relative.

Figure 31:
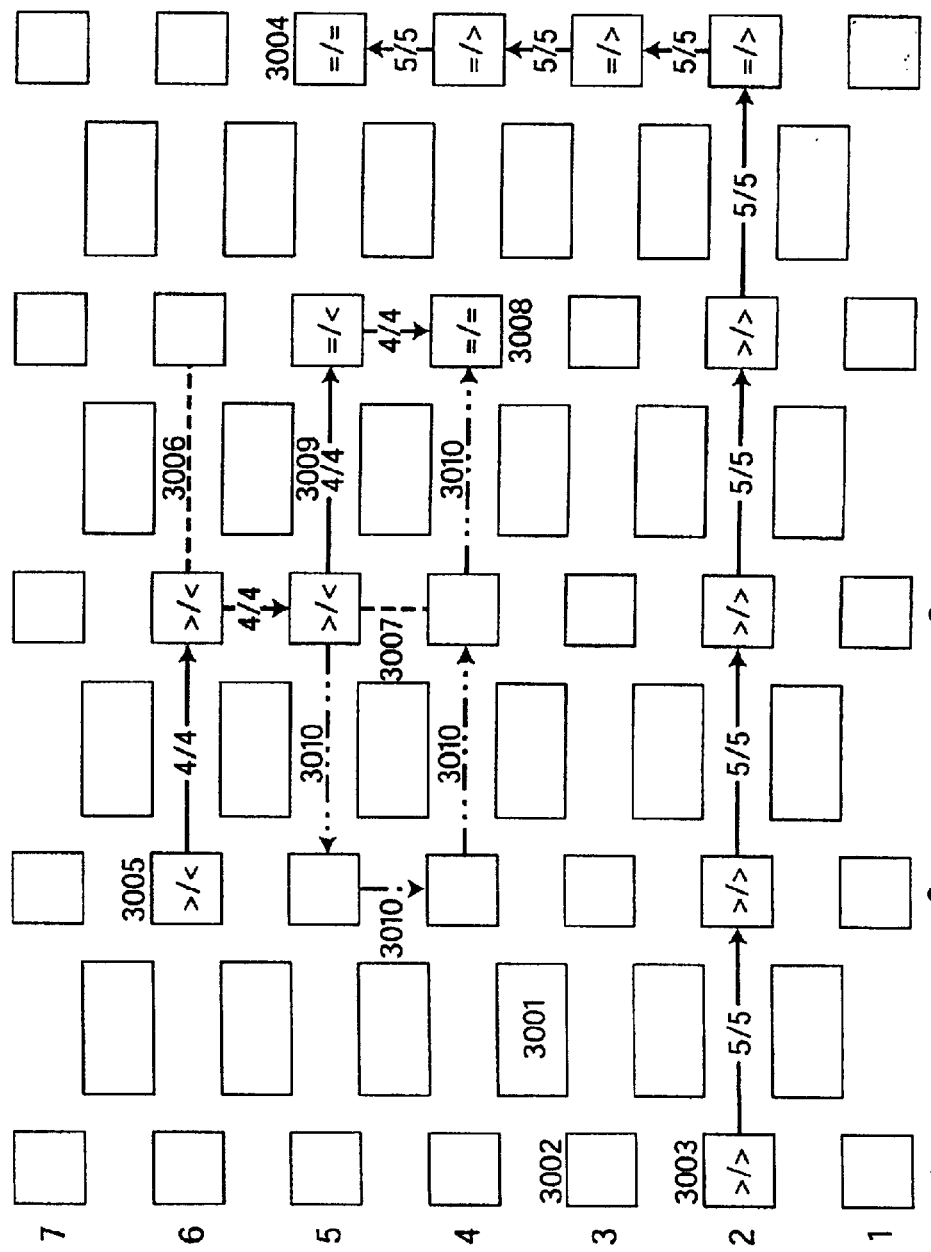
FIG. 31 shows a bus connection via absolute spatial coordinates according to the extended routing method.

FIG. 31 shows the same example with absolute coordinates. Contrary to FIG. 30, the coordinates in the nodes are not calculated, but compared with the node coordinates according to the higher-order coordinate system 3101. The connection is set up using comparisons greater than (>), less than (<), and equal to (=), for control. If both coordinates (X and Y) are equal to the node coordinates, the target has been reached; if one coordinate is equal to the node coordinate, the target axis of the coordinate has been reached.

The examples given in FIGS. 30 and 31 allow no deviation from the optimum direction. For example, if segment 3009 in FIG. 30 were busy, the data could not be further transferred. It is possible to allow a deviation from the predefined direction in the case of a busy segment, in which case the connection can be set up via 3010. however, the deviation allowance must be limited so as not to obtain unreasonable routing attempts. One reasonable limit for deviations from the predefined direction is ±1 to ±2.

Figure 32B:
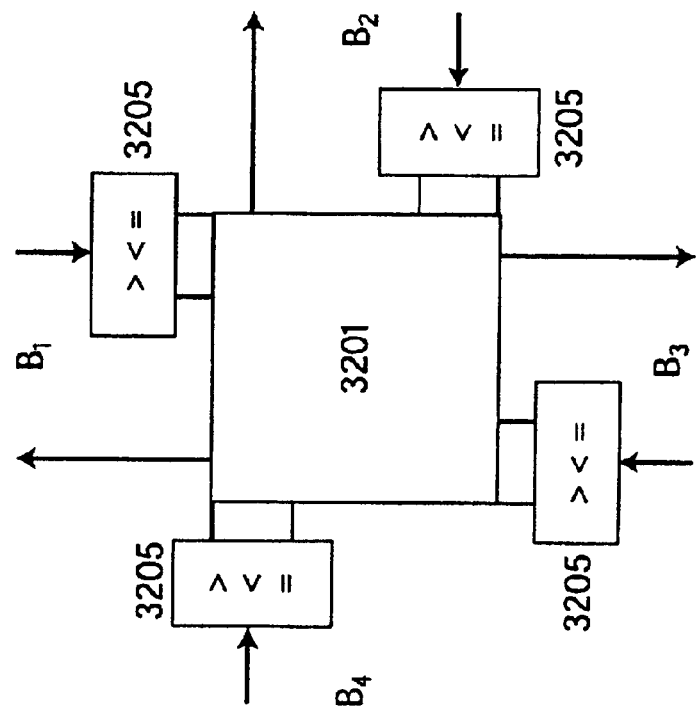
FIG. 32 shows the management of spatial coordinates.
Figure 32A:
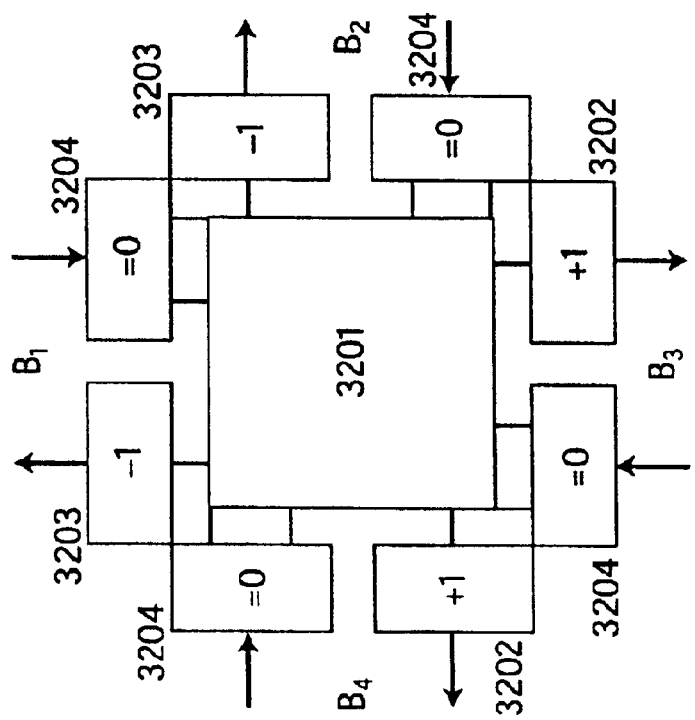

FIGS. 32a and 32b show the required periphery around a node 3201 to evaluate or modify the spatial coordinates.

FIG. 32a modifies relative coordinates according to their direction of travel. Subtraction is performed in the positive direction (3203), and addition is performed in the negative direction (3202). The comparators (3204) check whether a coordinate has reached zero.

FIG. 32b compares absolute coordinates with the node coordinates using comparator 3205.

In order to allow a deviation from the predefined direction, comparators 3205 and 3204 are expanded so that they check and forward the information of whether a coordinate is in the allowance range (−deviation<coordinate<+deviation). Using this information, the arithmetic unit (XY2ADR) can modify the direction of travel within the limits of the allowable deviation in the event of a collision in the predefined direction and allow or prevent a deviation. This calculation is also trivial and may possibly be performed by expanding the lookup tables. In the following table, the maximum allowable deviation is given by A.

| Direction of Travel | Movement in Compass Point Direction |
|---|---|
| y − A = 0 | x + A > 0 ⇒ E |
| y − A = 0 | x − A < 0 ⇒ W |
| y + A > 0 | N |
| y − A < 0 | S |
| x − A = 0 | y + A > 0 ⇒ N |
|  | y − A < 0 ⇒ S |
| x + A > 0 | E |
| x − A < 0 | W |

The immediate surrounding of x and y is fuzzy, i.e., movements in opposite directions may be allowed, since k−A<0 AND k+A>0 may apply at the same time. This can be more narrowly defined if so desired by not allowing any direction of travel against the sign of k. If k=0, all directions of travel are allowed.

Figure 33:
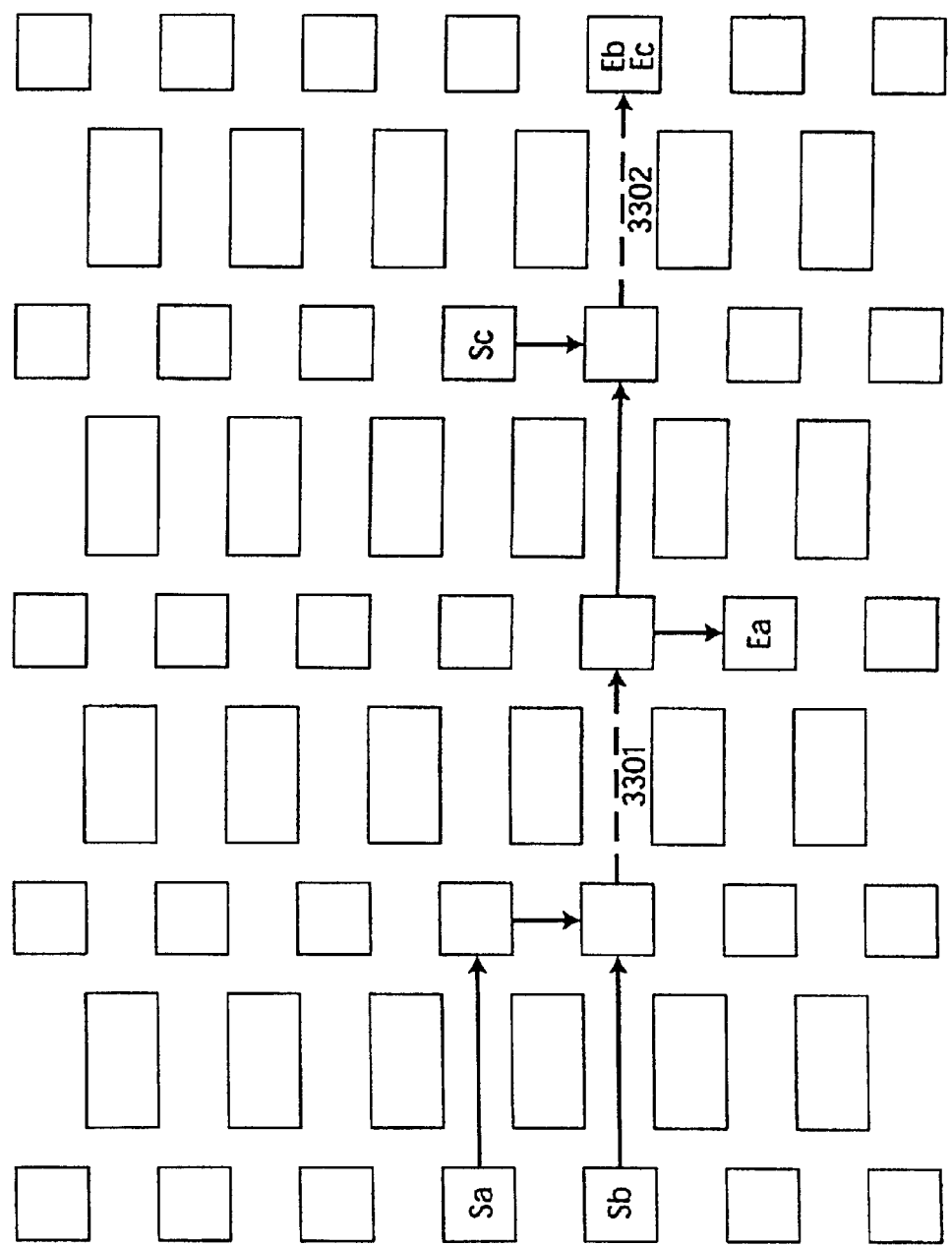
FIG. 33 shows a segmented bus setup.

FIG. 33 shows the behavior of a segmented bus. The configuration of the drawing corresponds to the previous Figures showing a cell array and nodes. A transmitter node Sa sends data to receiver node Ea; another transmitter node Sb sends to Eb, and a last Sc sends to Ec, which is also receiver node Eb. Collisions occur on segments 3301 and 3302. To optimally utilize the bus (regardless of the fact that another path would be possible in principle), all the buses are set up to be quasi-permanent, with the exception of segments 3301 and 3302. These segments operate in the "registered" mode and arbitrate one of the buses in question according to the timeout set. The priority of the individual buses can be determined via the respective timeout. A more relevant bus receives higher "timeout rights," i.e., longer cycles, while a less relevant bus has only shorter cycles available.

The previous descriptions of the nodes in FIGS. 23–27 show, for the sake of clarity, only the interconnection in the directions of the four compass points. In fact, however, a configurable cell or a group of configurable cells may also be connected to a node. The extensions needed therefore are shown in FIG. 34. The symbols of the nodes correspond in FIG. 34a to those in FIG. 23, and those in FIG. 34b to those in FIG. 24. The connection of the configurable elements is denoted with Z. Matrix 2603 should be modified according to FIG. 34c to become 3401. The interconnections are modified according to FIG. 26.

The examples shown are illustrated as two-dimensional for the sake of clarity. In alternative embodiments, complex systems with any number of dimensions may be built in accordance with the present invention.

Glossary of Terms address lookup The address is not calculated, but generated by "lookup" in a memory.

ALU: Arithmetic and logic unit. Basic unit for processing data. The unit can perform arithmetic operations such as addition, subtraction, and also under some circumstances multiplication, division, series expansion, etc. The unit may be designed as an integer unit or as a floating point unit. Likewise, the unit can perform logic operations such as AND, OR and comparisons.

setup phase: Cycle during which a bus segment is set up.

arbiter: Unit for distributing rights among signals.

bidirectional: Data transmission in both directions (source/target1⇆source/target2)

broadcast: Transmitting data of a PAE to multiple or all data receivers.

bus request: A request for a bus connection to be set up for data transfer (also called a connection request).

bus segment: Section of a bus system between two nodes.

bus states: The way a bus operates. Distinction is made between two main states:

quasi-permanent: The bus behaves like a continuous conductor. The bus can only be used by one data packet (until it is disconnected);

registered: A register to delay the data by one clock cycle is looped between each segment. Another data packet can be arbitrated in each clock cycle (depending on Timeout); Mixing the two states provides the status.

Segmented: Combines the advantages of the two states.

data receiver: The unit(s) that process(es) (further) the results of the PAE.

data transmitter: The unit(s) that make(s) data available as operands for the PAE.

data type: Type of data: characters, numerals, floating point numbers, signals (boolean), etc.

decimal decoder: Converts a binary signal into a decimal signal.

DFP: Data flow processor according to (unexamined) German Patent DE 44 16 881.

DISCONNECT: Signal generated by timeout counters/generators to disconnect a bus. It is sent to all the nodes of a bus.

DPGA: Dynamically configurable gate array. Known.

EALU: Expanded arithmetic and logic unit. ALUs expanded by special functions which are needed or are appropriate for operation of a data processing unit according to German Patent DE 44 16 881 A1. These are counters in particular.

elements: Collective term for all types of self-contained units that can be used as one piece in an electronic component. Elements thus include:

Configurable cells of all types

Clusters

RAM blocks

Logic units

Arithmetic and logic units

Registers

Multiplexers

I/O pins of a chip enable: Switching a register or a counter to an operational state.

FPGA: Field programmable gate array. Known.

gate: Group of transistors that carry out a basic logic function. Basic functions include, for example, NAND, NOR, transmission gates.

transmission rate-optimized: A bus system that is usually permanently set up has a high priority and is not affected by other accesses.

H level: Logical 1 level, depending on the technology used.

Node: Element that connects multiple bus segments together and actively controls the setup of the connection but is passive during the data transfer.

configurable element: A configurable element is an element of a logic unit that can be set for a specific function by a configuration string. Configurable elements are thus all types of RAM cells, multiplexers, arithmetic and logic units, registers and all types of internal and external interconnection descriptions, etc.

configurable cell: See logic cells.

configure: Setting the function and interconnection of a logic unit, a (FPGA) cell or a PAE (see reconfigure).

program loading unit (PLU): Unit for configuring and reconfiguring the PAE. Embodied by a microcontroller adapted specifically to this function.

latch: Storage element that normally relays a signal transparently during the H level and stores it during the L level. Latches are sometimes used in PAEs where the function of the levels is exactly reversed. An inverter is connected upstream from the clock pulse of a conventional latch.

logic cells: Configurable cells used in DFPs, FPGAs and DPGAs, which perform simple logic or arithmetic tasks according to their configuration.

look-up table: Table that receives a value as an address and returns a result. For example, a number is given as an address and its sine is returned.

L level: Logical 0 level, depending on the technology used.

M-PLUREG: Register in which the interconnection of the PAE is set. The PLU writes into the register.

mask: A bit combination containing information concerning which signals of a source should be forwarded and which should be interrupted (masked out).

mixer: Unit that interconnects several signals according to a certain mapping instruction.

a) usually a logic operation (AND/OR) takes place, or
b) the signals are combined to a bus, where
c) several signal sources may be combined selectively via several multiplexers.
open-collector: Circuitry where the collector of a transistor is at a bus signal which is pulled to the H level by a pull-up. The emitter of the transistor is at ground. If the transistor switches, the bus signal is pulled to the L level. The advantage of the method is that a plurality of such transistors can control the bus without electrical collision. The signals are OR-linked, resulting in wired-OR.
PAE: Processing array element: EALU with O-REG, R-REG, R2O-MUX, F-PLUREG, M-PLUREG, BM UNIT, SM UNIT, sync UNIT, state-back UNIT and power UNIT.
partner node: Node with which a certain node has set up contact or wants to establish contact over a bus segment.
PLU: Unit for configuring and reconfiguring the PAE. Embodied by a microcontroller adapted specifically to this function.
priority type: The manner in which a priority identifier is analyzed.
priority decoder: The signal with the highest priority is relayed or enabled.
priority ID: Priority level information (high to low) of a bus connection.
priority logic: The signal with the highest priority is relayed or enabled.
PullDown: Resistor that pulls a bus line to an L level.
PullUp: Resistor that pulls a bus line to an H level.
source-optimized: A bus system usually set up as registered and with low priorities so as to enable bus access by a number of data transmitters (sources).
spatial coordinates: Point information via a multidimensional coordinate system. Absolute or relative coordinates (relative distance from a reference point) can be used. Movement in the positive direction increases the numerical value of the coordinate; movement in the negative direction reduces the numerical value of a coordinate.
RECONFIG: Signal generated by configurable elements showing that the elements can be reconfigured and their activity has been completed. Used to disconnect all the buses involved and sent to all the nodes of a bus.
register bank: Combination of a number of registers of different sizes and functions into a group.
register bypass: Conductor to bypass a register and turn off the synchronization effect of the register.
RELOAD: Loading a counter with its initial value.
routing table: Table within a node containing information about connections to be set up.
round-robin arbiter: Arbiter that enables one signal after the other in a sequence. The signal currently enabled receives the lowest priority and is then the last to be enabled again in the chain. The arbiter works in a circle.
busbar: Bus on which multiple bus segments are combined.
Schmitt trigger: Window comparator that assigns a signal one of two possible values thus improving signal quality.
switching table: A switching table is a ring memory which is addressed by a controller. The entries in a switching table can have any configuration strings. The controller can execute commands. The switching table responds to trigger signals and configures the configurable elements on the basis of an entry in a ring memory.
timeout generator: unit used to generate a timeout according to several criteria, such as
  clock cycles without successful connection setup;
  data packets transmitted;
  clock cycles;
  clock cycles with no transmission.
timeout: Something happens after a certain period of time (an operation is begun or interrupted).
timeout counter: See timeout generator.
gate: Switch that relays a signal or blocks it. Simple comparison: relay.
unidirectional: Data transmission in one direction (source→target).
reconfigure: Reconfiguring any set of PAEs while any remaining set of PAEs continue their own functions (see configure).
connection request: Request for a bus connection for data transfer (also called bus request).
cells: Synonymous with configurable elements.
target axis: the X/Y axis where X=0 or X=axis, and Y=0 or Y=axis is the target axis of X and Y, respectively.
state machine: Logic unit that can assume various states. The transitions between the states depend on various input parameters. These machines are used to control complex functions and are already known.

Name Conventions
Module:UNIT
Mode of operation:MODE
Multiplexer:MUX
Negated signal:not
Register visible to PLU: PLUREG
Register, internal:REG
Shift register:sft
Function Convention
NOT function!

| I | Q |
|---|---|
| 0 | 1 |
| 1 | 0 |

AND function &

| A | B | Q |
|---|---|---|
| 0 | 0 | 0 |
| 0 | 1 | 0 |
| 1 | 0 | 0 |
| 1 | 1 | 1 |

OR function#, ≧

| A | B | Q |
|---|---|---|
| 0 | 0 | 0 |
| 0 | 1 | 1 |
| 1 | 0 | 1 |
| 1 | 1 | 1 |

GATE function G

| EN | B | Q |
|----|---|---|
| 0 | 0 | — |
| 0 | 1 | — |
| 1 | 0 | 0 |
| 1 | 1 | 1 |

What is claimed is:

1. An internal bus system for a unit, comprising:

a plurality of electrically independent bus segments provided within the unit; and a plurality of nodes separating the bus segments and actively connecting and disconnecting at least two of the plurality of bus segments via at least one of i) a gate, ii) a switching element, iii) a driver, and iv) a register, each of the nodes including:

a respective routing table storing setup information for connections within the unit, and a respective monitoring unit independently verifying whether a connection can be set up within the unit, wherein at least some of the setup information for connections within the unit in an at least one node of the plurality of nodes depends on the state of an adjacent node.

2. The system of claim 1, wherein
the routing table includes a priority identifier.

3. The system of claim 1, wherein the nodes further include
a priority logic unit.

4. The system of claim 1, wherein
the plurality of nodes are configured to disconnect a connection using a bus segment if a higher priority connection requires the bus segment.

5. The system of claim 1, wherein
the plurality of nodes are configured to clear a bus segment if a complete connection can not be established using the bus segment.

6. A method for transmitting data within a module having a multi-dimensional cell architecture and an internal bus system, the method comprising:

choosing a first segment of a plurality of segments of the internal bus system;

choosing a second segment adjacent to the first segment, the choice of the second segment depending on state information about the second segment provided to a node in the multi-dimensional cell architecture;

connecting a plurality of segments of the internal bus system, the plurality of segments including the first segment and the second segment; and transmitting the data between cells of the module with synchronization via the plurality of bus segments, wherein the plurality of bus segments are connectable in a plurality of configurations.

7. The method of claim 6,
wherein the choice of the second segment depends on priority information for the desired connection.

8. The method of claim 6,
wherein the choice of the second segment depends on congestion information.

9. The method of claim 7, further comprising:
verifying whether a connection can be set up between the cells using the first plurality of bus segments.

10. The method of claim 9, wherein
the verifying is carried out locally along the bus lines.

11. The method of claim 9, further comprising:
clearing the first plurality of bus segments when the connection can not be set up between the cells using the first plurality of bus segments.

12. The method of claim of claim 11, further comprising:
retrying the attempt to connect the cells after the first plurality of bus segments have been cleared.

* * * * *

UNITED STATES PATENT AND TRADEMARK OFFICE
CERTIFICATE OF CORRECTION

| | |
|---|---|
| PATENT NO. | : 7,010,667 B2 |
| APPLICATION NO. | : 10/116986 |
| DATED | : March 7, 2006 |
| INVENTOR(S) | : Vorbach et al. |

It is certified that error appears in the above-identified patent and that said Letters Patent is hereby corrected as shown below:

Column 1, line 11, change "filed now U.S. Pat. No. 6,405,299, Aug. 28, 1998, which" to --filed August 28, 1998, now U.S. Pat. No. 6,405,299, which--;

Column 16, line 60, change "implementatbility" to --implementability-- and

Column 17, line 66, change "mulitplexers" to --multiplexers--.

Signed and Sealed this

Twenty-sixth Day of December, 2006

JON W. DUDAS
*Director of the United States Patent and Trademark Office*